(12) United States Patent
Tanaka et al.

(10) Patent No.: US 12,237,379 B2
(45) Date of Patent: Feb. 25, 2025

(54) METHOD FOR MANUFACTURING NITRIDE SEMICONDUCTOR DEVICE AND NITRIDE SEMICONDUCTOR DEVICE

(71) Applicant: FUJI ELECTRIC CO., LTD., Kawasaki (JP)

(72) Inventors: Ryo Tanaka, Hino (JP); Yuki Ohuchi, Sugunami (JP); Katsunori Ueno, Matsumoto (JP); Shinya Takashima, Hachioji (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 401 days.

(21) Appl. No.: 17/584,043

(22) Filed: Jan. 25, 2022

(65) Prior Publication Data

US 2022/0285504 A1 Sep. 8, 2022

(30) Foreign Application Priority Data

Mar. 8, 2021 (JP) .................................. 2021-36671
Oct. 15, 2021 (JP) ................................ 2021-169925

(51) Int. Cl.
*H01L 29/20* (2006.01)
*H01L 21/02* (2006.01)
(Continued)

(52) U.S. Cl.
CPC .... *H01L 29/2003* (2013.01); *H01L 21/02389* (2013.01); *H01L 21/26546* (2013.01); *H01L 29/66204* (2013.01); *H01L 29/66522* (2013.01)

(58) Field of Classification Search
None
See application file for complete search history.

(56) References Cited

U.S. PATENT DOCUMENTS 9,269,577 B2 2/2016 Iwami
10,903,352 B2 1/2021 Takashima et al.
(Continued)

FOREIGN PATENT DOCUMENTS

JP 2014-086698 A 5/2014
JP 2019-096744 A 6/2019

OTHER PUBLICATIONS

Ashutosh Kumar et al.; "Atomic-scale quantitative analysis of implanted Mg in annealed GaN layers on free-standing GaN substrates"; J. Appl. Phys. 126, 235704 (2019); published online: Dec. 17, 2019 (9 pages).
(Continued)

*Primary Examiner* — Khaja Ahmad

(57) ABSTRACT

A method for manufacturing a nitride semiconductor device including: forming an N-type region in a nitride semiconductor layer; implanting ions of an acceptor element into a region under the N-type region in the nitride semiconductor layer; and forming a first P-type region under the N-type region by subjecting the nitride semiconductor layer to heat treatment and activating the acceptor element. The forming the N-type region includes implanting ions of a donor element into the nitride semiconductor layer such that concentration of the donor element in the N-type region is equal to or greater than concentration of the acceptor element in the first P-type region. The implanting ions of the acceptor element into a region under the N-type region includes implanting ions of the acceptor element such that concentration of the acceptor element in the first P-type region is $1\times10^{19}$ cm$^{-3}$ or more and $1\times10^{21}$ cm$^{-3}$ or less.

25 Claims, 50 Drawing Sheets

(51) Int. Cl.
*H01L 21/265* (2006.01)
*H01L 29/66* (2006.01)

(56) References Cited

U.S. PATENT DOCUMENTS

| | | | |
|---|---|---|---|
| 2006/0226475 A1* | 10/2006 | Yamamoto | H01L 29/66727 |
| | | | 257/E29.136 |
| 2014/0120703 A1 | 5/2014 | Iwami | |
| 2018/0005843 A1* | 1/2018 | Takashima | H01L 29/7802 |
| 2019/0157448 A1 | 5/2019 | Takashima et al. | |

OTHER PUBLICATIONS

Hideki Sakurai et al.; "Highly effective activation of Mg-implanted p-type GaN by ultra-high-pressure annealing"; Appl. Phys. Lett. 115; published online: Sep. 30, 2019; (6 pages).

Giacomo Miceli et al.; "Self-compensation due to point defects in Mg-doped GaN"; Physical Review B 93, 165207 (2016); published Apr. 25, 2016; (11 pages).

* cited by examiner

METHOD FOR MANUFACTURING NITRIDE SEMICONDUCTOR DEVICE AND NITRIDE SEMICONDUCTOR DEVICE

CROSS REFERENCE TO RELATED APPLICATIONS AND INCORPORATION BY REFERENCE

This application claims benefit of priority under 35 USC 119 based on Japanese Patent Application No. 2021-36671 filed on Mar. 8, 2021 and Japanese Patent Application No. 2021-169925 filed on Oct. 15, 2021, the entire contents of which are incorporated by reference herein.

TECHNICAL FIELD

The present invention relates to a method for manufacturing a nitride semiconductor device and a nitride semiconductor device.

BACKGROUND ART

Nitride semiconductor devices having a vertical metal oxide semiconductor (MOS) structure have been known (see, for example, PTL 1). In addition, in a nitride semiconductor device, it is possible to control a degree of conductivity of a P-type region by using magnesium (Mg) as a dopant (see, for example, PTL 2).

In order to achieve excellent ohmic contact in a nitride semiconductor device, it is necessary to selectively form a highly concentrated P-type region in the nitride semiconductor. As a method for selectively forming a P-type region, it is preferable to use ion implantation from a viewpoint of a cost, productivity and reliability. However, when ions of Mg are implanted into a nitride semiconductor at a high concentration and the nitride semiconductor is subjected to heat treatment at a high temperature exceeding 1300° C. in order to activate Mg, Mg segregates at high density in a rod-like manner. When Mg segregates at high density in a rod-like manner, Mg concentration decreases in a region other than a region in which segregation occurs (see, for example, NPL 1). In addition, when heat treatment is performed at high temperature further exceeding 1400° C. in a very high pressure atmosphere, Mg diffuses deeply and Mg concentration decreases (see, for example, NPL 2). For this reason, it has been difficult to form a highly concentrated P-type region.

CITATION LIST

Patent Literature

PTL 1: JP 2019-096744 A
PTL 2: JP 2014-086698 A

Non Patent Literature

NPL 1: Kumar et. al., J. Appl. Phys. 126 (2019) 235704.
NPL 2: H. Sakurai et. al., Appl. Phys. Lett. 115, 142104 (2019).
NPL 3: G. Miceli, A. Pasquarello PRB (2016).

SUMMARY OF INVENTION

Technical Problem

When Mg is activated by heat treatment and a P-type region is formed, the Fermi level of the P-type region comes close to the valence band. When the Fermi level comes close to the valence band, Mg acceptor formation energy (that is, energy required to incorporate Mg into Ga sites of GaN) increases and activation of Mg is destabilized (see, for example, NPL 3). It is considered that the above-described segregation of Mg at high density occurs because activation of Mg becomes unstable and Mg becomes likely to segregate via defects.

The present invention has been made through earnest examination by the inventors based on the above-described consideration, and an object of the present invention is to provide a method for manufacturing a nitride semiconductor device capable of forming a highly concentrated P-type region and a nitride semiconductor device.

Solution to Problem

In order to achieve the above-described object, according to an aspect of the present invention, there is provided a method for manufacturing a nitride semiconductor device including: a step of forming an N-type region in a nitride semiconductor layer; a step of implanting ions of an acceptor element into a region located under the N-type region in the nitride semiconductor layer; and a step of forming a first P-type region located under the N-type region by subjecting the nitride semiconductor layer in which the N-type region is formed and into which ions of the acceptor element are implanted to heat treatment and activating the acceptor element, wherein, in the step of forming the N-type region, the method implants ions of a donor element into the nitride semiconductor layer at a high concentration in such a way that concentration of the donor element in the N-type region has a value equal to or greater than concentration of the acceptor element in the first P-type region, and in the step of implanting ions of the acceptor element into a region located under the N-type region, the method implants ions of the acceptor element in such a way that concentration of the acceptor element in the first P-type region is $1\times10^{19}$ cm$^{-3}$ or more and $1\times10^{21}$ cm$^{-3}$ or less.

According to another aspect of the present invention, there is provided a nitride semiconductor device including: a nitride semiconductor layer; an N-type region formed on one surface side of the nitride semiconductor layer; and a first P-type region formed on the one surface side of the nitride semiconductor layer and located under the N-type region, wherein concentration of a donor element in the N-type region has a value equal to or greater than concentration of an acceptor element in the first P-type region, and concentration of the acceptor element in the first P-type region is $1\times10^{19}$ cm$^{-3}$ or more and $1\times10^{21}$ cm$^{-3}$ or less.

Advantageous Effects of Invention

According to the present invention it is possible to provide a method for manufacturing a nitride semiconductor device capable of forming a highly concentrated P-type region and a nitride semiconductor device.

DESCRIPTION OF EMBODIMENTS

Figure 1:
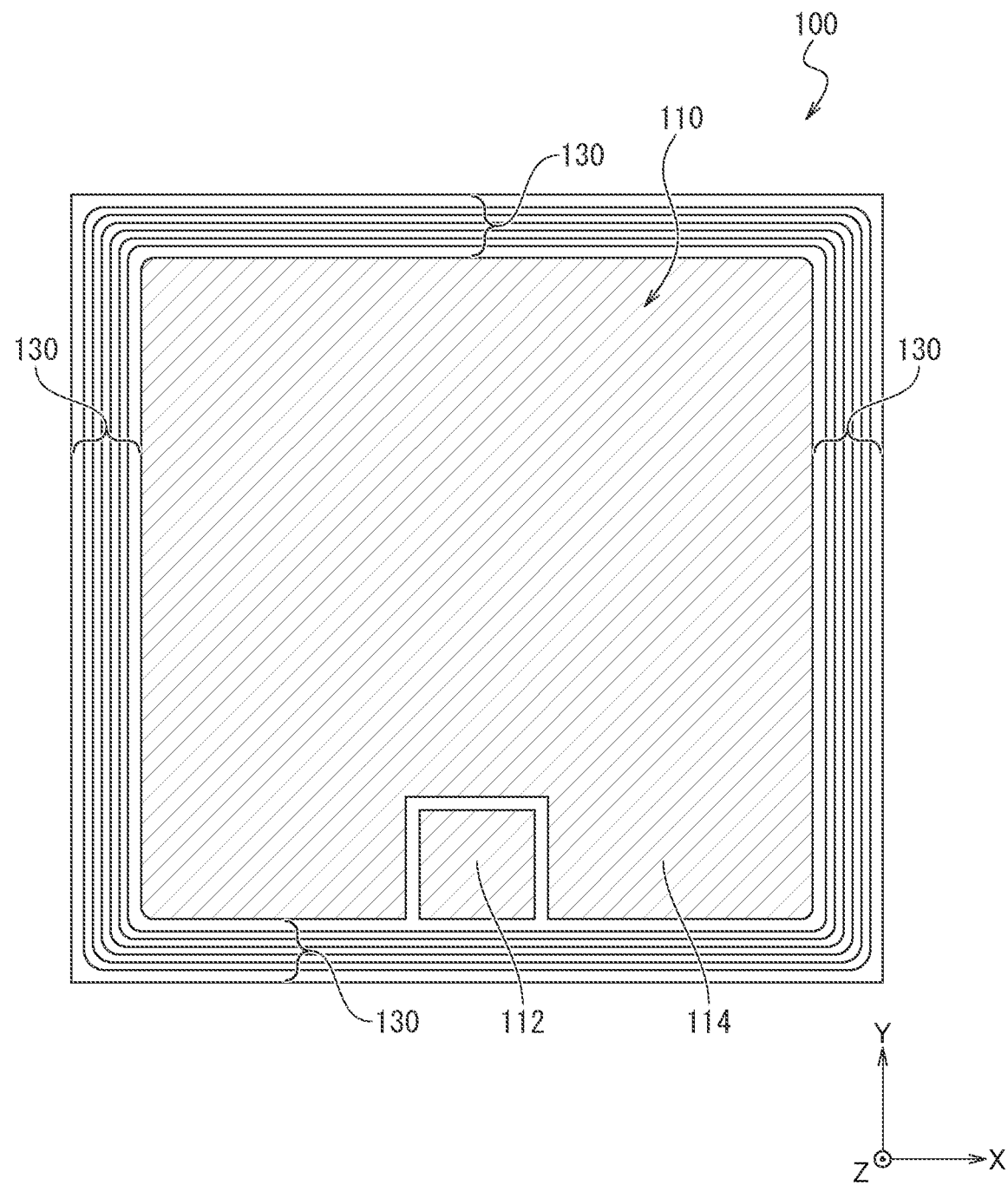
FIG. 1 is a plan view illustrative of a configuration example of a GaN semiconductor device according to a first embodiment of the present invention.

Embodiments of the present invention will be described below. In the following description of the drawings, the same or similar portions are denoted by the same or similar reference numerals. However, it should be noted that the drawings are schematic and a relation between a thickness and a flat dimension, a ratio of thicknesses of respective devices or members, and the like are different from actual ones. Accordingly, specific thicknesses and dimensions should be determined with reference to the following description. In addition, it is certain that some portions have different dimensional relations and ratios between the drawings.

In addition, in the following description, descriptions relating to directions are sometimes made using wording such as "X-axis direction", "Y-axis direction", and "Z-axis direction". For example, the X-axis direction and the Y-axis direction are directions parallel to a front surface 10a of a GaN substrate 10, which will be described later. The X-axis direction and the Y-axis direction are also referred to as horizontal directions. In addition, the Z-axis direction is a direction perpendicularly intersecting the front surface 10a of the GaN substrate 10 (that is, the thickness direction of the GaN substrate 10). The X-axis direction, the Y-axis direction, and the Z-axis direction intersect one another at right angles.

In addition, in the following description, the term "as viewed in plan" means, for example, viewing from the direction perpendicularly intersecting the front surface 10a of the GaN substrate 10, which will be described later (for example, the Z-axis direction).

In the following description, the positive direction and the negative direction of the Z-axis are sometimes referred to as "upper" and "lower", respectively. The "upper" and the "lower" do not necessarily mean the vertical directions with respect to the ground surface. In other words, the directions to "upper" and "lower" are not limited to the directions of gravitational force. The "upper" and the "lower" are nothing more than expressions for the sake of convenience to specify relative positional relations in a region, a layer, a film, a substrate, or the like, and do not limit a technological concept of the present invention. For example, it is needless to say that, when the plane of paper is rotated 180 degrees, "upper" and "lower" are exchanged with "lower" and "upper", respectively.

In addition, in the following description, signs + and − attached to P or N, which indicate conductivity types, indicate that semiconductor regions to the conductivity types of which the signs + and − are attached are semiconductor regions the impurity concentrations of which are relatively higher and lower than another semiconductor region to the conductivity type of which neither + nor − is attached, respectively. However, two semiconductor regions having the same conductivity type P (or the same conductivity type N) assigned thereto does not necessarily mean that impurity concentrations of the semiconductor regions are exactly the same.

First Embodiment

Configuration Example

FIG. 1 is a plan view illustrative of a configuration example of a gallium nitride semiconductor device (an example of a "nitride semiconductor device" of the present invention, and hereinafter, referred to as a GaN semiconductor device) 100 according to a first embodiment of the present invention. FIG. 1 is an X-Y plan view. As illustrated in FIG. 1, the GaN semiconductor device 100 includes an active region 110 and an edge termination region 130. The active region 110 includes a gate pad 112 and a source pad 114. The gate pad 112 and the source pad 114 are electrode pads that are electrically connected to gate electrodes 23 and source electrodes 25, which will be described later, respectively.

The edge termination region 130 surrounds the circumference of the active region 110 as viewed in plan from the Z-axis direction. The edge termination region 130 may have one or more of a guard ring structure and a junction termination extension (JTE) structure. The edge termination region 130 may have a function of, by extending depletion layers generated in the active region 110 to the edge termination region 130, preventing electric field concentration in the active region 110.

Figure 2:
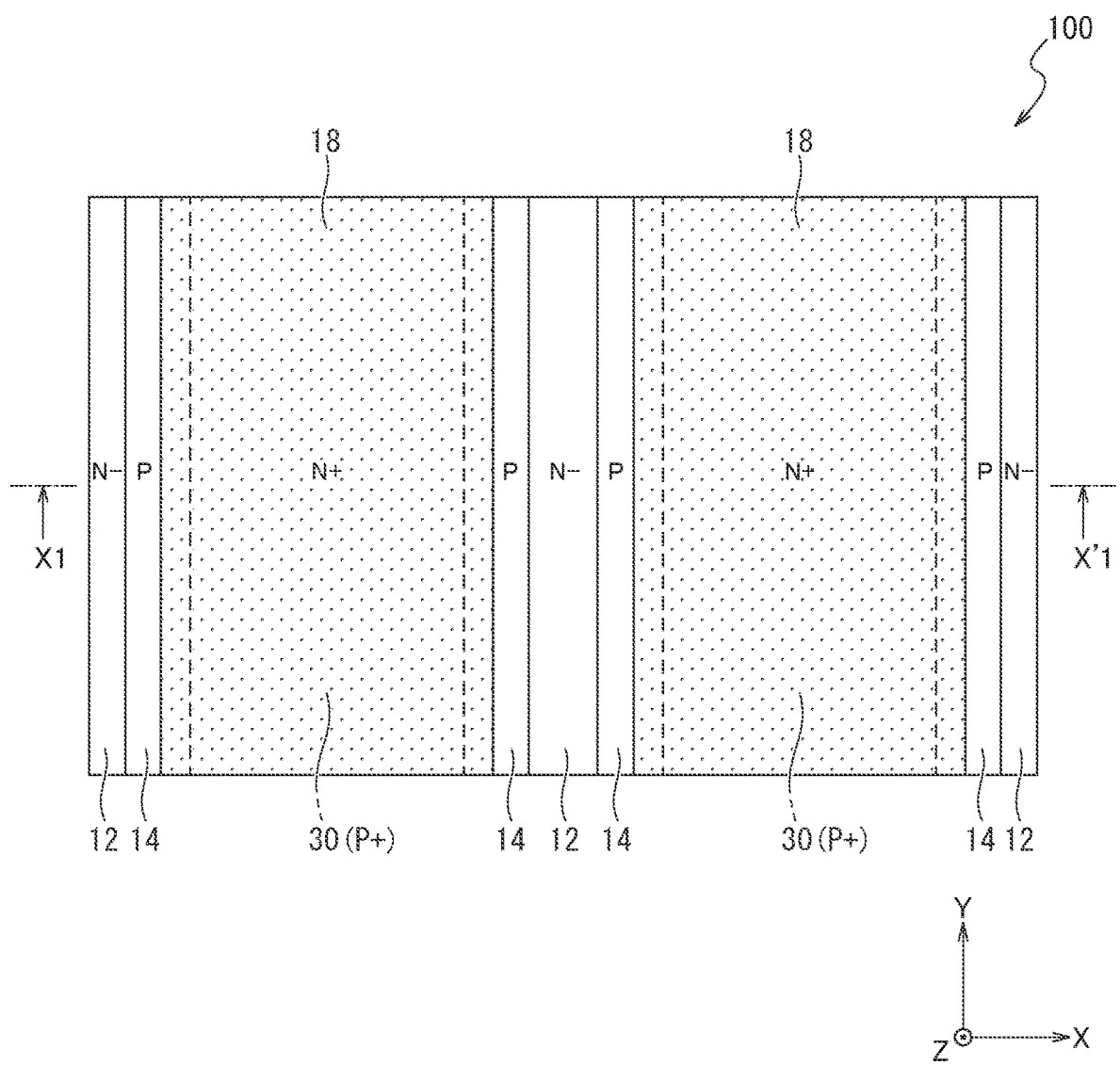
FIG. 2 is a plan view illustrative of a configuration example of a vertical MOSFET according to the first embodiment of the present invention.

FIG. 2 is a plan view illustrative of a configuration example of a vertical MOSFET 1 according to the first embodiment of the present invention. In FIG. 2, in order to illustrate a portion of the active region 110 illustrated in FIG. 1 in an enlarged manner and, at the same time, illustrate shapes of N$^+$-type source regions 18 and the like as viewed in plan from the Z-axis direction, illustrations of the gate pad 112, the source pad 114, the gate electrodes 23, and the source electrodes 25 are omitted.

Figure 3A:
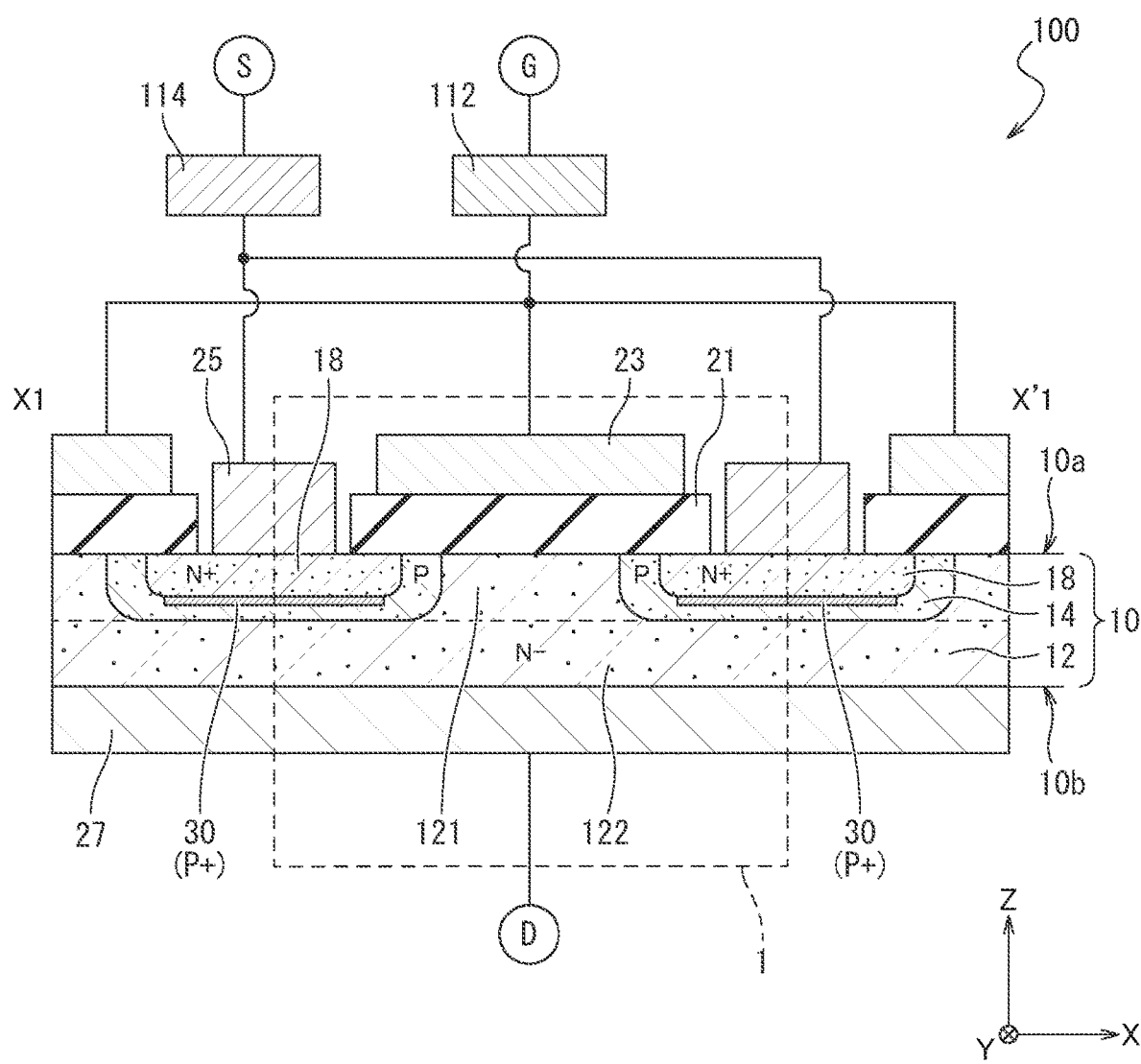
FIG. 3A is a cross-sectional view illustrative of the configuration example of the vertical MOSFET according to the first embodiment of the present invention.
Figure 3B:
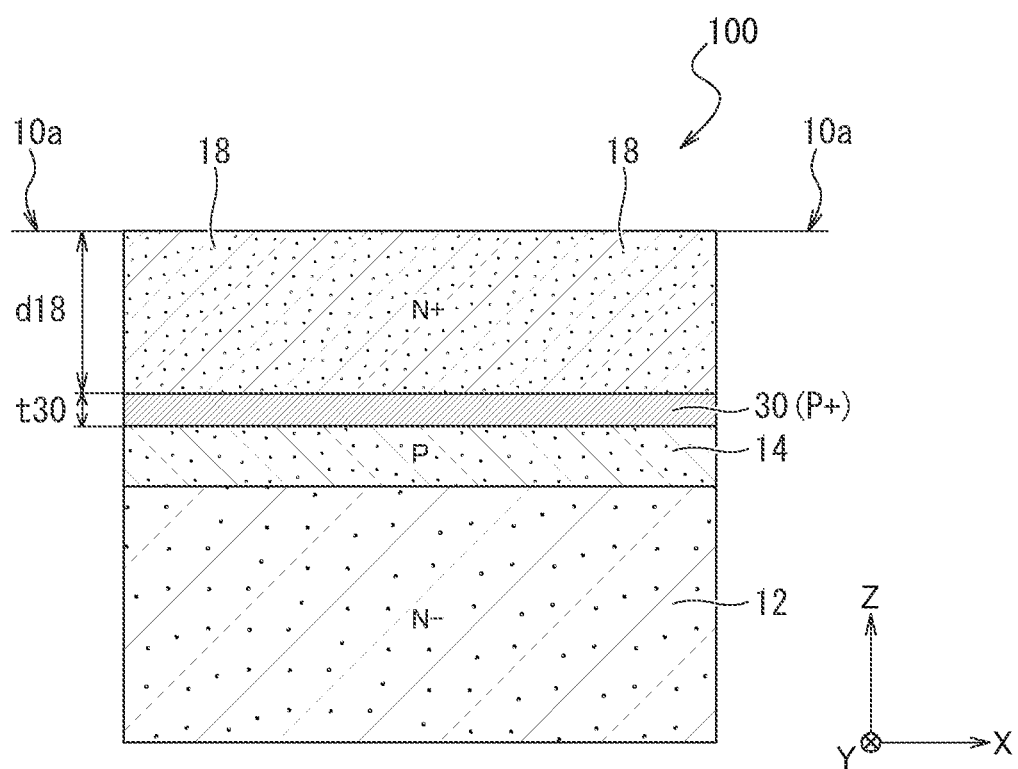
FIG. 3B is a cross-sectional view illustrative of a first P$^+$-type region and a peripheral region thereof in the cross-sectional view in FIG. 3A, in an enlarged manner.

FIG. 3A is a cross-sectional view illustrative of the configuration example of the vertical MOSFET 1 according to the first embodiment of the present invention. FIG. 3A illustrates a cross-section of the plan view in FIG. 2 taken along the line X1-X'1 thereof. FIG. 3B is a cross-sectional view illustrative of a first P$^+$-type region and a peripheral region thereof in the cross-sectional view in FIG. 3A, in an enlarged manner. FIG. 3B illustrates a cross-section of the plan view in FIG. 2B taken along the line X2-X'2 thereof.

The GaN semiconductor device 100 illustrated in FIGS. 2 and 3A includes a gallium nitride substrate (an example of a "nitride semiconductor layer" of the present invention, and hereinafter, referred to as a GaN substrate) 10 and a plurality of vertical MOSFETs 1 (an example of "field effect transistor" of the present invention) formed in the GaN substrate 10. In the GaN semiconductor device 100, the vertical MOSFETs 1 are repeatedly formed in one direction (for example, the X-axis direction). One vertical MOSFET 1 is a unit structure of the repeat, and the unit structures are arranged in line in one direction (for example, the X-axis direction).

As illustrated in FIGS. 2 and 3A, the vertical MOSFET 1 includes an N$^-$-type drift region 12, P-type well regions 14, N$^+$-type source regions 18 (an example of "N-type region" of the present invention), and first P$^+$-type regions 30 (an example of a "first P-type region" of the present invention) that are formed in the GaN substrate 10, a gate insulating film 21 formed on a front surface 10$a$ (an example of "one surface" of the present invention) of the GaN substrate 10, a gate electrode 23 formed on the gate insulating film 21, source electrodes 25 (an example of an "electrode" of the present invention) that are formed on the front surface 10$a$ side of the GaN substrate 10 and that are electrically connected to the N$^+$-type source regions 18, and a drain electrode 27 that is formed on the back surface 10$b$ side of the GaN substrate 10 and that is electrically connected to the drift region 12.

The GaN substrate 10 is a GaN single crystal substrate. The GaN substrate 10 is, for example, an N$^-$-type substrate. The GaN substrate 10 has the front surface 10$a$ and the back surface 10$b$ that is located on the opposite side to the front surface 10$a$. For example, the GaN substrate 10 is a low dislocation free-standing GaN substrate the penetrating dislocation density of which is less than $1 \times 10^7$ cm$^{-2}$.

Donor elements (N-type impurities) contained in the GaN substrate 10 may be one or more types of elements from among silicon (Si), germanium (Ge), and oxygen (O). In addition, acceptor elements (P-type impurities) contained in the GaN substrate 10 may be one or more types of elements from among magnesium (Mg), calcium (Ca), beryllium (Be), and zinc (Zn).

Even when a power device having a large area is formed in the GaN substrate 10, the GaN substrate 10 being a low dislocation free-standing GaN substrate enables leakage current in the power device to be reduced. This capability enables power devices to be manufactured with a high non-defective rate. It is also possible to prevent impurities that are ion-implanted from deeply diffusing along dislocations in heat treatment that is included in a manufacturing process of the vertical MOSFETs 1.

Note that the GaN substrate 10 may be of N-type instead of N$^-$-type. In addition, the GaN substrate 10 may include a GaN single crystal substrate and a single crystal GaN layer that is epitaxially grown on the GaN single crystal substrate. In this case, the GaN single crystal substrate may be of N$^+$-type or N-type, and the GaN layer may be of N-type or N$^-$-type. In addition, the GaN single crystal substrate may be a low dislocation free-standing GaN substrate.

In the vertical MOSFET 1, the GaN substrate 10 may include one or more elements of aluminum (Al) and indium (In). The GaN substrate 10 may be a mixed crystal semiconductor that contains a small amount of Al and In in GaN, that is, $Al_xIn_yGa_{1-x-y}N$ (0≤x<1, 0≤y<1). Note that GaN is a semiconductor when x and y in $Al_xIn_yGa_{1-x-y}N$ are set as x=y=0.

In the GaN substrate 10, the drift region 12, the P-type well regions 14, the N$^+$-type source regions 18, and the first P$^+$-type regions 30 are respectively formed. The well regions 14, the N$^+$-type source regions 18, and the first P$^+$-type regions 30 are respectively regions where ions of impurities are implanted to a predetermined depth from the front surface 10$a$ of the GaN substrate 10 and the impurities are activated by heat treatment.

For example, each of the first P$^+$-type regions 30 is formed in a region that is within a P-type well region 14 and located under an N$^+$-type source region 18. As illustrated in FIGS. 3A and 3B, each of the first P$^+$-type regions 30 is sandwiched by an N$^+$-type source region 18 and a P-type well region 14 on both sides in the vertical direction and is respectively in contact with the N$^+$-type source region 18 and the well region 14. The first P$^+$-type region 30 has a higher P-type impurity concentration than the well region 14. The well region 14 and the first P$^+$-type region 30 contain at least one of Mg and Be as an acceptor element.

To cite an example, the well regions 14 and the first P$^+$-type regions 30 contain Mg as an acceptor element. Mg concentration in the well regions 14 is $1\times10^{16}$ cm$^{-3}$ or more and $3\times10^{18}$ cm$^{-3}$ or less. Mg concentration in the first P$^+$-type regions 30 is $1\times10^{19}$ cm$^{-3}$ or more and $1\times10^{21}$ cm$^{-3}$ or less.

The drift region 12 is an N$^-$-type region. The N$^+$-type source regions 18 have a higher N-type impurity concentration than the N$^-$-type drift region 12. The drift region 12 and the N$^+$-type source regions 18 contain, for example, Si as N-type impurities. For example, the N-type impurity concentration of the drift region 12 is the same as the N-type impurity concentration of the GaN substrate 10. In this case, N-type impurities do not have to be ion-implanted into the drift region 12. Si concentration in the drift region 12 is $1\times10^{15}$ cm$^{-3}$ or more and $1\times10^{17}$ cm$^{-3}$ or less.

Each of the N$^+$-type source regions 18 is formed in a region that is located on the front surface side of a well region 14 (that is, a region that is within the well region 14 and located on the front surface 10*a* side of the GaN substrate 10). The N$^+$-type source regions 18 are formed by ions of Si being implanted on the front surface side of the well regions 14 and Si being activated by heat treatment. Si concentration in the N$^+$-type source regions 18 is $1\times10^{19}$ cm$^{-3}$ or more and $1\times10^{22}$ cm$^{-3}$ or less.

Upper portions of the N$^+$-type source regions 18 are exposed on the front surface 10*a* of the GaN substrate 10. Each of the N$^+$-type source regions 18 has one side portion in the X-axis direction and the other side portion that is located on the opposite side to the one side portion in the X-axis direction. The one side portion and the other side portion of each of the N$^+$-type source regions 18 are respectively in contact with a well region 14. In addition, a portion or all of the bottom portion of each of the N$^+$-type source regions 18 is in contact with a first P$^+$-type region 30. Each channel of the vertical MOSFET 1 is formed in a region that is within a well region 14 and located adjacent to one side portion or the other side portion of an N$^+$-type source region 18. In the following description, a region that is within a well region 14 and in which a channel of the vertical MOSFET 1 is formed is referred to as a channel region.

As illustrated in FIG. 2, the well regions 14, the first P$^+$-type regions 30, and the N$^+$-type source regions 18 have, for example, stripe shapes extending in the Y-axis direction.

Upper portions (hereinafter, referred to as upper regions) 121 of the drift region 12 are exposed on the front surface 10*a* of the GaN substrate 10. Each of the upper regions 121 is in contact with one of the gate insulating films 21 at the front surface 10*a*. Each of the upper regions 121 is located between a pair of well regions 14 that are opposed to each other in the Y-axis direction. The upper regions 121 may be referred to as JFET regions. The upper regions 121 may be of N-type instead of N$^-$-type. This configuration enables on-resistance of the vertical MOSFETs 1 to be reduced.

A lower portion (hereinafter, referred to as a lower region) 122 of the drift region 12 is in contact with the bottom portions of the well regions 14. The lower region 122 is located respectively between the upper regions 121 and the drain electrode 27 and between the well regions 14 and the drain electrode 27. The lower region 122 is formed in a continuous manner in the X-axis direction across a plurality of vertical MOSFETs 1 (that is, a plurality of unit structures) that are repeated in the X-axis direction.

The drift region 12 functions as current paths between the drain electrode 27 and the channel regions. Each of the first P$^+$-type regions 30 is a region formed to establish an ohmic connection excelling in ohmic characteristics between a source electrode 25 and a P-type well region 14.

That is, each of the first P$^+$-type regions 30 causes an ohmic connection to be achieved between an N$^+$-type source region 18 and a P-type well region 14 by a tunnel junction. Since connection between a source electrode 25 and an N$^+$-type source region 18 and connection between the N$^+$-type source region 18 and a P-type well region 14 are respectively ohmic contacts, connection between the source electrode 25 and the P-type well region 14 is an ohmic connection. It is possible to establish an ohmic connection between each of the source electrodes 25 and a P-type well region 14 via an N$^+$-type source region 18 and a first P$^+$-type region 30. Note that the N$^+$-type source regions 18 and the first P$^+$-type regions 30 also function as hole extraction paths at the time of gate-off.

The gate insulating films 21 are, for example, silicon oxide films (SiO$_2$ films). The gate insulating films 21 are, for example, formed on the flat front surface 10*a*.

Each of the gate electrodes 23 is formed over channel regions with a gate insulating film 21 interposed therebetween. For example, the gate electrodes 23 are planar type gate electrodes formed on the flat gate insulating films 21. The gate electrodes 23 are formed of a material different from the material of which the gate pad 112 is made. The gate electrodes 23 are formed of impurity-doped polysilicon, and the gate pad 112 is formed of Al or an alloy of Al—Si.

The source electrodes 25 are formed on the front surface 10*a* of the GaN substrate 10. Each of the source electrodes 25 is in contact with a portion of an N$^+$-type source region 18. The source electrodes 25 may also be formed over the gate electrodes 23 with not-illustrated interlayer insulating films interposed therebetween. The interlayer insulating films may cover upper portions and side portions of the gate electrodes 23 lest the gate electrodes 23 and the source electrodes 25 electrically connect to each other.

The source electrodes 25 are formed of a material that is capable of forming an ohmic contact with an N$^+$-type source region 18, and formed of, for example, the same material as that of the source pad 114. To cite an example, the source electrodes 25 are formed of Al or an alloy of Al—Si and also serve as the source pad 114. The source electrodes 25 may have barrier metal layers between the front surface 10*a* of the GaN substrate 10 and Al (or Al—Si) of the source electrodes 25. Titanium (Ti) may be used as a material of the barrier metal layers.

The drain electrode 27 is formed on the back surface 10*b* side of the GaN substrate 10 and is in contact with the back surface 10*b*. The drain electrode 27 is formed of a material that is capable of forming an ohmic contact with the back surface 10*b* of the GaN substrate 10, and formed of, for example, the same material as that of the source electrodes 25.

In FIG. 3A, a gate terminal, a source terminal, and a drain terminal are denoted by G, D, and S, respectively. For example, when a potential equal to or greater than a threshold voltage is provided to the gate electrodes 23 via the gate terminal G, inversion layers are formed in the channel regions. When a predetermined high potential is provided to the drain electrode 27 and a low potential (for example, ground potential) is provided to the source electrodes 25 while inversion layers are formed in the channel regions, current flows from the drain terminal D to the source terminal S. In addition, when a potential lower than the threshold voltage is provided to the gate electrodes 23, no inversion layer is formed in the channel regions and current is cut off. This configuration enables the vertical MOSFETs 1 to switch current between the source terminal S and the drain terminal D.

In the first P$^+$-type regions 30, segregation of Mg is suppressed. For example, Mg segregation is categorized into rod-like Mg segregation and non-rod-like Mg segregation. The rod-like Mg segregation is segregation having a length in one direction of 30 nm or more and segregation with a Mg concentration of $5\times10^{20}$ cm$^{-3}$ or more. The non-rod-like Mg segregation is segregation having a length in one direction of less than 30 nm and segregation with a Mg concentration of $5\times10^{20}$ cm$^{-3}$ or more. Density of rod-like acceptor segregation in the first P$^+$-type regions 30 is $1\times10^{14}$ cm$^{-3}$ or less, and density of non-rod-like acceptor segregation in the first P$^+$-type regions 30 is less than $1\times10^{15}$ cm$^{-3}$.

These features are achieved by forming N$^+$-type source regions 18 in adjacency to first P$^+$-type formation regions 30' (see FIG. 4D) in advance when Mg that has been ion-implanted into the first P$^+$-type formation regions 30' is activated by heat treatment, as described later. Forming an N$^+$-type source region 18 in contact with a first P$^+$-type formation region 30' causes a depletion layer to be formed in the first P$^+$-type formation region 30' and the Fermi level of the depletion layer to be prevented from coming close to the valence band (more preferably, causes the Fermi level to be brought close to the conduction band). This configuration causes Mg segregation in the first P$^+$-type regions 30 to be suppressed. Segregation of Mg being suppressed causes formation of a P$^+$-type region having high concentration and small variation in concentration to be achieved.

In addition, concentration of a donor element (for example, Si) in the N$^+$-type source regions 18 has a higher value than the Mg concentration in the first P$^+$-type regions 30. These features cause the depletion layers to easily extend widely from the N$^+$-type source regions 18 to the first P$^+$-type region 30 sides and the first P$^+$-type regions 30 that have high Mg concentration to be easily formed widely.

Since the first P$^+$-type regions 30 have high Mg concentration and small variation in the Mg concentration, it is possible to connect an N$^+$-type source region 18 and a P-type well region 14 by a tunnel junction and achieve an ohmic connection between a source electrode and the well region 14.

Note that, in FIG. 3B, depth d18 of an N$^+$-type source region 18 is, for example, 1 nm or more and 500 nm or less and, for example, has a value in a range from several nm to several tens of nm. Thickness t30 of a first P$^+$-type region 30 is, for example, 1 nm or more and 25 nm or less.

(Manufacturing Method)

Next, a method for manufacturing the GaN semiconductor device 100 according to the first embodiment of the present invention will be described. FIGS. 4A to 4F are cross-sectional views illustrative of the method for manufacturing the GaN semiconductor device 100 according to the first embodiment of the present invention in the sequence of steps. The GaN semiconductor device 100 is manufactured using various types of apparatuses, such as a film forming apparatus, an exposure apparatus, an etching apparatus, an ion implantation apparatus, and a heat treatment apparatus. Hereinafter, such apparatuses are collectively referred to as a manufacturing apparatus.

First, the manufacturing apparatus performs ion implantation for forming the well regions 14 (see FIG. 3A). For example, the manufacturing apparatus forms a mask (not illustrated) in which portions over regions (hereinafter, referred to as well formation regions) 14' in which the well regions 14 are to be formed are opened and that covers the upper parts of the other regions, on the GaN substrate 10 and implants, as an acceptor element, ions of Mg into the GaN substrate 10 on which the mask is formed. The mask is, for example, a resist pattern. After the ion implantation, the manufacturing apparatus removes the mask from the top of the GaN substrate 10.

In the ion implantation step for forming the well regions 14, Mg implantation energy (acceleration voltage) is set in such a way that the well regions 14 are formed to a deeper depth from the front surface 10a of the GaN substrate 10 than each of the N$^+$-type source regions 18 and the first P$^+$-type regions 30 (see FIG. 3A). The ion implantation step may be performed by one-step ion implantation in which acceleration energy is applied in accordance with one condition or multi-step ion implantation in which acceleration energy is applied in accordance with a plurality of conditions. In addition, in the ion implantation step, a dose amount of Mg is set in such a way that Mg concentration in the well regions 14 is $1\times10^{16}$ cm$^{-3}$ or more and $3\times10^{18}$ cm$^{-3}$ or less.

Next, the manufacturing apparatus performs ion implantation for forming the N$^+$-type source regions 18 (see FIG. 3A). For example, the manufacturing apparatus forms a mask (not illustrated) in which portions over regions (hereinafter, referred to as source formation regions 18') in which the N$^+$-type source regions 18 are to be formed are opened and that covers the upper parts of the other regions, on the GaN substrate 10 and implants, as a donor element, ions of Si into the GaN substrate 10 on which the mask is formed. The mask is, for example, a resist pattern. After the ion implantation, the manufacturing apparatus removes the mask from the top of the GaN substrate 10.

In the ion implantation step for forming the N$^+$-type source regions 18, Si implantation energy (acceleration voltage) is set in such a way that the depth d18 of the N$^+$-type source regions 18 (see FIG. 3B) is 1 nm or more and 500 nm or less. In addition, in the ion implantation step for forming the N$^+$-type source regions 18, a dose amount of Si is set in such a way that Si concentration in the N$^+$-type source regions 18 has a value equal to or greater than Mg concentration in the first P$^+$-type regions 30. For example, the dose amount of Si is set in such a way that Si concentration in the N$^+$-type source regions 18 is $1\times10^{9}$ cm$^{-3}$ or more and $1\times10^{22}$ cm$^{-3}$ or less.

Figure 4A:
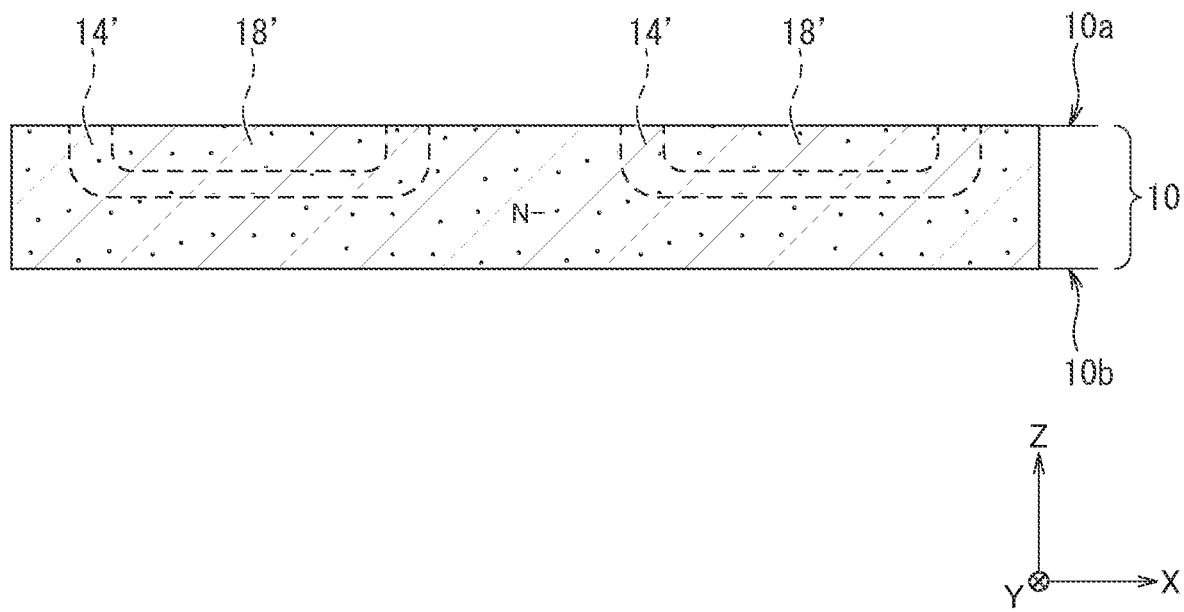
FIG. 4A is a cross-sectional view illustrative of a method for manufacturing the GaN semiconductor device according to the first embodiment of the present invention in the sequence of steps.
Figure 4B:
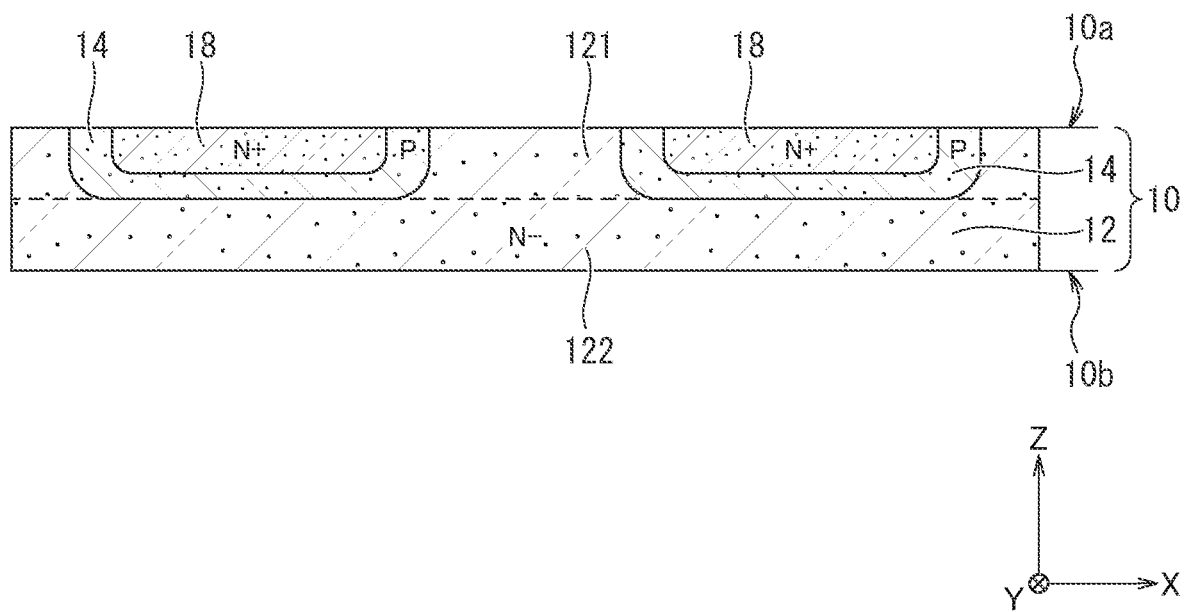
FIG. 4B is another cross-sectional view illustrative of the method for manufacturing the GaN semiconductor device according to the first embodiment of the present invention in the sequence of steps.

Next, the manufacturing apparatus subjects the GaN substrate 10 to heat treatment the maximum temperature of which is equal to or less than 1200° C. This heat treatment is, for example, rapid heat treatment. This heat treatment causes Mg and Si, which are ion-implanted into the GaN substrate 10, to be activated, and, as illustrated in FIG. 4B, the P-type well regions 14 and the N$^+$-type source regions 18 to be formed and, at the same time, the drift region 12 to be defined in the GaN substrate 10. In addition, this heat treatment enables defects induced by the ion implantation of Mg and Si to be repaired to some extent in the GaN substrate 10. Note that this heat treatment may be performed with a protective film (not illustrated) formed on the GaN substrate 10. As the protective film, for example, aluminum nitride (AlN) or silicon nitride (SiN) may be used. The protective film is removed after the heat treatment.

Figure 4C:
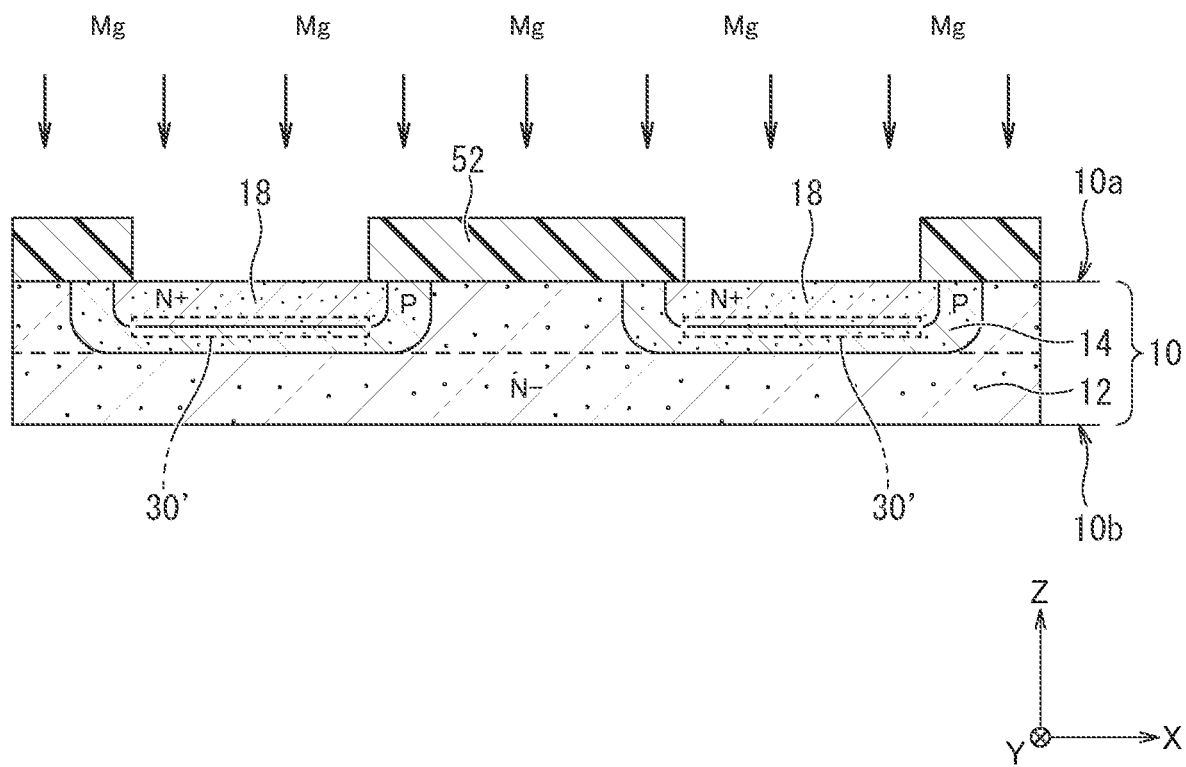
FIG. 4C is still another cross-sectional view illustrative of the method for manufacturing the GaN semiconductor device according to the first embodiment of the present invention in the sequence of steps.

Next, as illustrated in FIG. 4C, the manufacturing apparatus forms a mask 52 in which portions over regions (hereinafter, referred to as first P$^+$-type formation regions) 30' in which the first P$^+$-type regions 30 (see FIG. 3A) are to be formed are opened and that covers the upper parts of the other regions, on the GaN substrate 10. The mask 52 is, for example, a resist pattern.

As illustrated in FIG. 4C, the first P+-type formation regions 30' may be set in such a way that a portion of each of the first P+-type formation regions 30' overlaps an N+-type source region 18. In this case, a depletion layer is formed in a region that is a portion of each of the first P+-type formation regions 30' and that is located under an N+-type source region 18 (that is, a region that does not overlap an N+-type source region 18), and a first P+-type region 30 is formed in the region in which the depletion layer is formed.

Next, the manufacturing apparatus implants ions of Mg into the GaN substrate 10 on which the mask 52 is formed, as an acceptor element. After the ion implantation, the manufacturing apparatus removes the mask 52 from the top of the GaN substrate 10.

In the ion implantation step for forming the first P+-type regions 30, Mg implantation energy (acceleration voltage) is set in such a way that the first P+-type regions 30 are formed under the N+-type source regions 18. That is, in the ion implantation step for forming the first P+-type regions 30, Mg implantation energy (acceleration voltage) is set in such a way that Mg is implanted into regions the depth of which from the front surface 10a of the GaN substrate 10 is deeper than the bottom portions of the N+-type source regions 18 and in which depletion layers are formed by contact with the N+-type source regions 18.

In addition, in the ion implantation step for forming the first P+-type regions 30, a dose amount of Mg is set in such a way that Mg concentration in the first P+-type regions 30 has a value equal to or less than Si concentration in the N+-type source regions 18. For example, the dose amount of Mg is set in such a way that Mg concentration in the first P+-type regions 30 is $1\times10^{19}$ cm$^{-3}$ or more and $1\times10^{21}$ cm$^{-3}$ or less.

Figure 4D:
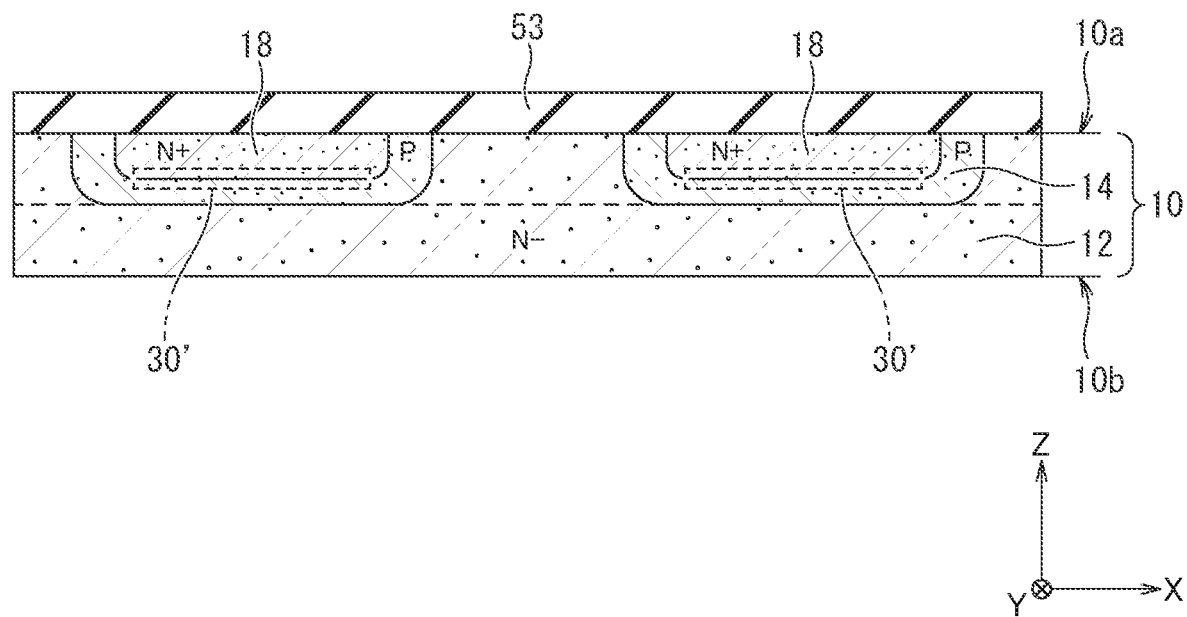
FIG. 4D is still another cross-sectional view illustrative of the method for manufacturing the GaN semiconductor device according to the first embodiment of the present invention in the sequence of steps.

Next, as illustrated in FIG. 4D, the manufacturing apparatus forms a protective film 53 on the GaN substrate 10. The protective film 53 is, for example, AlN or SiN.

Figure 4E:
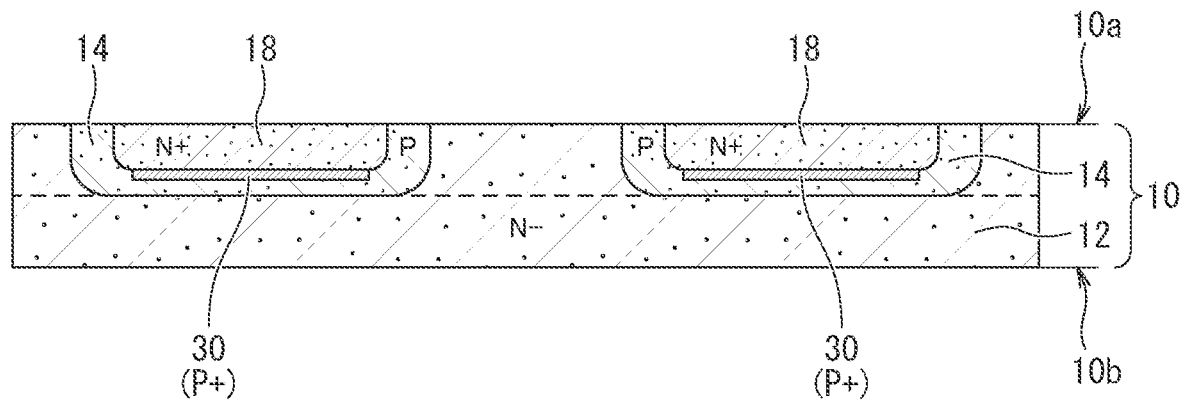
FIG. 4E is still another cross-sectional view illustrative of the method for manufacturing the GaN semiconductor device according to the first embodiment of the present invention in the sequence of steps.

Next, the manufacturing apparatus subjects the GaN substrate 10 covered by the protective film 53 to heat treatment the maximum temperature of which is 1300° C. or more and 2000° C. or less. This heat treatment is, for example, rapid heat treatment. This heat treatment causes Mg, which is ion-implanted into the GaN substrate 10, to be activated and, as illustrated in FIG. 4E, the first P+-type regions 30 to be formed in the GaN substrate 10. In addition, this heat treatment enables defects induced by the ion implantation of Mg to be repaired to some extent in the GaN substrate 10. After the heat treatment, the manufacturing apparatus removes the protective film 53 from the front surface 10a of the GaN substrate 10.

Figure 4F:
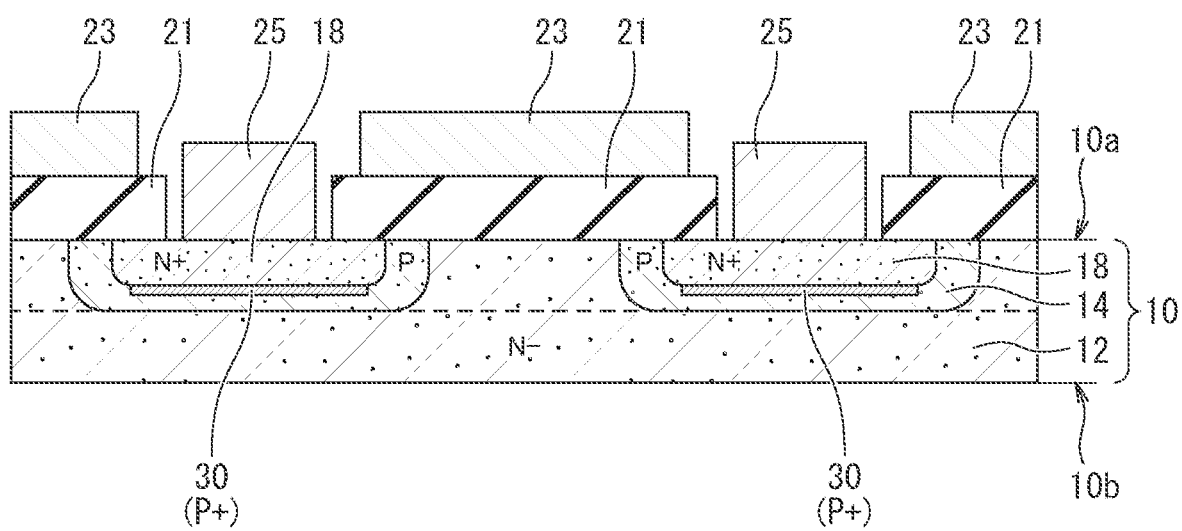
FIG. 4F is still another cross-sectional view illustrative of the method for manufacturing the GaN semiconductor device according to the first embodiment of the present invention in the sequence of steps.

Next, as illustrated in FIG. 4F, the manufacturing apparatus forms the gate insulating films 21 on the GaN substrate 10. Next, the manufacturing apparatus forms the gate electrodes 23 and the source electrodes 25. Next, the manufacturing apparatus forms an interlayer insulating film (not illustrated) on the front surface 10a of the GaN substrate 10 in such a way that the gate electrodes 23 and the source electrodes 25 are covered by the interlayer insulating film. Next, the manufacturing apparatus forms the gate pad 112 (see FIG. 1) that is electrically connected to the gate electrodes 23 and the source pad 114 (see FIG. 1) that is electrically connected to the source electrodes 25. Subsequently, the manufacturing apparatus forms the drain electrode 27 on the back surface 10b of the GaN substrate 10. Through the above-described steps, the GaN semiconductor device 100 including the vertical MOSFETs 1 (see FIG. 3A) is completed.

(Fermi-Level of Depletion Layer Generated in GaN)

Figure 5:
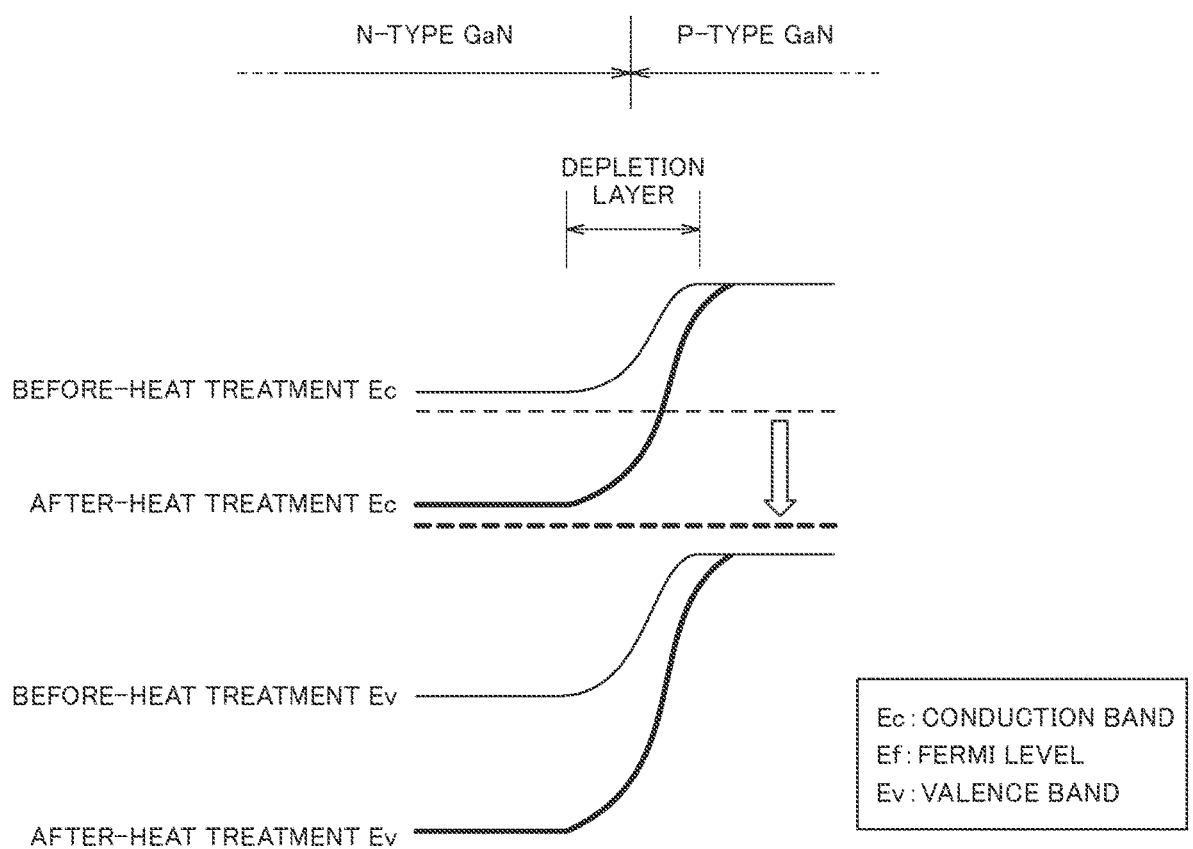
FIG. 5 is a band diagram of a contact portion between an N-type GaN and a P-type GaN and a vicinity thereof and a diagram illustrative of valence bands Ev, conduction bands Ec, and Fermi levels Ef before and after heat treatment for activating an acceptor element (for example, Mg) that is ion-implanted into the P-type GaN.

FIG. 5 is a band diagram of a contact portion between an N-type GaN and a P-type GaN and a vicinity thereof and a diagram illustrative of valence bands Ev, conduction bands Ec, and Fermi levels Ef before and after heat treatment for activating an acceptor element (for example, Mg) that is ion-implanted into the P-type GaN. Note that the N-type GaN before and after heat treatment in FIG. 5 is equivalent to an N+-type source region 18 of the present embodiment. In addition, the P-type GaN before heat treatment in FIG. 5 is equivalent to a first P+-type formation region 30' of the present embodiment and the P-type GaN after heat treatment is equivalent to a first P+-type region 30 of the present embodiment.

As illustrated in FIG. 5, a depletion layer is generated in the contact portion between the N-type GaN and the P-type GaN. A band structure bends in the depletion layer, and the Fermi level Ef of the N-type GaN and the Fermi level Ef of the P-type GaN coincide with each other. When the N-type GaN and the P-type GaN are subjected to heat treatment while the N-type GaN and the P-type GaN are in this state, Mg is activated and the Fermi level comes close to the valence band in the P-type GaN, but the band structure bends in the depletion layer. For this reason, in the P-type GaN, the Fermi level Ef is prevented from coming close to the valence band in the region in which a depletion layer is generated as compared with the region in which no depletion layer is generated.

Figure 6:
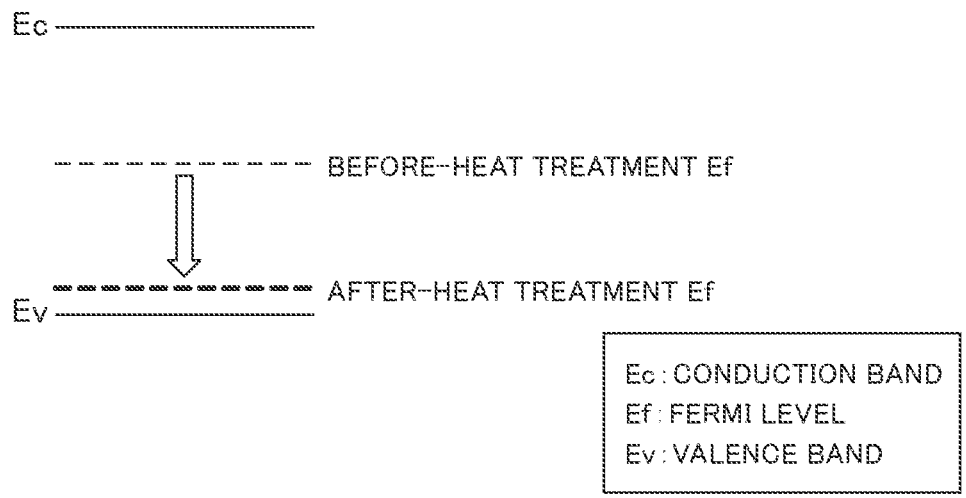
FIG. 6 is a band diagram of the P-type GaN in the case where no N-type GaN exists in the vicinity thereof and a diagram illustrative of valence bands Ev, conduction bands Ec, and Fermi levels Ef before and after heat treatment for activating the acceptor element.

FIG. 6 is a band diagram of the P-type GaN in the case where no N-type GaN exists in the vicinity thereof and a diagram illustrative of valence bands Ev, conduction bands Ec, and Fermi levels Ef before and after heat treatment for activating the acceptor element. When no N-type GaN exists in the vicinity, no depletion layer is generated in the P-type GaN as illustrated in FIG. 6 and bending of the band structure in a depletion layer does not occur. When the P-type GaN covered by an insulating film is subjected to heat treatment, an acceptor element (for example, Mg) that is ion-implanted into the P-type GaN is activated and the Fermi level of the P-type GaN comes close to the valence band.

(Suppression of Mg Segregation by Control of Fermi Level)

Figure 7:
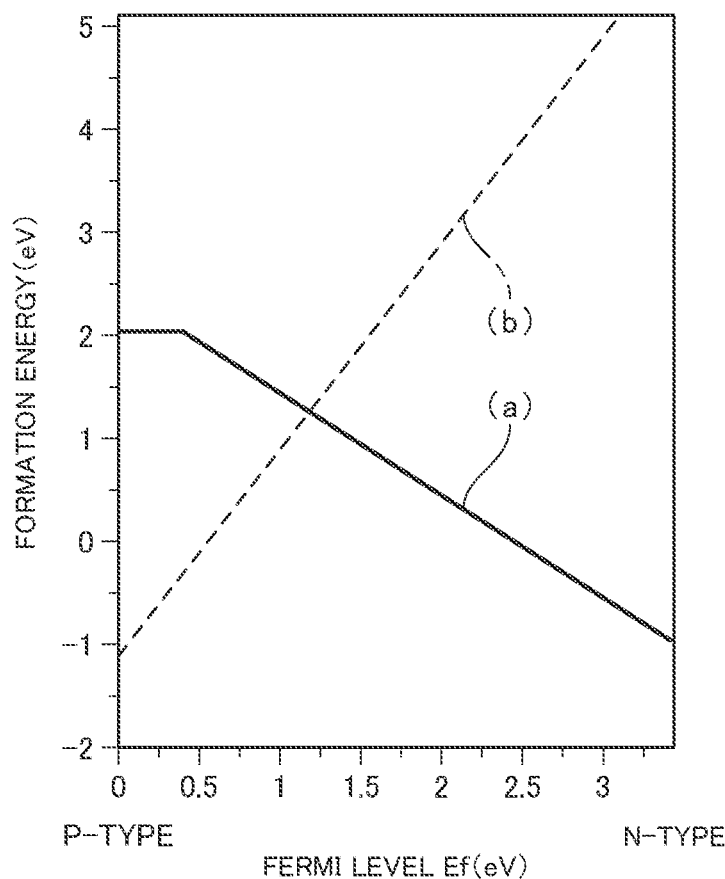
FIG. 7 is a graph illustrative of a relationship between Mg acceptor formation energy in GaN and the Fermi level of GaN.

FIG. 7 is a graph illustrative of a relationship between the Fermi level of GaN and Mg acceptor formation energy and the like in GaN. This graph illustrates data calculated by first-principles calculations. The abscissa in FIG. 7 represents the Fermi level Ef (eV), and the ordinate in FIG. 7 represents energy (eV). A solid line (a) in FIG. 7 indicates a relationship between Mg acceptor formation energy (that is, energy required to incorporate Mg into Ga sites of GaN) and the Fermi level Ef of GaN. A dashed line (b) in FIG. 7 indicates a relationship between energy required for Ga to enter into interstitial sites in GaN and the Fermi level Ef of GaN.

In FIG. 7, the closer to 0 (eV) the Fermi level Ef comes (that is, the closer to the valence band the Fermi level Ef comes and the closer to the P-type the conductivity type of GaN becomes), the larger the Mg acceptor formation energy becomes. In addition, the closer to 0 (eV) the Fermi level comes, the smaller energy required for Ga to enter into interstitial sites in GaN becomes.

From the graph in FIG. 7, it is revealed that the closer to the valence band the Fermi level of GaN comes and the closer to the P-type the conductivity type of GaN becomes, the harder Mg becomes to be activated and to function as acceptors. In other words, it is revealed that the closer to the conduction band the Fermi level of GaN comes and the closer to the N-type the conductivity type of GaN becomes, the easier Mg becomes to be activated and to function as acceptors.

In the embodiment of the present invention, a region that is a portion of each of the first P$^+$-type formation regions 30' and that is located under an N$^+$-type source region 18 (that is, a region that does not overlap an N$^+$-type source region 18) has a depletion layer formed by contact with the N$^+$-type source region 18, and the Fermi level Ef of the depletion layer is prevented from coming close to the valence band Ev. Since the Fermi level Ef of the region that is a portion of each of the first P$^+$-type formation regions 30' and that is located under an N$^+$-type source region 18 is controlled in such a way as not to come close to the valence band, Mg becomes easy to be activated and to function as acceptors in the region.

(Width of Depletion Layer)

Figure 8:
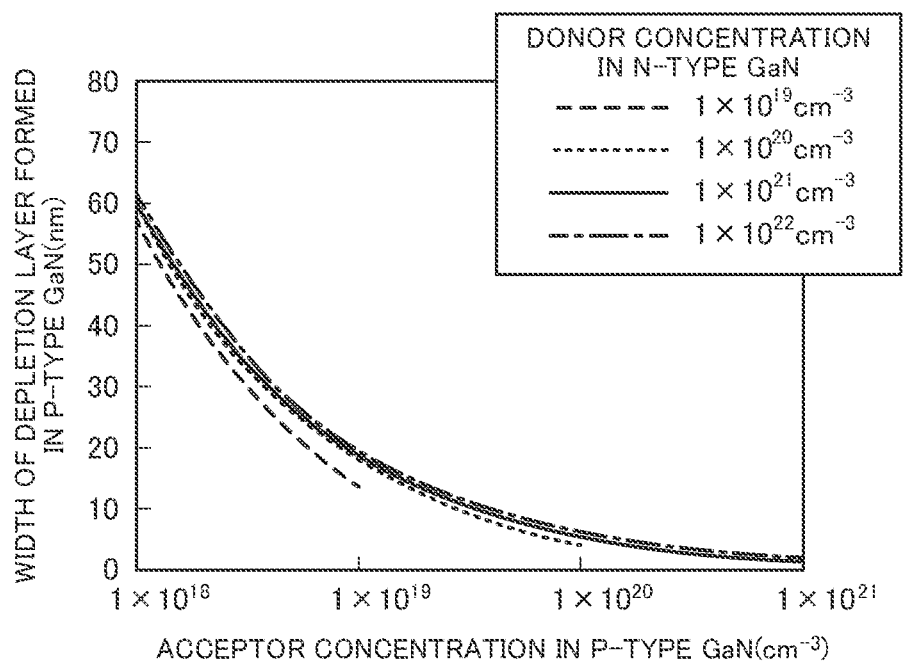
FIG. 8 is a graph illustrative of a relationship between acceptor concentration in a P-type GaN and width of a depletion layer formed in the P-type GaN by contact with an N-type GaN.

FIG. 8 is a graph illustrative of a relationship between acceptor concentration in a P-type GaN and width of a depletion layer formed in the P-type GaN by contact with an N-type GaN. The abscissa in FIG. 8 represents acceptor concentration (cm$^{-3}$) in the P-type GaN, and the ordinate in FIG. 8 represents width (nm) of a depletion layer formed in the P-type GaN.

As illustrated in FIG. 8, when acceptor concentration in the P-type GaN is $1\times10^{18}$ cm$^{-3}$ or more and $1\times10^{21}$ cm$^{-3}$ or less and donor concentration in the N-type GaN is $1\times10^{19}$ cm$^{-3}$ or more and $1\times10^{22}$ cm$^{-3}$ or less, width (depth) of a depletion layer formed in the P-type GaN by contact with the N-type GaN is approximately several nm or more and 60 nm or less. The higher the donor concentration in the N-type GaN becomes, the larger the width of a depletion layer formed in the P-type GaN tends to be. In addition, the higher the acceptor concentration in the P-type GaN becomes, the smaller the width of a depletion layer formed in the P-type GaN tends to be.

For example, when the acceptor concentration in the P-type GaN is $1\times10^{19}$ cm$^{-3}$ or more and $1\times10^{21}$ cm$^{-3}$ or less and the donor concentration in the N-type GaN is $1\times10^{19}$ cm$^{-3}$ or more and $1\times10^{22}$ cm$^{-3}$ or less, the width (depth) of a depletion layer formed in the P-type GaN by contact with the N-type GaN is 1 nm or more and 25 nm or less. When the acceptor concentration in the P-type GaN is in the order of $1\times10^{19}$ cm$^{-3}$, the width of a depletion layer formed in the P-type GaN by contact with the N-type GaN having a donor concentration of $1\times10^{19}$ cm$^{-3}$ or more and $1\times10^{22}$ cm$^{-3}$ or less is substantially approximately 25 nm.

As illustrated in FIG. 4D, at least a portion of each of the first P$^+$-type formation regions 30' is located under an N$^+$-type source region 18. Thus, when acceptor concentration (for example, Mg concentration) in the first P$^+$-type formation region 30' is in the order of $1\times10^{19}$ cm$^{-3}$, a depletion layer having a width of approximately 25 nm is formed in a region that is a portion of the first P$^+$-type formation region 30' and that is located under the N$^+$-type source region 18.

(Profiles of Mg and Si)

Figure 9:
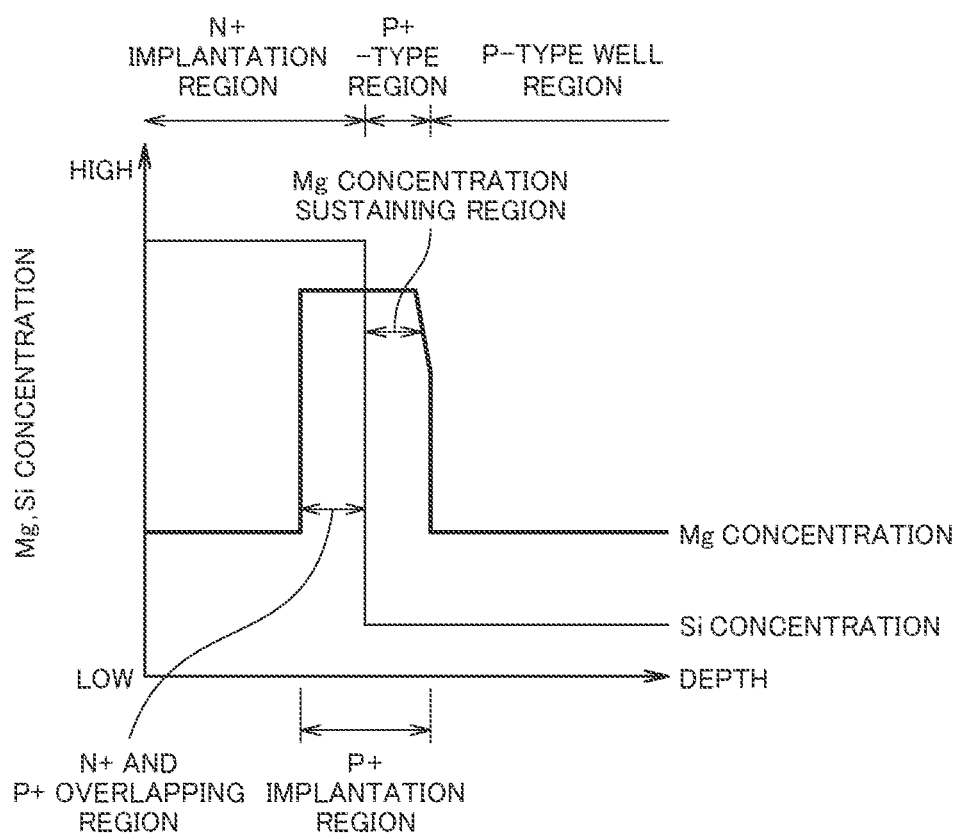
FIG. 9 is a graph illustrative of examples of concentration profiles of Mg and Si in the depth direction of GaN.

FIG. 9 is a graph illustrative of examples of concentration profiles of Mg and Si in the depth direction of GaN. The abscissa in FIG. 9 represents the depth direction of GaN, and the ordinate in FIG. 9 represents concentration of Mg or Si. In FIG. 9, for example, an N$^+$ implantation region is equivalent to a source formation region 18' (see FIG. 4A), and a P$^+$ implantation region is equivalent to a first P$^+$-type formation region 30' (see FIG. 4C). In addition, an N$^+$ and P$^+$ overlapping region is equivalent to an overlapping region between a source formation region 18' and a first P$^+$-type formation region 30'. Since concentration of Si that is implanted into an N$^+$ implantation region is higher than concentration of Mg that is implanted into a P$^+$ implantation region, the conductivity type of an overlapping region between a source formation region 18' and a first P$^+$-type formation region 30' is the N-type.

A Mg concentration sustaining region is depleted by contact with an activated N$^+$ implantation region (for example, an N$^+$-type source region 18) and is controlled in such a way that the Fermi level Ef does not come close to the valence band. Since this configuration enables activation of Mg to be stabilized and segregation of Mg to be suppressed in the Mg concentration sustaining region, the Mg concentration after activation in the Mg concentration sustaining region is maintained high.

Each of the first P$^+$-type regions 30 (see FIGS. 3A and 3B) is preferably formed of only a Mg concentration sustaining region. Thickness (length in the horizontal axis direction in FIG. 9) of a Mg concentration sustaining region is 1 nm or more and 25 nm or less, preferably 1 nm or more and 20 nm or less, and more preferably 1 nm or more and 10 nm or less. In order to achieve a tunnel junction between an N$^+$-type source region 18 (see FIGS. 3A and 3B) and a P-type well region 14 (see FIGS. 3A and 3B) with a first P$^+$-type region 30 interposed therebetween, the first P$^+$-type region 30 preferably has high Mg concentration and is thin. Configuring a first P$^+$-type region 30 to be formed of only a Mg concentration sustaining region and no Mg concentration decreasing region to be formed in the first P$^+$-type region 30 facilitates achieving a higher Mg concentration in the first P$^+$-type region 30.

Note that the Mg concentration decreasing region is a region that is not depleted because of being located apart from the N$^+$ implantation region (for example, an N$^+$-type source region 18) and in which the Fermi level Ef comes close to the valence band. In the Mg concentration decreasing region, the Mg concentration decreases because activation of Mg does not stabilize and Mg is likely to segregate as compared with the Mg concentration sustaining region. For example, in the Mg concentration decreasing region, the Mg concentration after activation decreases to around $3\times10^{18}$ cm$^{-3}$ because of deposition of Mg even when ions of Mg are implanted at the same concentration as the concentration in the Mg concentration sustaining region.

In order not to form a Mg concentration decreasing region, ion implantation energy of Mg is only required to be set in such a way that a Mg implantation region is contained within a depletion layer under an N$^+$-type source region 18. For example, when a depletion layer is formed in a range from a junction interface between an N$^+$-type source region 18 and a P-type well region 14 to a depth of 25 nm in the depth direction, ion implantation energy of Mg is only required to be set in such a way that Mg that is ion-implanted stays within the range. This configuration enables almost all Mg that is ion-implanted into a region under the N$^+$-type source region 18 to be activated in the depletion layer. Under the N$^+$-type source region 18, a Mg concentration sustaining region having a thickness of 1 nm or more and 25 nm or less is formed as a first P$^+$-type region 30, and formation of a Mg concentration decreasing region is suppressed.

Advantageous Effects of First Embodiment

As described above, the method for manufacturing the GaN semiconductor device 100 according to the first embodiment of the present invention includes a step of forming the N$^+$-type source regions 18 in the GaN substrate 10, a step of implanting ions of an acceptor element (for example, Mg) into regions each of which is located under an N$^+$-type source region 18 in the GaN substrate 10, and a step of, by subjecting the GaN substrate 10 in which the N$^+$-type source regions 18 are formed and into which ions of Mg are implanted to heat treatment and activating Mg, forming the first P$^+$-type regions 30 each of which is located under an N$^+$-type source region 18. In the step of forming the N$^+$-type source regions 18, ions of Si are implanted into the GaN substrate 10 at a high concentration in such a way that concentration of a donor element (for example, Si) in the N$^+$-type source regions 18 is a value equal to or greater than Mg concentration in the first P$^+$-type regions 30. In the step of implanting ions of Mg into regions located under the N$^+$-type source regions 18, ions of Mg are implanted in such a way that the Mg concentration in the first P$^+$-type regions 30 is $1 \times 10^{19}$ cm$^{-3}$ or more and $1 \times 10^{21}$ cm$^{-3}$ or less.

According to this method, an N$^+$-type source region 18 and a first P$^+$-type formation region 30' coming into contact with each other causes a depletion layer to be generated in the first P$^+$-type formation region 30', and the Fermi level of the depletion layer coincides with the Fermi level of the N$^+$-type source region 18. Since the N$^+$-type source regions 18 are of N$^+$-type, it is possible to prevent the Fermi levels of depletion layers generated in the first P$^+$-type formation regions 30' from coming close to the valence bands. Since, because of this capability, it is possible to maintain Mg acceptor formation energy low and facilitate activation of Mg in the first P$^+$-type formation regions 30', it is possible to suppress segregation of Mg due to heat treatment and suppress decrease in Mg concentration due to Mg segregation.

In addition, Si concentration in the N$^+$-type source regions 18 has a value equal to or greater than Mg concentration in the first P$^+$-type formation regions 30'. This configuration causes depletion layers to be widely formed in the first P$^+$-type formation regions 30' and highly concentrated first P$^+$-type regions 30 in which decrease in Mg concentration due to Mg segregation is suppressed to be formed. The highly concentrated first P$^+$-type regions 30 cause ohmic connections to be achieved between the N$^+$-type source regions 18 and the P-type well regions 14 by tunnel junctions.

The GaN semiconductor device 100 according to the first embodiment of the present invention includes the GaN substrate 10, the N$^+$-type source regions 18 formed on the front surface 10a side of the GaN substrate 10, and the first P$^+$-type regions 30 that are formed on the front surface 10a side of the GaN substrate 10 and each of which is located under an N$^+$-type source region 18. Si concentration in the N$^+$-type source regions 18 has a value equal to or greater than Mg concentration in the first P$^+$-type regions 30. Mg concentration in the first P$^+$-type region 30 is $1 \times 10^{19}$ cm$^{-3}$ or more and $1 \times 10^{21}$ cm$^{-3}$ or less. The GaN semiconductor device 100 having such a configuration can be manufactured by the above-described manufacturing method described in the first embodiment.

Second Embodiment

Configuration Example

Figure 10A:
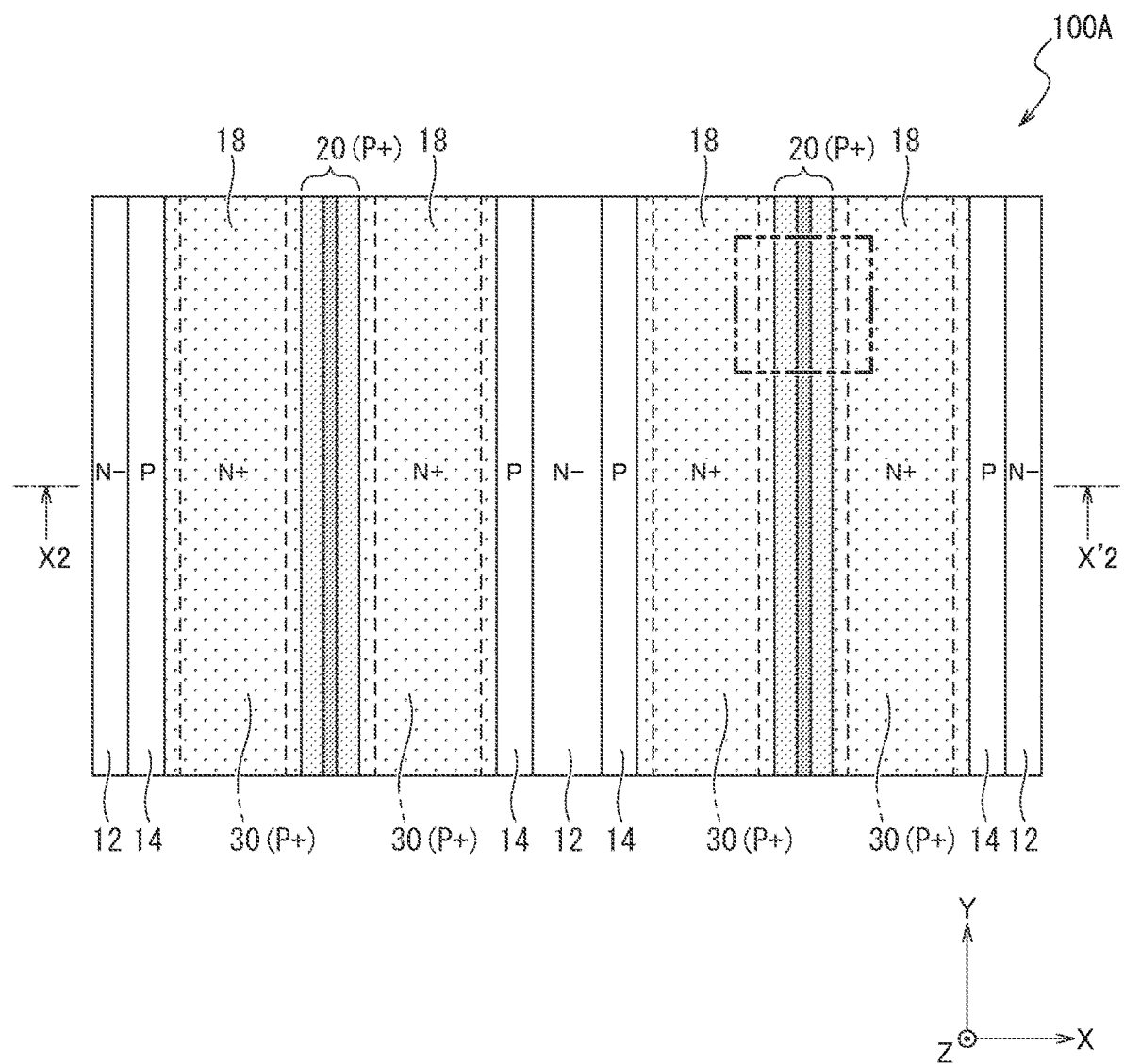
FIG. 10A is a plan view illustrative of a configuration example of a GaN semiconductor device according to a second embodiment of the present invention.
Figure 10B:
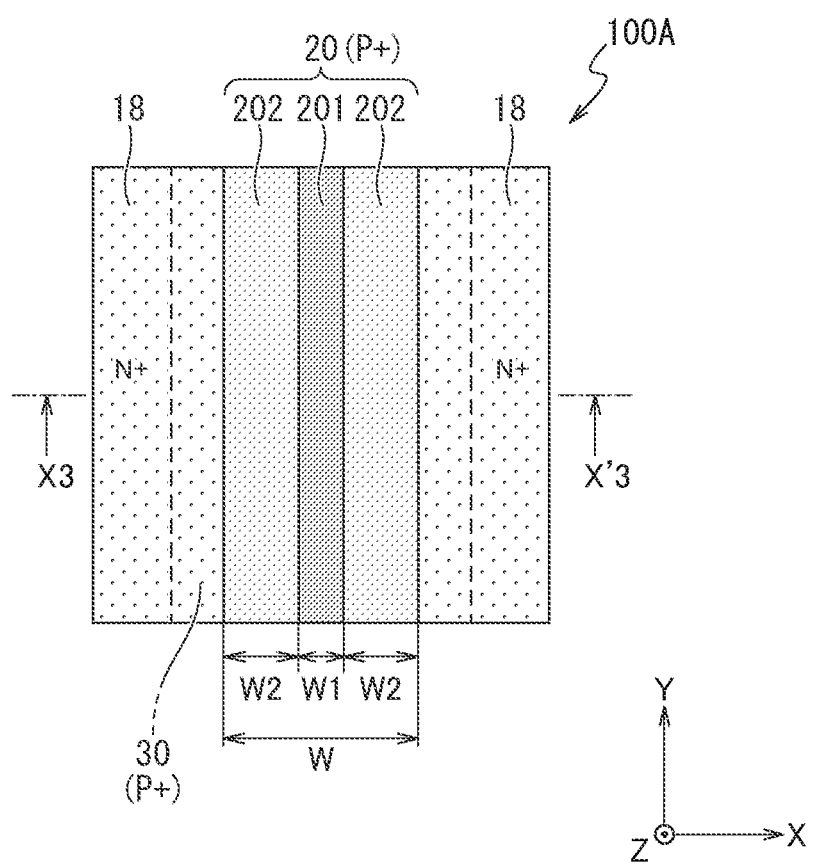
FIG. 10B is a plan view illustrative of a region enclosed by an alternate long and two short dashes line in the plan view in FIG. 10A in a further enlarged manner.

FIG. 10A is a plan view illustrative of a configuration example of a GaN semiconductor device 100A according to a second embodiment of the present invention. In FIG. 10A, as with FIG. 2 described in the first embodiment, in order to illustrate shapes of N$^+$-type source regions 18 and the like as viewed in plan from the Z-axis direction, illustrations of a gate pad 112 and a source pad 114 (see FIG. 1) and gate electrodes 23 and source electrodes 25 (see FIG. 11A) are omitted. FIG. 10B is a plan view illustrative of a region enclosed by an alternate long and two short dashes line in the plan view in FIG. 10A in a further enlarged manner.

Figure 11A:
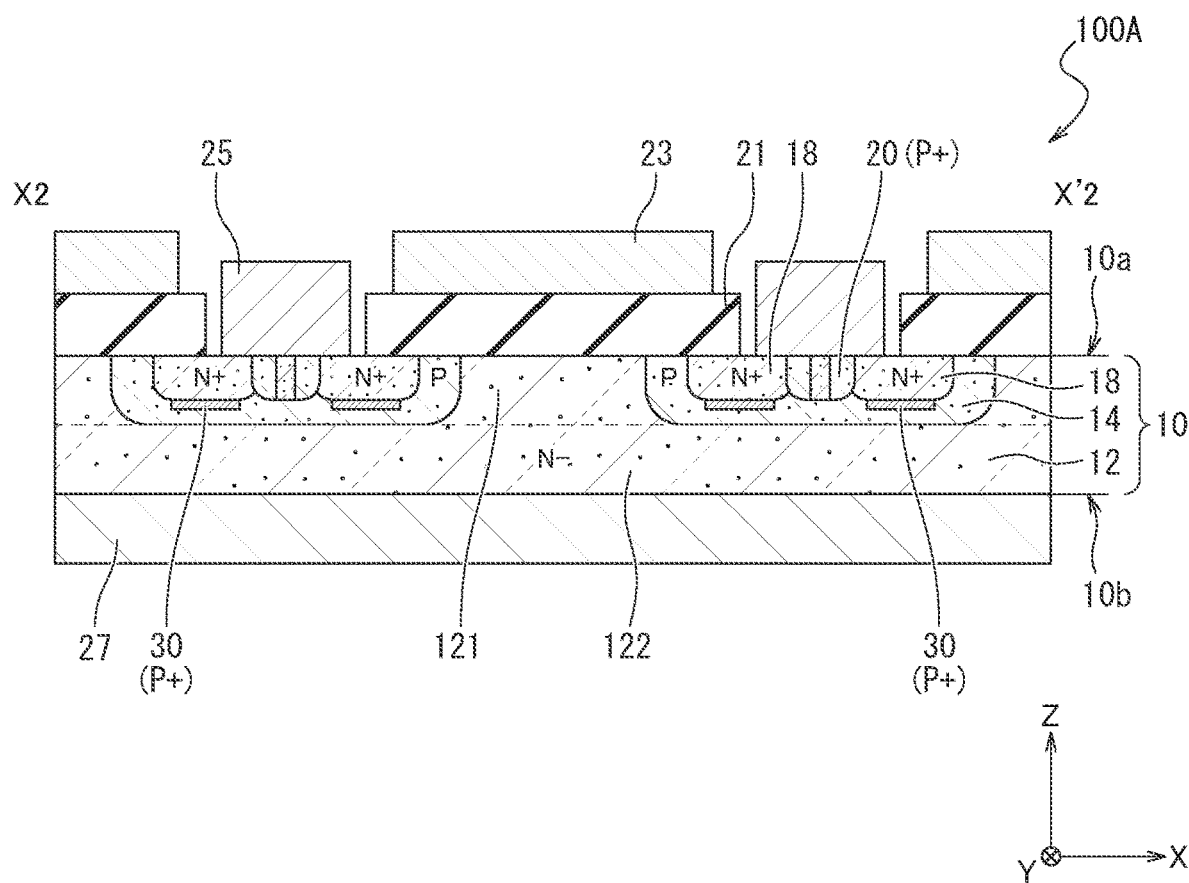
FIG. 11A is a cross-sectional view illustrative of the configuration example of the GaN semiconductor device according to the second embodiment of the present invention.
Figure 11B:
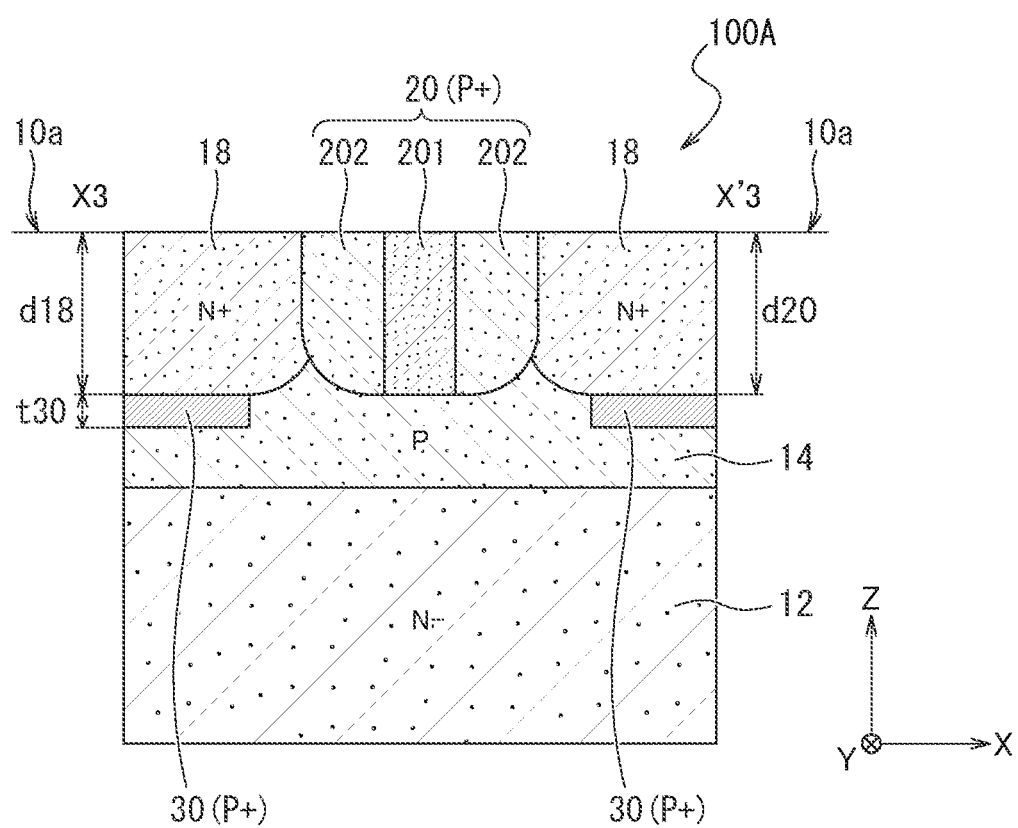
FIG. 11B is a cross-sectional view illustrative of a second P$^+$-type region and a peripheral region thereof in the cross-sectional view in FIG. 11A, in an enlarged manner.

FIG. 11A is a cross-sectional view illustrative of the configuration example of the GaN semiconductor device 100A according to the second embodiment of the present invention. FIG. 11A illustrates a cross-section of the plan view in FIG. 10A taken along the line X1-X'1 thereof. FIG. 11B is a cross-sectional view illustrative of a second P$^+$-type region 20 and a peripheral region thereof in the cross-sectional view in FIG. 11A, in an enlarged manner. FIG. 11B illustrates a cross-section of the plan view in FIG. 10B taken along the line X3-X'3 thereof.

As illustrated in FIGS. 10A and 11A, the GaN semiconductor device 100A includes, as constituent components of a vertical MOSFET, an N$^-$-type drift region 12, P-type well regions 14, N$^+$-type source regions 18, first P$^+$-type regions 30, and second P$^+$-type regions 20 (an example of a "second P-type region" of the present invention) that are formed in a GaN substrate 10, a gate insulating film 21 formed on a front surface 10a of the GaN substrate 10, a gate electrode 23 formed on the gate insulating film 21, source electrodes 25 that are formed on the front surface 10a side of the GaN substrate 10 and that are electrically connected to the N$^+$-type source regions 18 and the second P$^+$-type regions 20, and a drain electrode 27 that is formed on the back surface 10b side of the GaN substrate 10 and that is electrically connected to the drift region 12.

Respective configurations of the N$^-$-type drift region 12, the P-type well regions 14, the N$^+$-type source regions 18, the first P$^+$-type regions 30, the gate insulating film 21, the gate electrode 23, the source electrodes 25, and the drain electrode 27 are the same as those in the first embodiment.

The second P$^+$-type regions 20 are formed in the GaN substrate 10. The second P$^+$-type regions 20 are regions where ions of impurities are implanted to a predetermined depth from the front surface 10a of the GaN substrate 10 and the impurities are activated by heat treatment.

For example, each of the second P$^+$-type regions 20 is formed on the front surface side of a P-type well region 14 and is in contact with the well region 14. The second P$^+$-type regions 20 contain at least one of Mg and Be as an acceptor element. The second P$^+$-type regions 20 have a higher P-type impurity concentration than the well regions 14.

To cite an example, the second P$^+$-type regions 20 contain Mg as an acceptor element. Mg concentration in the well regions 14 is $1 \times 10^{16}$ cm$^{-3}$ or more and $3 \times 10^{18}$ cm$^{-3}$ or less. Mg concentration in at least a portion (for example, a second region 202, which will be described later) of a second P$^+$-type region 20 is $1 \times 10^{19}$ cm$^{-3}$ or more and $1 \times 10^{21}$ cm$^{-3}$ or less.

Each of the N$^+$-type source regions 18 has one side portion in the X-axis direction and the other side portion that is located on the opposite side to the one side portion in the X-axis direction. The one side portion of each of the N$^+$-type source regions 18 is in contact with one of the well regions 14, and the other side portion of the N$^+$-type source region 18 is in contact with one of the second P$^+$-type regions 20. The one side portion of the N$^+$-type source region 18 is located on the channel region side. In addition, a portion of the bottom portion of the N$^+$-type source region 18 is in contact with a first P$^+$-type region 30.

The second P$^+$-type regions 20 are exposed on the front surface 10a of the GaN substrate 10. Each of the second P+-type regions 20 has both side portions in the X-axis direction in contact with N+-type source regions 18 and the bottom portion in contact with a well region 14. The well regions 14, the N+-type source regions 18, the first P+-type regions 30, and the second P+-type regions 20 have, for example, stripe shapes extending in the Y-axis direction.

Each of the second P+-type regions 20 is a region for establishing contact between one of the well regions 14 and an electrode (for example, a source electrode 25). The second P+-type regions 20 also function as hole extraction paths at the time of gate-off.

As illustrated in FIGS. 10B and 11B, each of the second P+-type regions 20 includes a first region 201 and second regions 202 located on both sides in the X-axis direction of the first region 201. Each of the second regions 202 is located between the first region 201 and an N+-type source region 18 and is respectively in contact with the first region 201 and the N+-type source region 18. Among the constituent regions of the second P+-type region 20, the second regions 202 are in contact with the N+-type source regions 18. When length in the X-axis direction (that is, width) of the second P+-type region 20, width of the first region 201, and width of each of the second regions 202 are denoted by W, W1, and W2, respectively, a relationship W=W1+W2×2 holds. W is, for example, 50 nm or more and 500 nm or less. W1 is 0 nm or more and 498 nm or less. W2 is, for example, 1 nm or more and 25 nm or less.

Since each of the second P+-type regions 20 is sandwiched by N+-type source regions 18 on both sides, the width W of the second P+-type region 20 may be rephrased by an interval between the N+-type source regions 18. That is, the above-described width W may be rephrased by an interval between portions of the N+-type source regions 18, the portions sandwiching the second P+-type region 20 on both sides.

In each the second P+-type regions 20, density of Mg segregation in the second regions 202 is lower than density of Mg segregation in the first region 201. For example, density of rod-like acceptor segregation in the second regions 202 is $1\times10^{14}$ cm$^{-3}$ or less, and density of non-rod-like acceptor segregation in the second regions 202 is less than $1\times10^{15}$ cm$^{-3}$. Density of rod-like acceptor segregation and density of non-rod-like acceptor segregation in the first region 201 are higher than the respective densities in the second regions 202.

These features are achieved by forming N+-type source regions 18 in adjacency to P+-type formation regions 20' (see FIG. 12D) in advance when Mg that has been ion-implanted into the P+-type formation regions 20' is activated by heat treatment, as described later. Forming N+-type source regions 18 in contact with a P+-type formation region 20' causes depletion layers to be formed in side portions (regions equivalent to the second regions 202) of the P+-type formation region 20' and the Fermi level of the depletion layers to be prevented from coming close to the valence band (more preferably, causes the Fermi level to be brought close to the conduction band). This configuration causes Mg segregation in the second regions 202 to be suppressed.

Segregation of Mg being suppressed causes formation of a P+-type region having high concentration and small variation in concentration to be achieved. In each of the second P+-type regions 20, depletion layers extending from the N+-type source regions 18 causes segregation of Mg in the second regions 202 to be more suppressed than in the first region 201 and Mg concentration in the second regions 202 to be higher than that in the first region 201. For example, Mg concentration in the second regions 202 is $1\times10^{9}$ cm$^{-3}$ or more and $1\times10^{21}$ cm$^{-3}$ or less. Mg concentration in the first region 201 is lower than the Mg concentration in the second regions 202 and is reduced to around $3\times10^{18}$ cm$^{-3}$.

In addition, concentration of a donor element (for example, Si) in the N+-type source regions 18 has a higher value than the Mg concentration in the second regions 202. These features cause the depletion layers to easily extend widely from the N+-type source regions 18 to the second region 202 sides and the second regions 202 that have high Mg concentration to be easily formed widely.

Since the second regions 202 have high Mg concentration and small variation in the Mg concentration, it is possible to achieve an ohmic contact between the second P+-type region 20 and a source electrode 25.

Note that, as illustrated in FIG. 11B, depth d18 of each of the N+-type source regions 18 from the front surface 10a and depth d20 of each of the second P+-type regions 20 from the front surface 10a are preferably the same depth as each other. For example, the depth d18 of the N+-type source regions 18 and the depth d20 of the second P+-type regions 20 are respectively 1 nm or more and 500 nm or less and, for example, have a value in a range from several nm to several tens of nm. A difference between the depth d18 of the N+-type source regions 18 and the depth d20 of the second P+-type regions 20 is preferably equal to or less than 50 nm (|d18–d20|≤50 nm). The reason for the restriction on the difference is that, when a second P+-type region 20 is shallower than N+-type source regions 18, a lower portion of the second P+-type region 20 is depleted and connection resistance between the second P+-type region 20 and a P-type well region 14 is caused to increase. The reason is also that, since, when a second P+-type region 20 is deeper than N+-type source regions 18, a portion of the second P+-type region 20 deeper than the N+-type source regions 18 is located away from the N+-type source regions 18, a depletion layer is unlikely to extend and Mg in the deeper portion becomes unlikely to be activated.

(Manufacturing Method)

Next, a method for manufacturing the GaN semiconductor device 100A according to the second embodiment of the present invention will be described. FIGS. 12A to 12F are cross-sectional views illustrative of the method for manufacturing the GaN semiconductor device 100A according to the second embodiment of the present invention in the sequence of steps. The GaN semiconductor device 100A according to the second embodiment is, as with the GaN semiconductor device 100 according to the first embodiment, manufactured using various types of manufacturing apparatuses, such as a film forming apparatus, an exposure apparatus, an etching apparatus, an ion implantation apparatus, and a heat treatment apparatus.

Figure 12A:
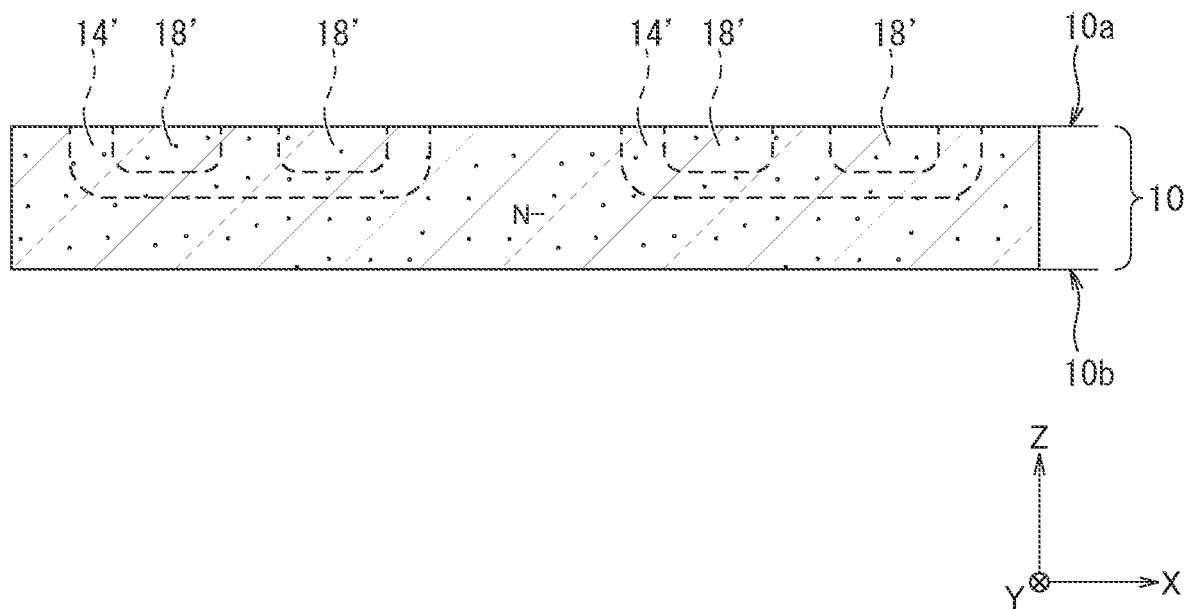
FIG. 12A is a cross-sectional view illustrative of a method for manufacturing the GaN semiconductor device according to the second embodiment of the present invention in the sequence of steps.

First, the manufacturing apparatus performs ion implantation for forming the well regions 14 (see FIG. 11A). For example, as illustrated in FIG. 12A, the manufacturing apparatus forms a mask (not illustrated) in which portions over well formation regions 14' are opened and that covers the upper parts of the other regions, on the GaN substrate 10 and implants, as an acceptor element, ions of Mg into the GaN substrate 10 on which the mask is formed. The mask is, for example, a resist pattern. After the ion implantation, the manufacturing apparatus removes the mask from the top of the GaN substrate 10.

In the ion implantation step for forming the well regions 14, Mg implantation energy (acceleration voltage) is set in such a way that the well regions 14 are formed to a deeper depth from the front surface 10a of the GaN substrate 10 than each of the N+-type source regions 18, the first P+-type regions 30, and the second P$^+$-type regions 20 illustrated in FIG. 11A. The ion implantation step may be performed by one-step ion implantation in which acceleration energy is applied in accordance with one condition or multi-step ion implantation in which acceleration energy is applied in accordance with a plurality of conditions. In addition, in the ion implantation step, a dose amount of Mg is set in such a way that Mg concentration in the well regions 14 is $1\times10^{16}$ cm$^{-3}$ or more and $3\times10^{18}$ cm$^{-3}$ or less.

Next, the manufacturing apparatus performs ion implantation for forming the N$^+$-type source regions 18. For example, the manufacturing apparatus forms a mask (not illustrated) in which portions over source formation regions 18' are opened and that covers the upper parts of the other regions, on the GaN substrate 10 and implants, as a donor element, ions of Si into the GaN substrate 10 on which the mask is formed. The mask is, for example, a resist pattern. After the ion implantation, the manufacturing apparatus removes the mask from the top of the GaN substrate 10.

In the ion implantation step for forming the N$^+$-type source regions 18, Si implantation energy (acceleration voltage) is set in such a way that the depth d18 of the N$^+$-type source regions 18 (see FIG. 11B) is 1 nm or more and 500 nm or less. In the ion implantation step, the Si implantation energy (acceleration voltage) is preferably set in such a way that the depth d18 of the N$^+$-type source regions 18 is the same depth as the depth d20 of the second P$^+$-type regions 20.

In addition, in the ion implantation step for forming the N$^+$-type source regions 18, a dose amount of Si is set in such a way that Si concentration in the N$^+$-type source regions 18 has a value equal to or greater than Mg concentration in each of the first P$^+$-type regions 30 and the second P$^+$-type regions 20. For example, the dose amount of Si is set in such a way that Si concentration in the N$^+$-type source regions 18 is $1\times10^{19}$ cm$^{-3}$ or more and $1\times10^{22}$ cm$^{-3}$ or less.

Figure 12B:
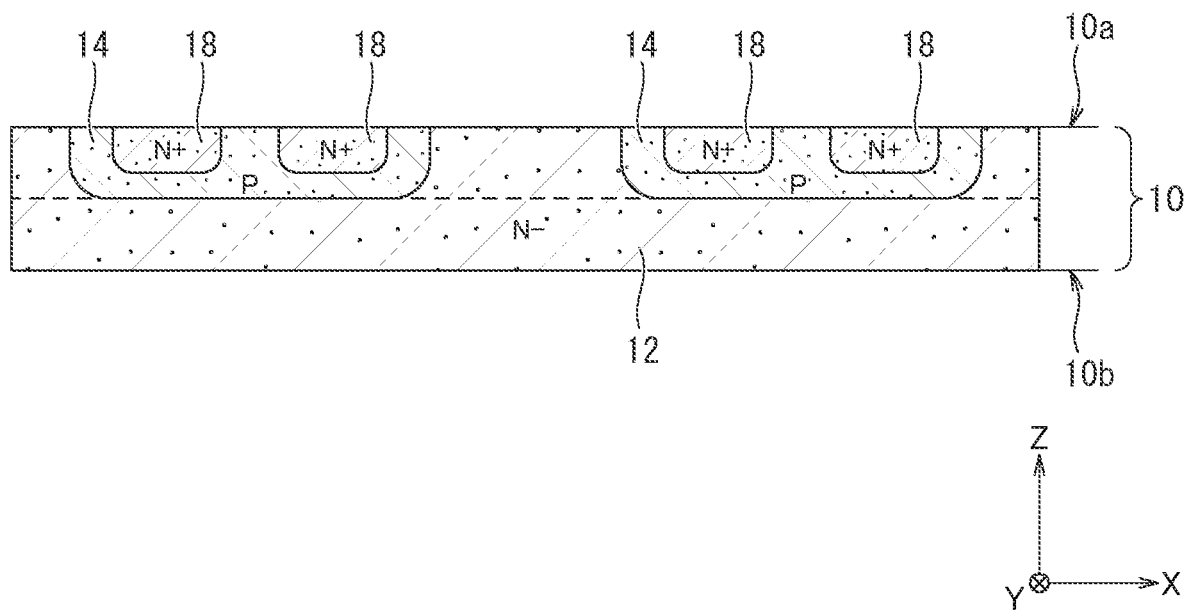
FIG. 12B is another cross-sectional view illustrative of the method for manufacturing the GaN semiconductor device according to the second embodiment of the present invention in the sequence of steps.

Next, the manufacturing apparatus subjects the GaN substrate 10 to heat treatment the maximum temperature of which is equal to or less than 1200° C. This heat treatment is, for example, rapid heat treatment. This heat treatment causes Mg and Si, which are ion-implanted into the GaN substrate 10, to be activated, and, as illustrated in FIG. 12B, the P-type well regions 14 and the N$^+$-type source regions 18 to be formed and, at the same time, the drift region 12 to be defined in the GaN substrate 10. In addition, this heat treatment enables defects induced by the ion implantation of Mg and Si to be repaired to some extent in the GaN substrate 10. Note that this heat treatment may be performed with a protective film formed on the GaN substrate 10. As the protective film, for example, aluminum nitride (AlN) or silicon nitride (SiN) may be used. The protective film is removed after the heat treatment.

Figure 12C:
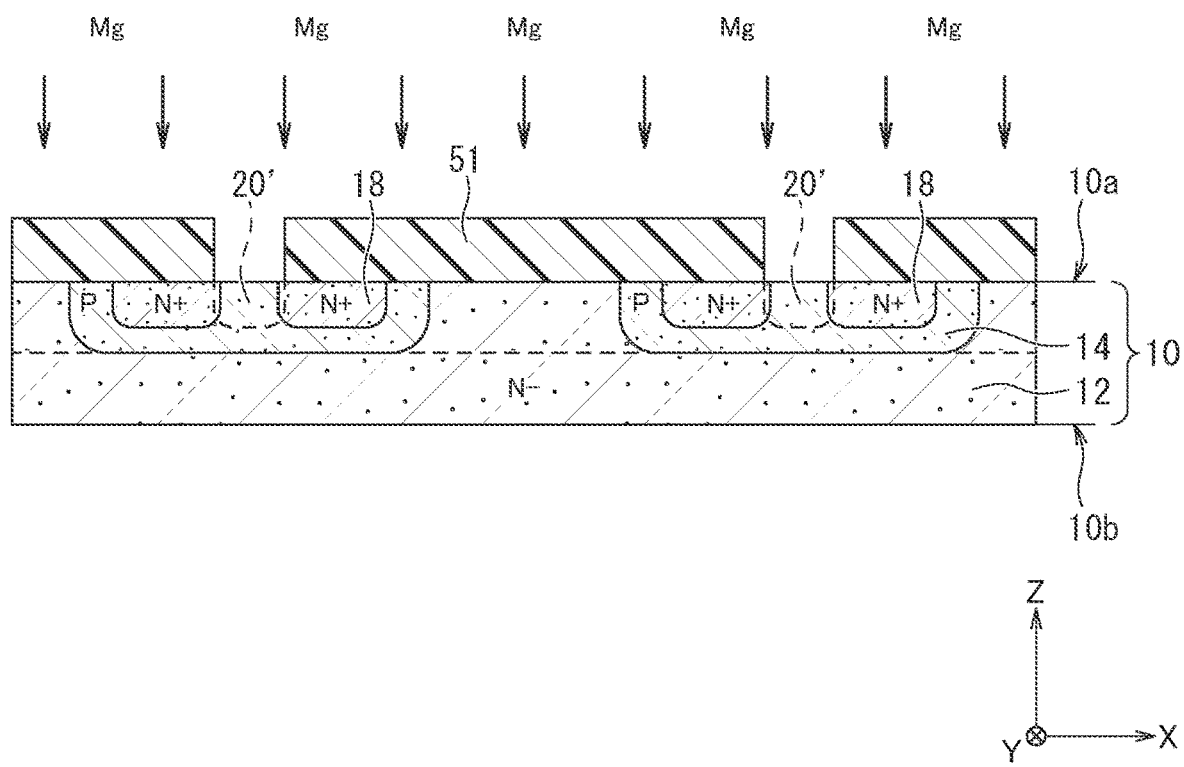
FIG. 12C is still another cross-sectional view illustrative of the method for manufacturing the GaN semiconductor device according to the second embodiment of the present invention in the sequence of steps.

Next, as illustrated in FIG. 12C, the manufacturing apparatus forms a mask 51 in which portions over regions (hereinafter, referred to as second P$^+$-type formation regions) 20' in which the second P$^+$-type regions 20 (see FIG. 11A) are to be formed are opened and that covers the upper parts of the other regions, on the GaN substrate 10. The mask 51 is, for example, a resist pattern. As illustrated in FIG. 12C, the second P$^+$-type formation regions 20' may be set in such a way that portions of each of the second P$^+$-type formation regions 20' overlap adjacent N$^+$-type source regions 18. Next, the manufacturing apparatus implants ions of Mg into the GaN substrate 10 on which the mask 51 is formed, as an acceptor element. After the ion implantation, the manufacturing apparatus removes the mask 51 from the top of the GaN substrate 10.

In the ion implantation step for forming the second P$^+$-type regions 20, Mg implantation energy (acceleration voltage) is set in such a way that the depth d20 of the second P$^+$-type regions 20 (see FIG. 11B) is 1 nm or more and 500 nm or less. In the ion implantation step, the Mg implantation energy (acceleration voltage) is preferably set in such a way that the depth d20 of the second P$^+$-type regions 20 is the same depth as the depth d18 of the N$^+$-type source regions 18 (see FIG. 11B).

In addition, in the ion implantation step for forming the second P$^+$-type regions 20, a dose amount of Mg is set in such a way that Mg concentration in the second P$^+$-type regions 20 has a value equal to or less than Si concentration in the N$^+$-type source regions 18. For example, the dose amount of Mg is set in such a way that Mg concentration in the second P$^+$-type regions 20 is $1\times10^{19}$ cm$^{-3}$ or more and $1\times10^{21}$ cm$^{-3}$ or less.

Figure 12D:
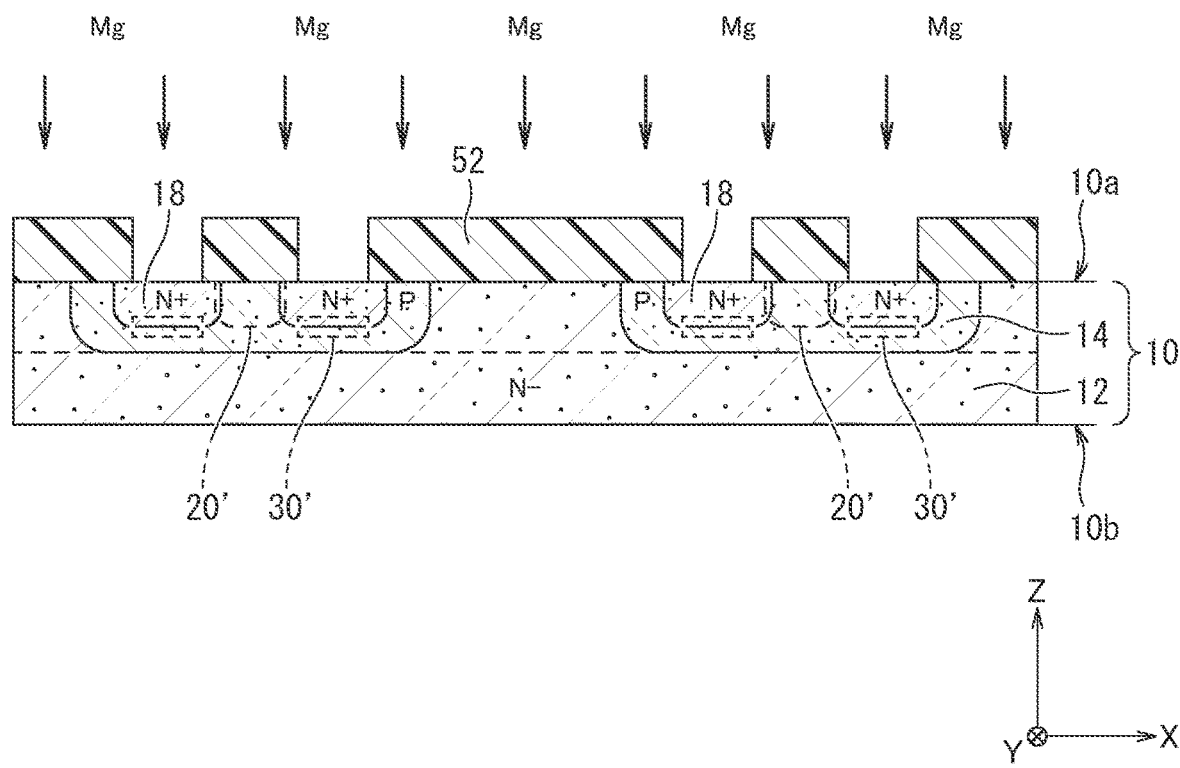
FIG. 12D is still another cross-sectional view illustrative of the method for manufacturing the GaN semiconductor device according to the second embodiment of the present invention in the sequence of steps.

Next, as illustrated in FIG. 12D, the manufacturing apparatus forms a mask 52 in which portions over regions (hereinafter, referred to as first P$^+$-type formation regions) 30' in which the first P$^+$-type regions 30 (see FIG. 11A) are to be formed are opened and that covers the upper parts of the other regions, on the GaN substrate 10. The mask 52 is, for example, a resist pattern.

As illustrated in FIG. 4B, the first P$^+$-type formation regions 30' may be set in such a way that a portion of each of the first P$^+$-type formation regions 30' overlaps an N$^+$-type source region 18. In this case, a depletion layer is formed in a region that is a portion of each of the first P$^+$-type formation regions 30' and that is located under an N$^+$-type source region 18 (that is, a region that does not overlap an N$^+$-type source region 18), and a first P$^+$-type region 30 is formed in the region in which the depletion layer is formed.

Next, the manufacturing apparatus implants ions of Mg into the GaN substrate 10 on which the mask 52 is formed, as an acceptor element. After the ion implantation, the manufacturing apparatus removes the mask 52 from the top of the GaN substrate 10.

In the ion implantation step for forming the first P$^+$-type regions 30, Mg implantation energy (acceleration voltage) is set in such a way that the first P$^+$-type regions 30 are formed under the N$^+$-type source regions 18. That is, in the ion implantation step for forming the first P$^+$-type regions 30, Mg implantation energy (acceleration voltage) is set in such a way that Mg is implanted into regions the depth of which from the front surface 10a of the GaN substrate 10 is deeper than the bottom portions of the N$^+$-type source regions 18 and in which depletion layers are formed by contact with the N$^+$-type source regions 18.

In addition, in the ion implantation step for forming the first P$^+$-type regions 30, a dose amount of Mg is set in such a way that Mg concentration in the first P$^+$-type regions 30 has a value equal to or less than Si concentration in the N$^+$-type source regions 18. For example, the dose amount of Mg is set in such a way that Mg concentration in the first P$^+$-type regions 30 is $1\times10^{19}$ cm$^{-3}$ or more and $1\times10^{21}$ cm$^{-3}$ or less.

Note that, in the second embodiment, positions in the execution sequence may be replaced with each other between the ion implantation step illustrated in FIG. 12C and the ion implantation step illustrated in FIG. 12D. That is, the ion implantation step for forming the first P$^+$-type regions 30 may be first performed and the ion implantation step for forming the second P$^+$-type regions 20 may be subsequently performed.

Figure 12E:
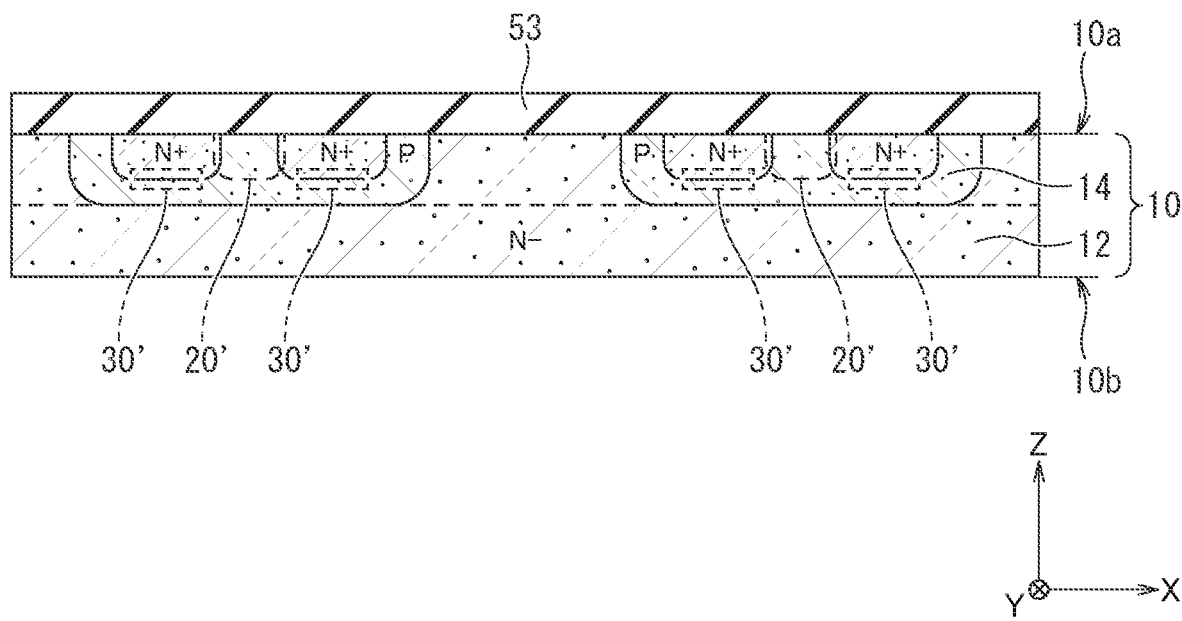
FIG. 12E is still another cross-sectional view illustrative of the method for manufacturing the GaN semiconductor device according to the second embodiment of the present invention in the sequence of steps.

Next, as illustrated in FIG. 12E, the manufacturing apparatus forms a protective film 53 on the GaN substrate 10. The protective film 53 is, for example, AlN or SiN.

Figure 12F:
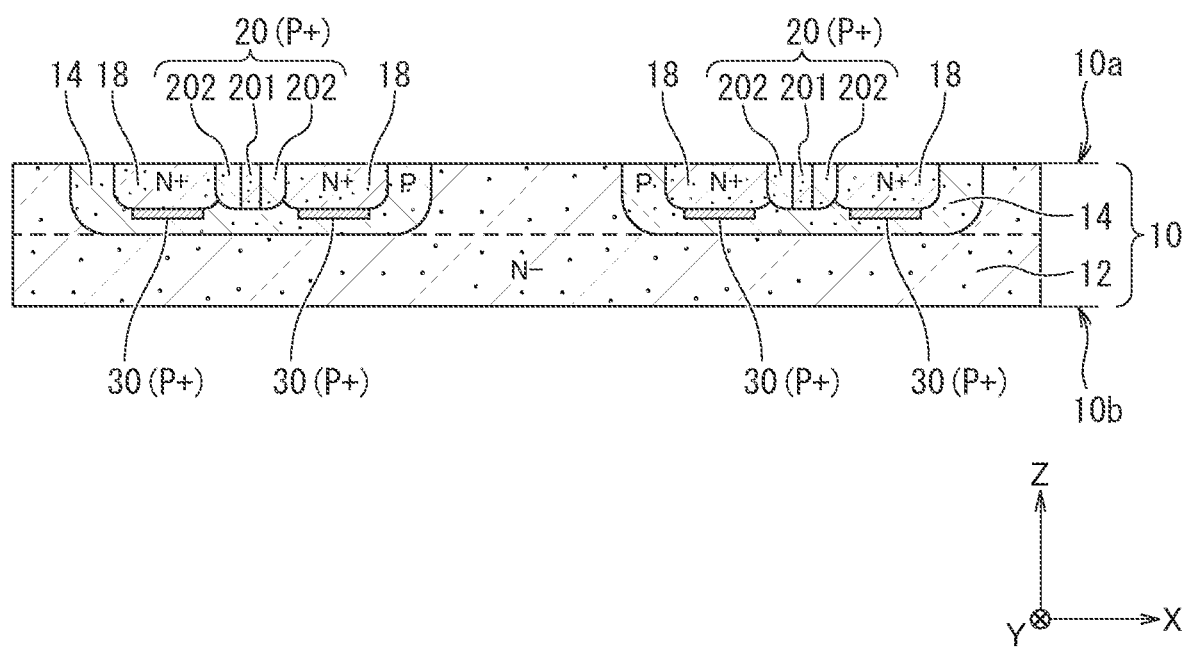
FIG. 12F is still another cross-sectional view illustrative of the method for manufacturing the GaN semiconductor device according to the second embodiment of the present invention in the sequence of steps.

Next, the manufacturing apparatus subjects the GaN substrate 10 covered by the protective film 53 to heat treatment the maximum temperature of which is 1300° C. or more and 2000° C. or less. This heat treatment is, for example, rapid heat treatment. This heat treatment causes Mg, which is ion-implanted into the GaN substrate 10, to be activated and, as illustrated in FIG. 12F, the first $P^+$-type regions 30 and the second $P^+$-type regions 20 to be formed in the GaN substrate 10. In addition, this heat treatment enables defects induced by the ion implantation of Mg to be repaired to some extent in the GaN substrate 10. After the heat treatment, the manufacturing apparatus removes the protective film 53 from the front surface 10a of the GaN substrate 10.

Next, as illustrated in FIG. 11A, the manufacturing apparatus forms the gate insulating films 21 on the GaN substrate 10. Next, the manufacturing apparatus forms the gate electrodes 23 and the source electrodes 25. Next, the manufacturing apparatus forms an interlayer insulating film (not illustrated) on the front surface 10a of the GaN substrate 10 in such a way that the gate electrodes 23 and the source electrodes 25 are covered by the interlayer insulating film. Next, the manufacturing apparatus forms the gate pad 112 (see FIG. 1) that is electrically connected to the gate electrodes 23 and the source pad 114 (see FIG. 1) that is electrically connected to the source electrodes 25. Subsequently, the manufacturing apparatus forms the drain electrode 27 on the back surface 10b of the GaN substrate 10. Through the above-described steps, the GaN semiconductor device 100A including the vertical MOSFETs (see FIG. 11A) is completed.

(Profiles of Mg and Si)

Figure 13:
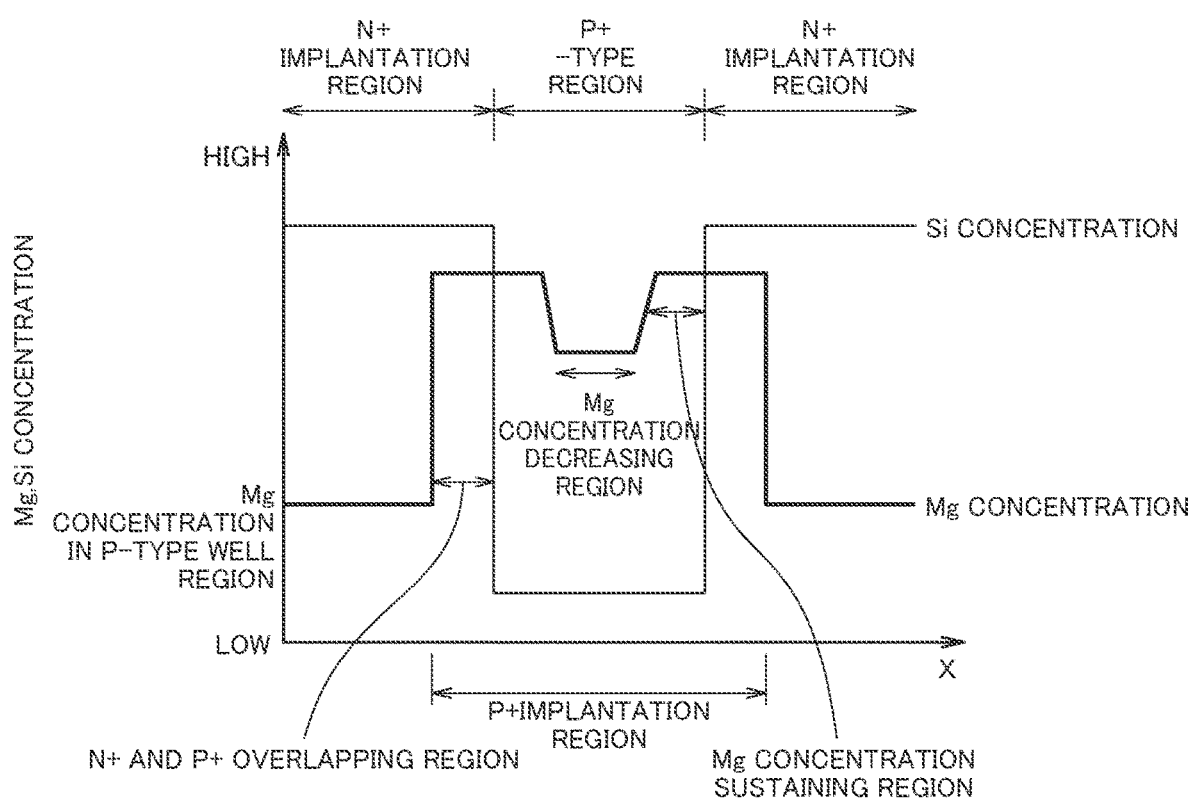
FIG. 13 is a graph illustrative of examples of concentration profiles of Mg and Si in the X-axis direction of GaN.

FIG. 13 is a graph illustrative of examples of concentration profiles of Mg and Si in the X-axis direction of GaN. The abscissa in FIG. 13 represents the X-axis direction, and the ordinate in FIG. 13 represents concentration of Mg or Si. In FIG. 13, for example, an $N^+$ implantation region is equivalent to a source formation region 18' (see FIG. 12A), and a $P^+$ implantation region is equivalent to a second $P^+$-type formation region 20' (see FIG. 12C). In addition, an $N^+$ and $P^+$ overlapping region is equivalent to an overlapping region between a source formation region 18' and a second $P^+$-type formation region 20'. Since concentration of Si that is implanted into an $N^+$ implantation region is higher than concentration of Mg that is implanted into a $P^+$ implantation region, the conductivity type of an overlapping region between a source formation region 18' and a second $P^+$-type formation region 20' is the N-type. In addition, in FIG. 13, for example, a Mg concentration decreasing region is equivalent to a first region 201 (see FIG. 11B), and a Mg concentration sustaining region is equivalent to a second region 202 (see FIG. 11B). Mg concentration sustaining regions are located on both sides of a Mg concentration decreasing region.

A Mg concentration sustaining region is depleted by contact with an activated $N^+$ implantation region (for example, an $N^+$-type source region 18) and is controlled in such a way that the Fermi level Ef does not come close to the valence band. Since this configuration enables activation of Mg to be stabilized and segregation of Mg to be suppressed in the Mg concentration sustaining region, the Mg concentration in the Mg concentration sustaining region is maintained high.

Width of a Mg concentration sustaining region is 1 nm or more and 25 nm or less as described above and is, for example, 25 nm. In addition, width of an interval between the $N^+$ implantation regions (that is, the $P^+$ region) is, for example, 50 nm or more and 500 nm or less, and preferably equal to or less than 100 nm. When the interval between the $N^+$ implantation regions is narrowed, an area ratio of the Mg concentration sustaining region to the $P^+$ region can be increased.

Advantageous Effects of Second Embodiment

As described in the foregoing, the method for manufacturing the GaN semiconductor device 100A according to the second embodiment of the present invention further includes a step of implanting ions of Mg into a region sandwiched by $N^+$-type source regions 18 on both sides. In the step of forming the first $P^+$-type regions 30, by subjecting the GaN substrate 10 in which the $N^+$-type source regions 18 are formed and ions of Mg are implanted into regions each of which is located under an $N^+$-type source region 18 and regions each of which is sandwiched by $N^+$-type source regions 18 on both sides to heat treatment and activating Mg, the first $P^+$-type regions 30 each of which is located under an $N^+$-type source region 18 and the second $P^+$-type regions 20 each of which is sandwiched by $N^+$-type source regions 18 on both sides are formed. In the step of forming the $N^+$-type source regions 18, ions of a donor element are implanted into the GaN substrate 10 at a high concentration in such a way that concentration of the donor element in the $N^+$-type source regions 18 is equal to or greater than Mg concentration in each of the first $P^+$-type regions 30 and the second $P^+$-type regions 20. In the step of implanting ions of Mg into regions each of which is sandwiched by $N^+$-type source regions 18, ions of Mg are implanted in such a way that the Mg concentration in the second $P^+$-type regions 20 is $1\times10^{19}$ cm$^{-3}$ or more and $1\times10^{21}$ cm$^{-3}$ or less.

This processing, as with the first embodiment, enables the highly concentrated first $P^+$-type regions 30 in which decrease in Mg concentration due to Mg segregation is suppressed to be formed. The highly concentrated first $P^+$-type regions 30 cause ohmic connections to be achieved between the $N^+$-type source regions 18 and the P-type well regions 14 by tunnel junctions.

In addition, $N^+$-type source regions 18 and a second $P^+$-type formation region 20' coming into contact with each other causes depletion layers to be generated in both side portions of the second $P^+$-type formation region 20', and the Fermi levels of the both side portions coincide with the Fermi level of the $N^+$-type source regions 18. Since the $N^+$-type source regions 18 are of $N^+$-type, it is possible to prevent the Fermi levels of depletion layers generated in both side portions of the second $P^+$-type formation region 20' from coming close to the valence bands. Since, because of this capability, it is possible to maintain Mg acceptor formation energy low and facilitate activation of Mg in both side portions of the second $P^+$-type formation region 20', it is possible to suppress segregation of Mg due to heat treatment and suppress decrease in Mg concentration due to Mg segregation.

In addition, Si concentration in the $N^+$-type source regions 18 has a value equal to or greater than Mg concentration in the second $P^+$-type formation regions 20'. This configuration causes depletion layers to be widely formed and second regions 202 in which decrease in Mg concentration due to Mg segregation is suppressed to be widely formed in both side portions of a second $P^+$-type formation region 20'. This formation enables a highly concentrated $P^+$-type region 20 including second regions 202 to be formed.

In addition, joining a source electrode 25 to such a second P+-type region 20 enables a source contact with excellent ohmic characteristics to be achieved. The highly concentrated first P+-type regions 30 and second P+-type regions 20 enable ohmic characteristics of connections between the source electrodes 25 and the P-type well regions 14 to be further improved.

The GaN semiconductor device 100A according to the second embodiment of the present invention further includes the second P+-type regions 20 that are formed on the front surface 10a side of the GaN substrate 10 and each of which is sandwiched by N+-type source regions 18 on both sides.

Mg concentration in at least a portion (for example, the second regions 202) of a second P+-type region 20 is $1 \times 10^{19}$ cm$^{-3}$ or more and $1 \times 10^{21}$ cm$^{-3}$ or less. The GaN semiconductor device 100A having such a configuration can be manufactured by the above-described manufacturing method described in the second embodiment.

Third Embodiment

In the above-described second embodiment, a configuration in which each of the first P+-type regions 30 is arranged under N+-type source regions 18 and not arranged under a second P+-type regions 20 was described. However, in an embodiment of the present invention, a first P+-type region 30 may be arranged under not only an N+-type source region 18 but also a second P+-type region 20.

Figure 14:
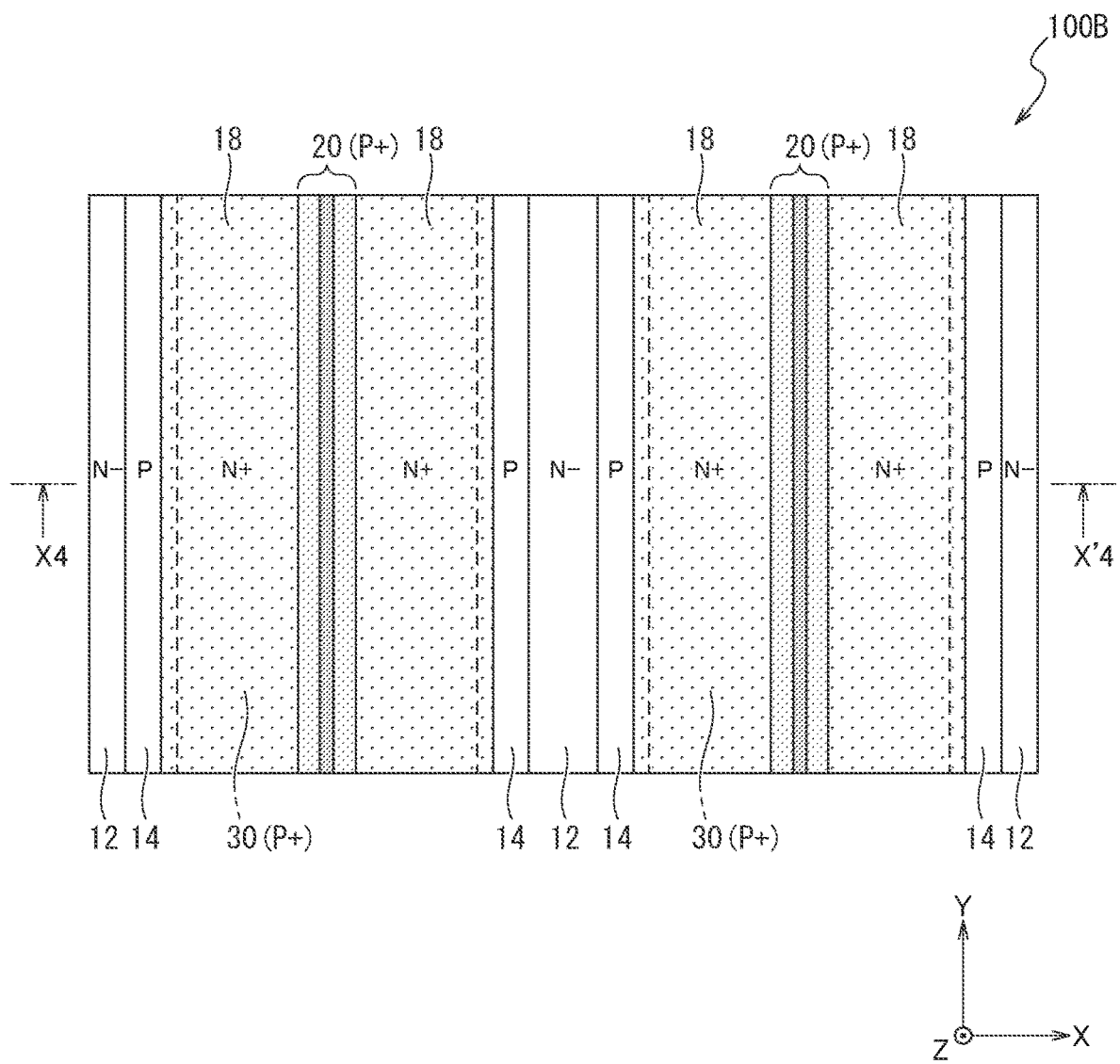
FIG. 14 is a plan view illustrative of a configuration example of a GaN semiconductor device according to a third embodiment of the present invention.
Figure 15:
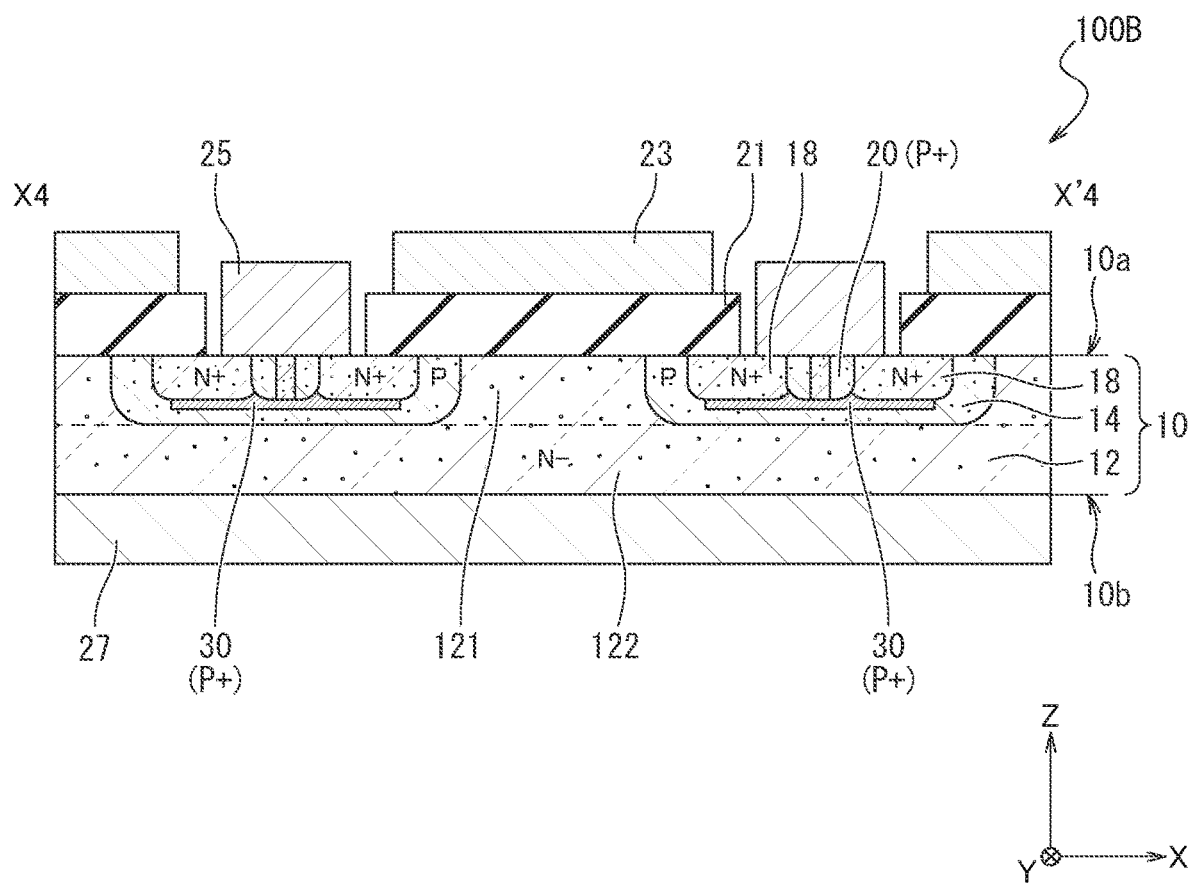
FIG. 15 is a cross-sectional view illustrative of the configuration example of the GaN semiconductor device according to the third embodiment of the present invention.

FIG. 14 is a plan view illustrative of a configuration example of a GaN semiconductor device 100B according to a third embodiment of the present invention. FIG. 15 is a cross-sectional view illustrative of the configuration of the GaN semiconductor device 100B according to the third embodiment of the present invention. FIG. 15 illustrates a cross-section of the plan view in FIG. 14 taken along the line X4-X'4 thereof.

As illustrated in FIGS. 14 and 15, in the GaN semiconductor device 100B according to the third embodiment, each first P+-type region 30 is arranged under not only N+-type source regions 18 but also a second P+-type region 20. Each of the first P+-type regions 30 is formed across a region extending from a region under one of a pair of N+-type source regions 18 to a region under the other of the pair of N+-type source regions 18 in a P-type well region 14 in a continuous manner.

Figure 16A:
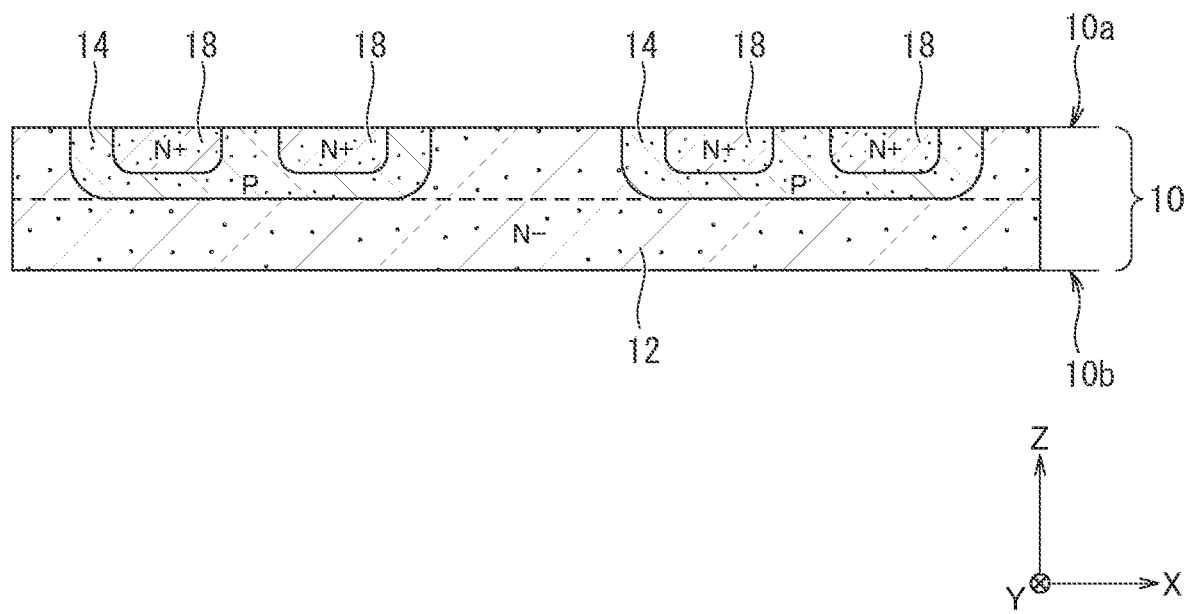
FIG. 16A is a cross-sectional view illustrative of a method for manufacturing the GaN semiconductor device according to the third embodiment of the present invention in the sequence of steps.

FIGS. 16A to 16D are cross-sectional views illustrative of a method for manufacturing the GaN semiconductor device 100B according to the third embodiment of the present invention in the sequence of steps. As illustrated in FIG. 16A, a manufacturing apparatus forms the P-type well regions 14 and the N+-type source regions 18 in a GaN substrate 10, using a similar method to that in the second embodiment.

Figure 16B:
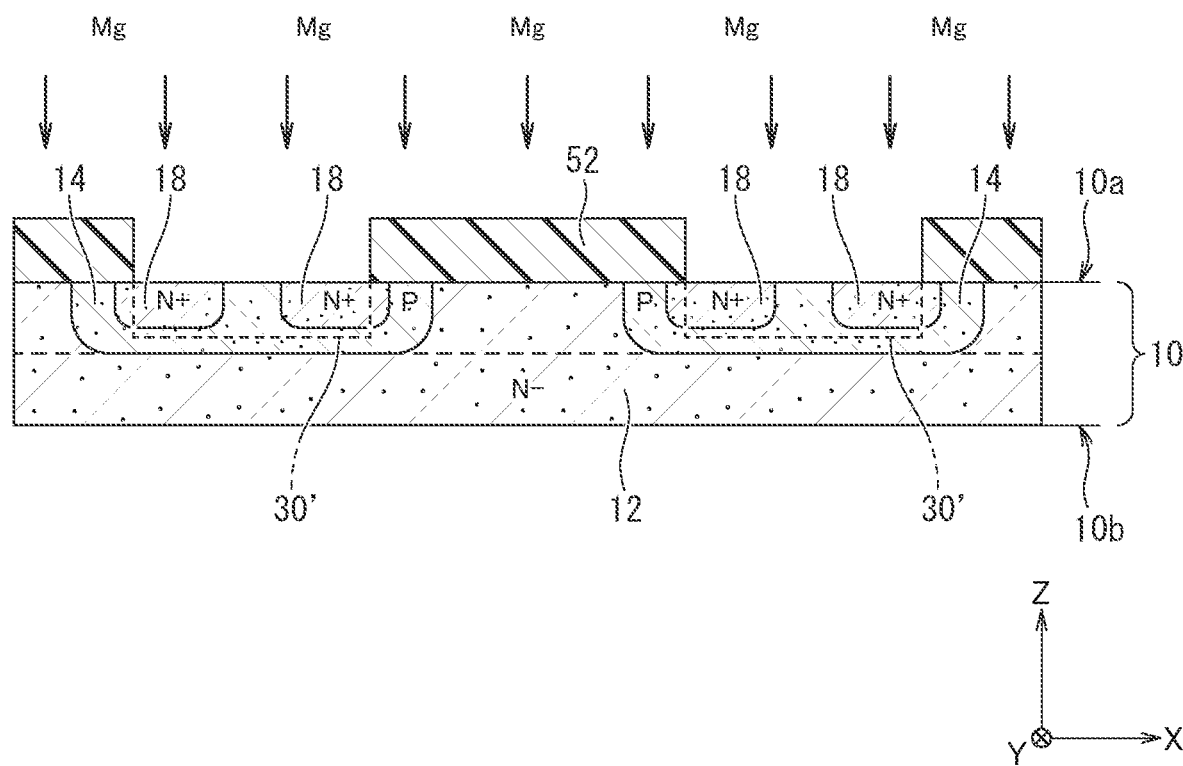
FIG. 16B is another cross-sectional view illustrative of the method for manufacturing the GaN semiconductor device according to the third embodiment of the present invention in the sequence of steps.

Next, as illustrated in FIG. 16B, the manufacturing apparatus forms a mask 52 in which portions over first P+-type formation regions 30' are opened and that covers the upper parts of the other regions, on the GaN substrate 10. Since, in the third embodiment, each of the first P+-type regions 30 is formed under not only N+-type source regions 18 but also a second P+-type region 20, each of the first P+-type formation regions 30' is set to be wide in such a way as to overlap a second P+-type formation region 20'.

Next, as illustrated in FIG. 16B, the manufacturing apparatus implants ions of Mg into the GaN substrate 10 on which the mask 52 is formed, as an acceptor element. After the ion implantation, the manufacturing apparatus removes the mask 52 from the top of the GaN substrate 10.

In the third embodiment, a dose amount of Mg and Mg implantation energy (acceleration voltage) are set in such a way that Mg concentration is $1 \times 10^{19}$ cm$^{-3}$ or more and $1 \times 10^{21}$ cm$^{-3}$ or less in a region extending from the front surface 10a of the GaN substrate 10 to a position at which the bottom portions of the first P+-type regions 30 are formed (that is, a position the depth of which from the front surface 10a of the GaN substrate 10 is deeper than the N+-type source regions 18 and at which depletion layers are formed by contact with the N+-type source regions 18).

The Mg ion implantation step may be performed by one-step ion implantation in which acceleration energy is applied in accordance with one condition or multi-step ion implantation in which acceleration energy is applied in accordance with a plurality of conditions. Performing the ion implantation step by the multi-step ion implantation facilitates keeping Mg concentration in the depth direction at a constant value even when ions of Mg are implanted into a region extending from the front surface 10a of the GaN substrate 10 to a deep position.

Figure 16C:
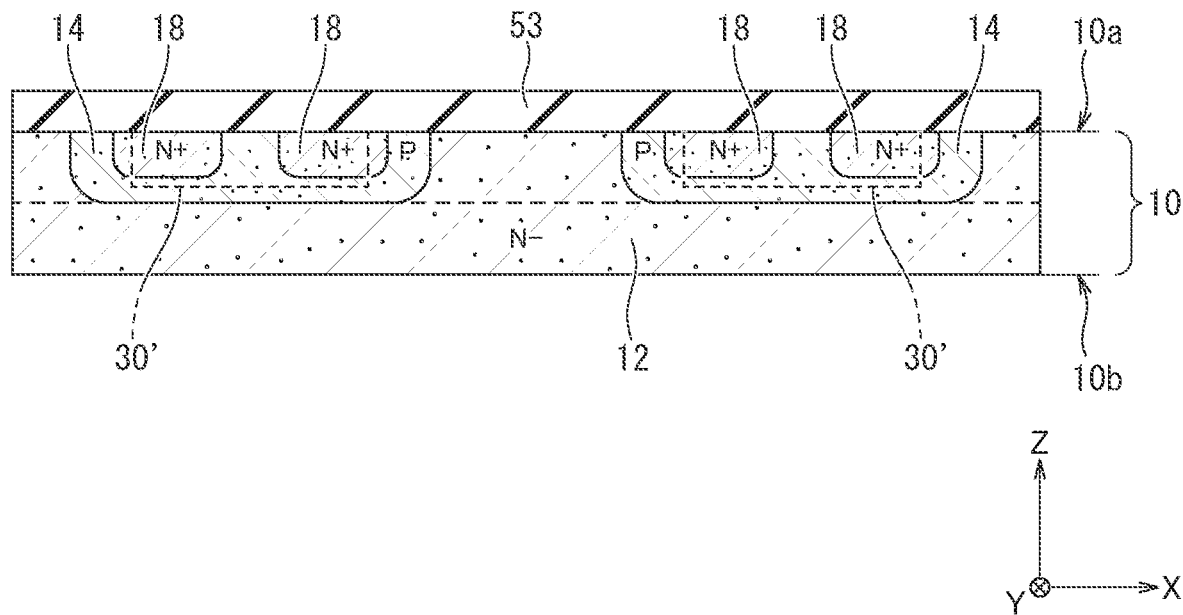
FIG. 16C is still another cross-sectional view illustrative of the method for manufacturing the GaN semiconductor device according to the third embodiment of the present invention in the sequence of steps.

Next, as illustrated in FIG. 16C, the manufacturing apparatus forms a protective film 53 on the GaN substrate 10. The protective film 53 is, for example, AlN or SiN.

Figure 16D:
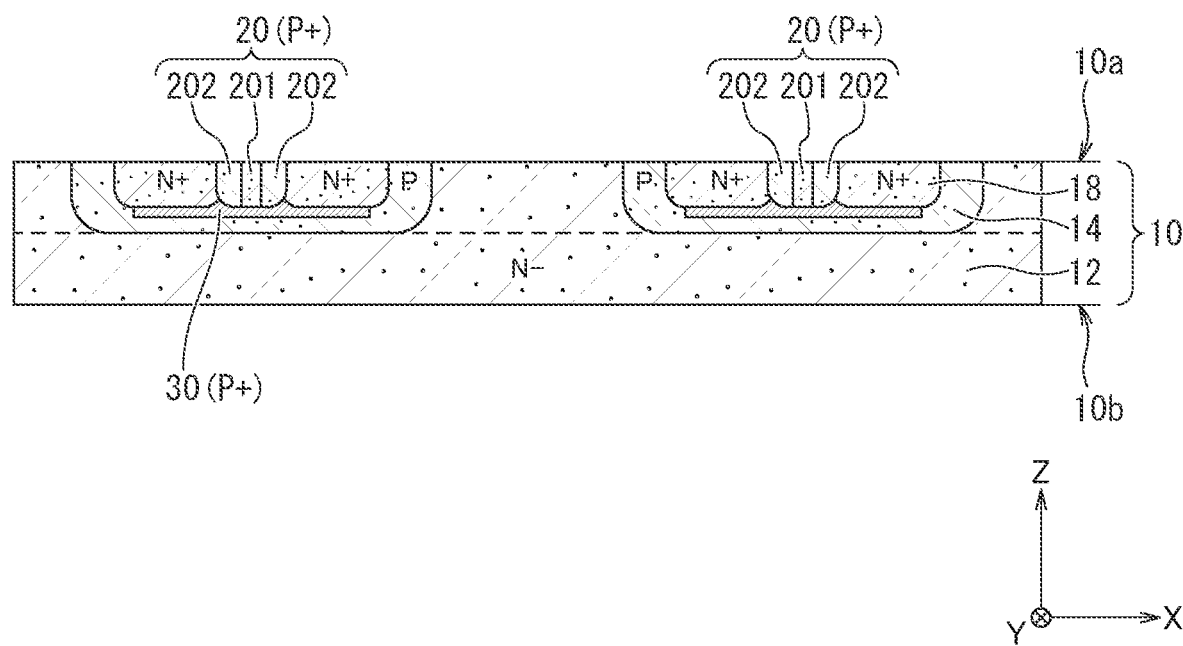
FIG. 16D is still another cross-sectional view illustrative of the method for manufacturing the GaN semiconductor device according to the third embodiment of the present invention in the sequence of steps.

Next, the manufacturing apparatus subjects the GaN substrate 10 covered by the protective film 53 to heat treatment the maximum temperature of which is 1300° C. or more and 2000° C. or less. This heat treatment is, for example, rapid heat treatment. This heat treatment causes Mg, which is ion-implanted into the GaN substrate 10, to be activated and, as illustrated in FIG. 16D, the first P+-type regions 30 and the second P+-type regions 20 to be formed in the GaN substrate 10. After the heat treatment, the manufacturing apparatus removes the protective film 53 from the front surface 10a of the GaN substrate 10.

The steps thereafter are the same as those in the first and second embodiments. The manufacturing apparatus forms gate insulating films 21, gate electrodes 23, source electrodes 25, and a drain electrode 27. Through the above-described steps, the GaN semiconductor device 100B including vertical MOSFETs 1 (see FIG. 15) is completed.

The GaN semiconductor device 100B according to the third embodiment of the present invention, as with the GaN semiconductor device 100A according to the second embodiment, includes highly concentrated first P+-type regions 30 and second P+-type regions 20. The highly concentrated first P+-type regions 30 and second P+-type regions 20 enable ohmic characteristics of connections between the source electrodes 25 and the P-type well regions 14 to be further improved.

In addition, in the third embodiment, since the first P+-type regions 30 and the second P+-type regions 20 can be formed at the same time, using the same mask 52, it is possible to reduce the number of manufacturing steps and reduce manufacturing cost.

Note that, in the method of the third embodiment, although ions of an acceptor element (for example, Mg) are also implanted into a vicinity of the front surfaces of the N+-type source regions 18, concentration of a donor element (for example, Si) in the N+-type source regions 18 is higher than concentration of Mg that is ion-implanted. Thus, in the third embodiment, the N+-type source regions 18 are also maintained as highly concentrated N-type regions.

Fourth Embodiment

In the above-described second embodiment, it was described that the second P+-type regions 20 had stripe shapes extending in the Y-axis direction as viewed in plan. However, in the present invention, the shapes of second $P^+$-type regions 20 as viewed in plan are not limited to the above-described shapes. The second $P^+$-type regions 20 may have portions extending in the X-axis direction.

Figure 17:
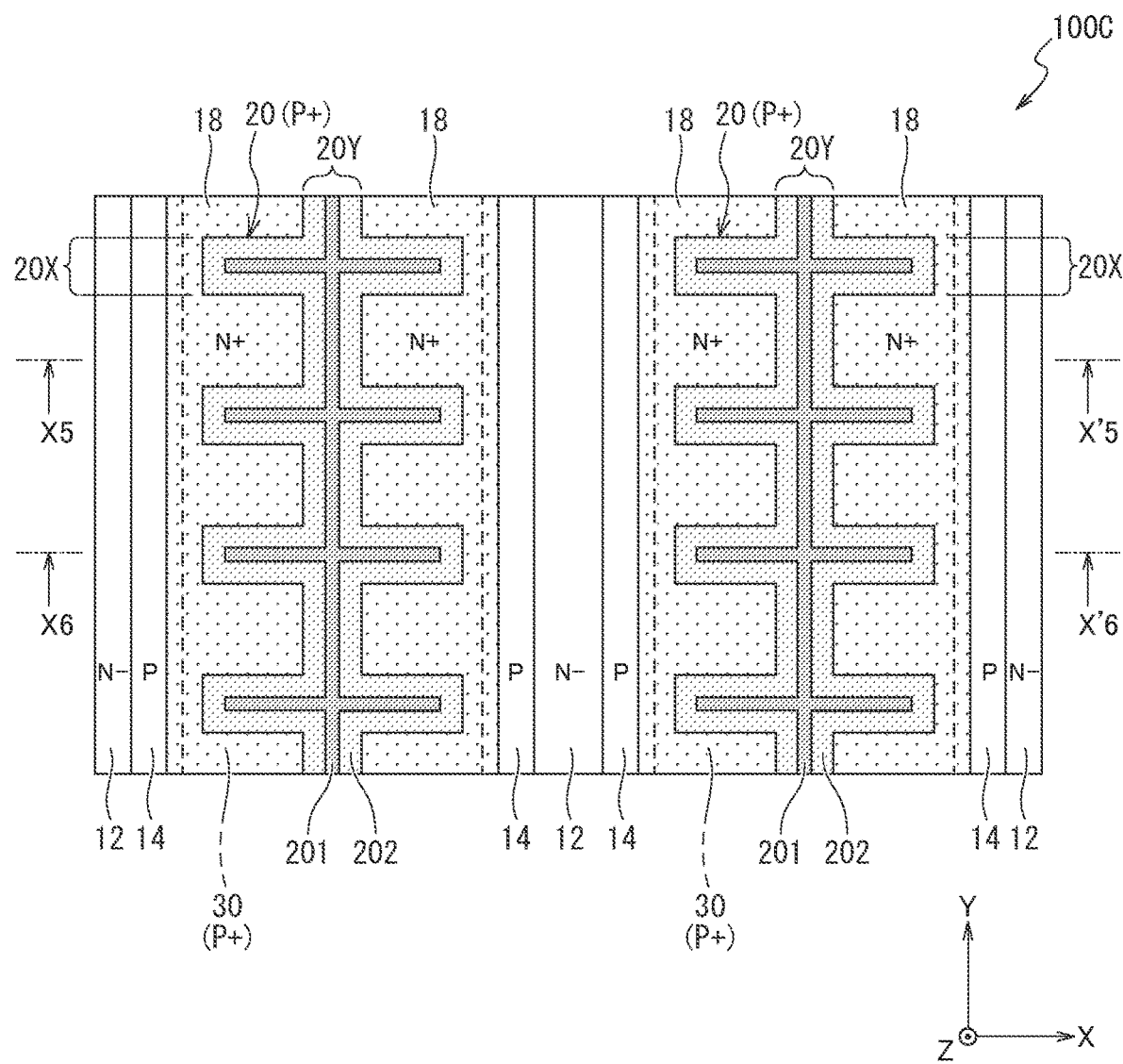
FIG. 17 is a plan view illustrative of a configuration example of a GaN semiconductor device according to a fourth embodiment of the present invention.
Figure 18A:
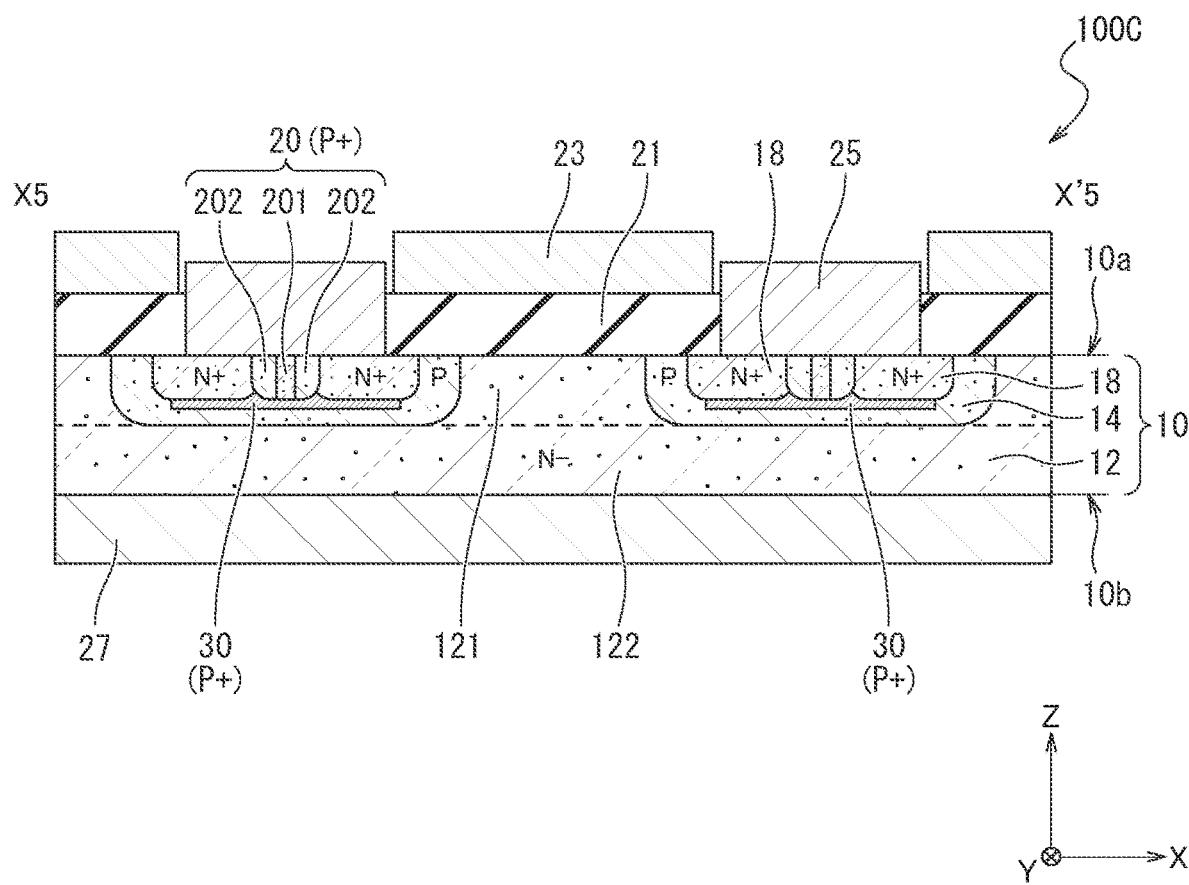
FIG. 18A is a cross-sectional view illustrative of the configuration example of the GaN semiconductor device according to the fourth embodiment of the present invention.
Figure 18B:
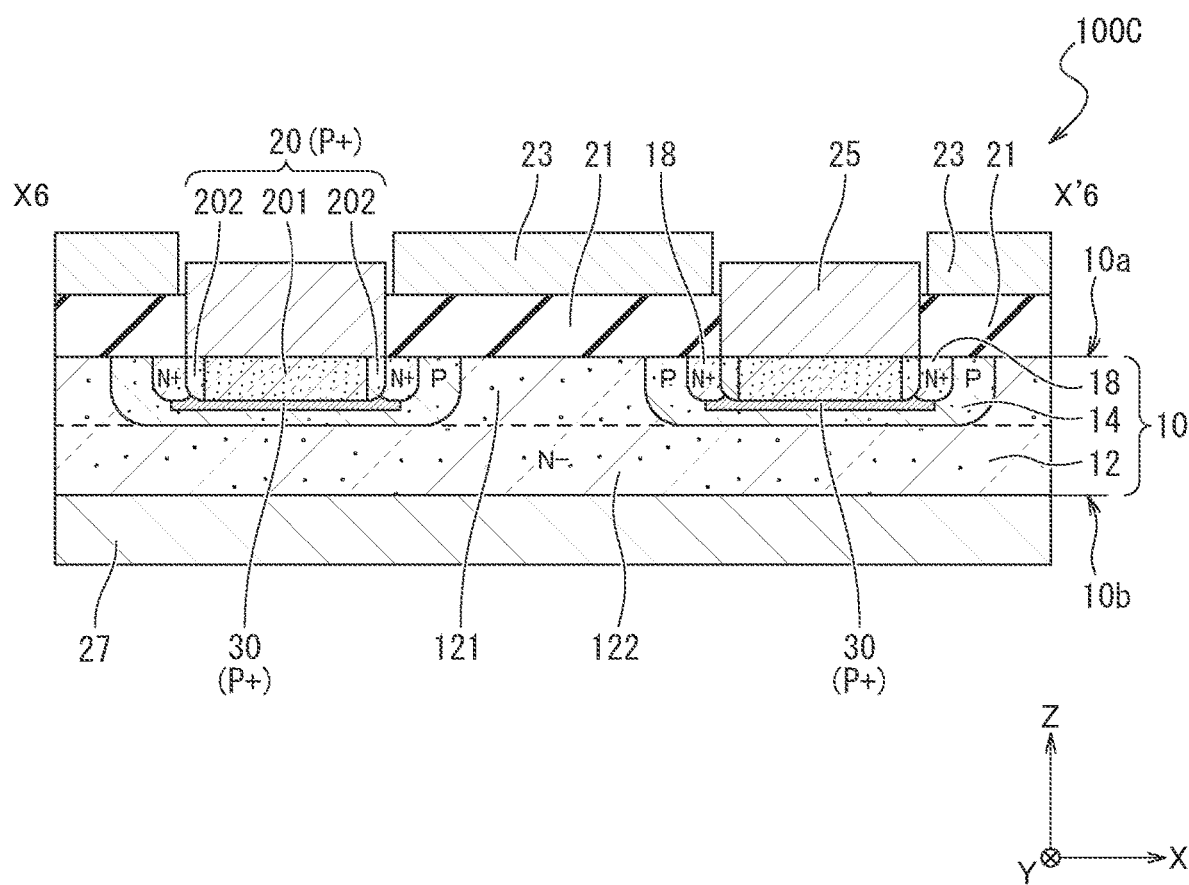
FIG. 18B is another cross-sectional view illustrative of the configuration example of the GaN semiconductor device according to the fourth embodiment of the present invention.

FIG. 17 is a plan view illustrative of a configuration example of a GaN semiconductor device 100C according to a fourth embodiment of the present invention. FIGS. 18A and 18B are cross-sectional views illustrative of the configuration example of the GaN semiconductor device 100C according to the fourth embodiment of the present invention. FIG. 18A illustrates a cross-section of the plan view in FIG. 17 taken along the line X5-X'5 thereof. FIG. 18B illustrates a cross-section of the plan view in FIG. 17 taken along the line X6-X'6 thereof.

As illustrated in FIGS. 17, 18A, and 18B, in the GaN semiconductor device 100C according to the fourth embodiment, each of the second $P^+$-type regions 20 has a first portion 20Y extending in the Y-axis direction and second portions 20X extending in the X-axis direction as viewed in plan, and the first portion 20Y and the second portions 20X are connected to each other and form a comb-teeth shape. As viewed in plan, the first portion 20Y and the second portions 20X are respectively sandwiched by $N^+$-type source regions 18 on both sides and have a first region 201 and second regions 202 that are located on both sides of the first region 201.

The GaN semiconductor device 100C according to the fourth embodiment, as with the GaN semiconductor device 100A according to the second embodiment, includes highly concentrated first $P^+$-type regions 30 and the highly concentrated second $P^+$-type regions 20. The highly concentrated first $P^+$-type regions 30 and second $P^+$-type regions 20 enable ohmic characteristics of connections between source electrodes 25 and P-type well regions 14 to be further improved.

In addition, in the GaN semiconductor device 100C, second regions 202 in which Mg segregation is suppressed and decrease in Mg concentration is suppressed are formed in not only the first portion 20Y but also the second portions 20X. This formation enables highly concentrated second $P^+$-type regions 20 of larger areas to be formed.

Fifth Embodiment

Figure 19:
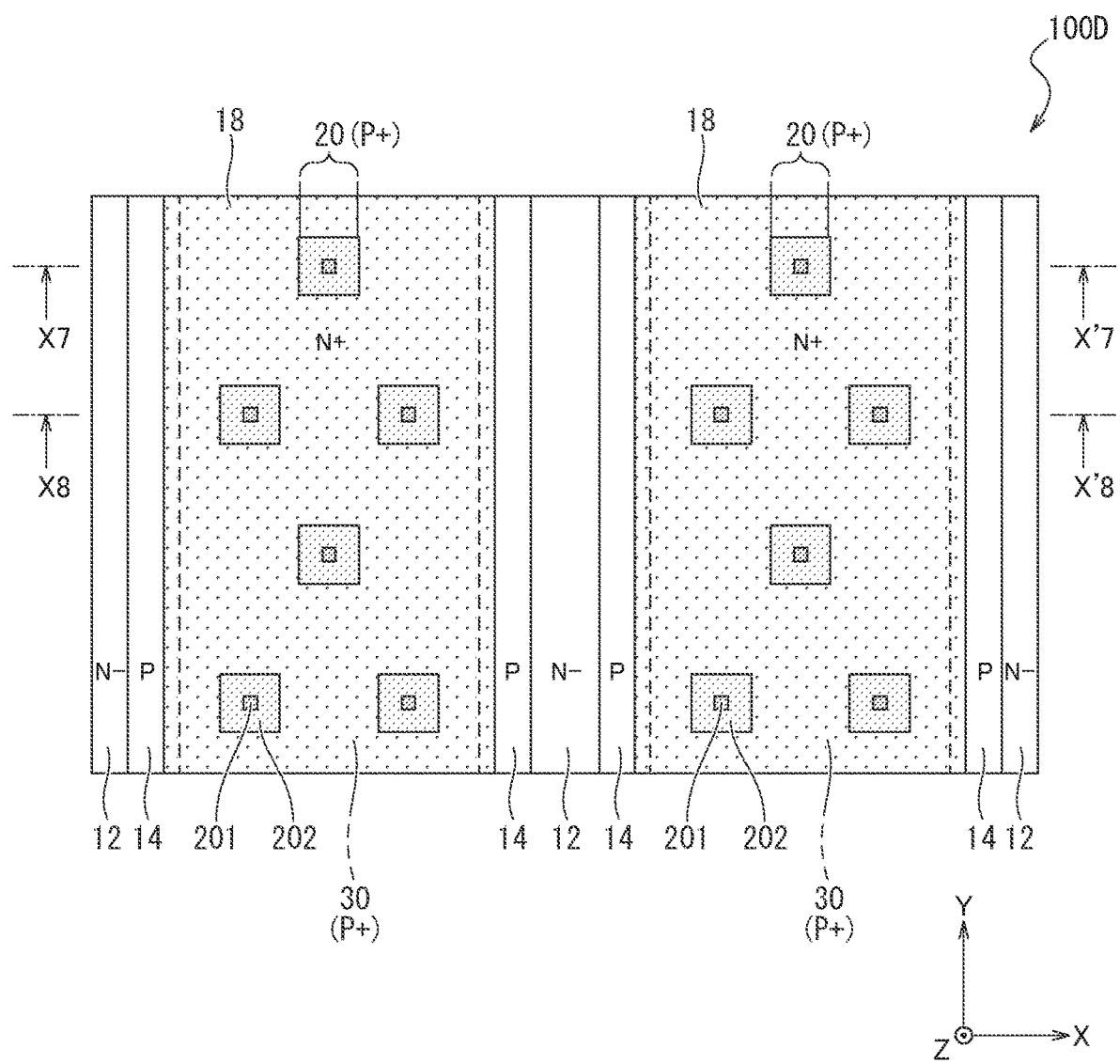
FIG. 19 is a plan view illustrative of a configuration example of a GaN semiconductor device according to a fifth embodiment of the present invention.
Figure 20A:
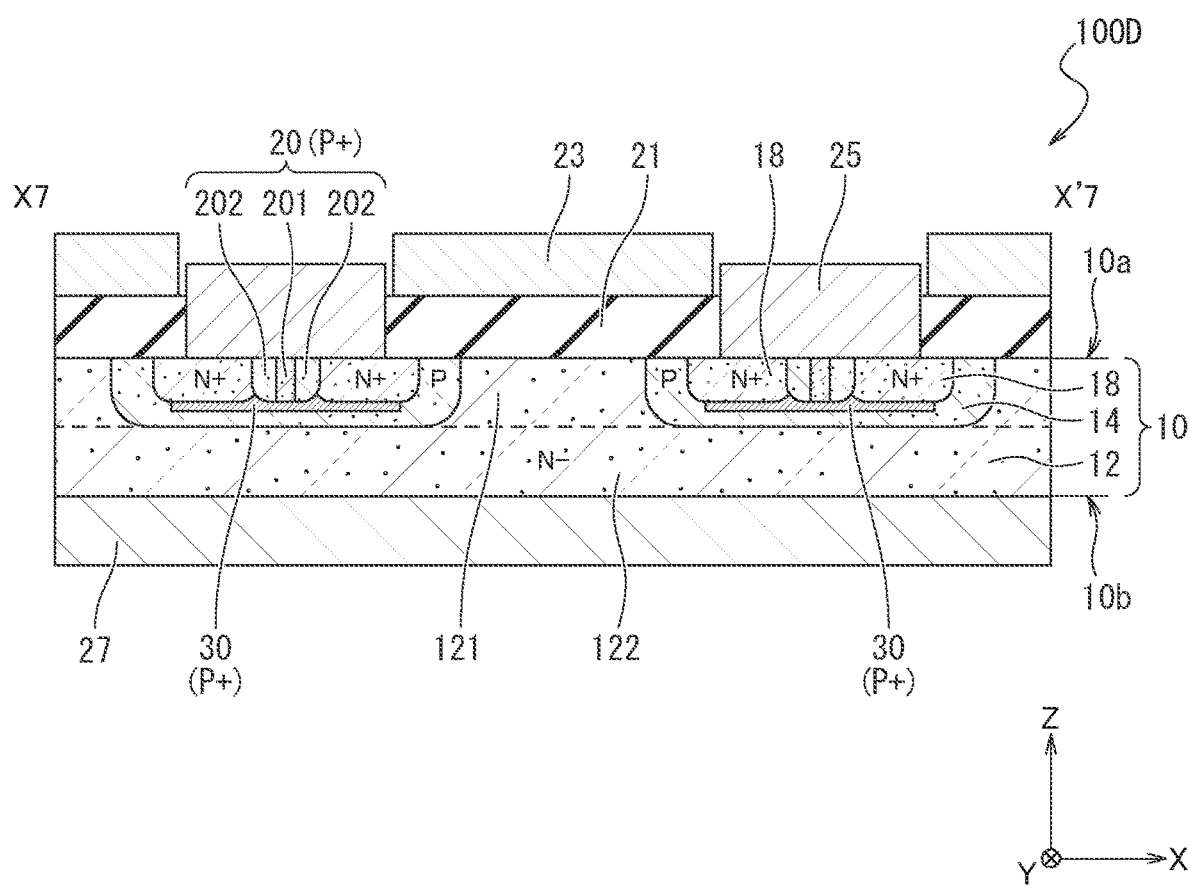
FIG. 20A is a cross-sectional view illustrative of the configuration example of the GaN semiconductor device according to the fifth embodiment of the present invention.
Figure 20B:
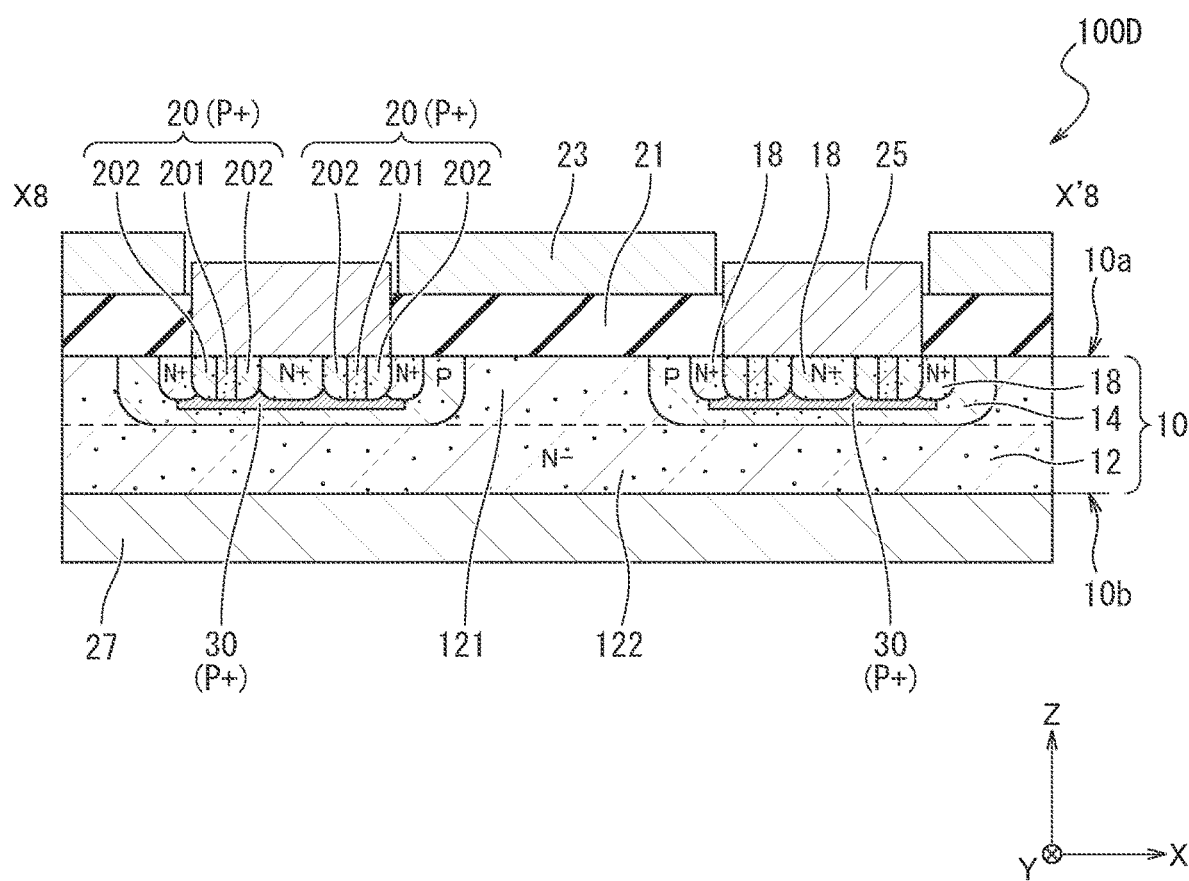
FIG. 20B is another cross-sectional view illustrative of the configuration example of the GaN semiconductor device according to the fifth embodiment of the present invention.

In an embodiment of the present invention, each second $P^+$-type region 20 may be arranged in a dot shape as viewed in plan. FIG. 19 is a plan view illustrative of a configuration example of a GaN semiconductor device 100D according to a fifth embodiment of the present invention. FIGS. 20A and 20B are cross-sectional views illustrative of the configuration example of the GaN semiconductor device 100D according to the fifth embodiment of the present invention. FIG. 20A illustrates a cross-section of the plan view in FIG. 19 taken along the line X7-X'7 thereof. FIG. 20B illustrates a cross-section of the plan view in FIG. 19 taken along the line X8-X'8 thereof.

As illustrated in FIGS. 19, 20A, and 20B, in the GaN semiconductor device 100D according to the fifth embodiment, each second $P^+$-type region 20 is arranged in a dot shape as viewed in plan. Since each of the second $P^+$-type regions 20 arranged in a dot shape is surrounded by an $N^+$-type source region 18 from all directions as viewed in plan, it is possible to increase a ratio of an activation area within one second $P^+$-type region 20 (that is, a ratio of area of a second region 202).

The GaN semiconductor device 100D according to the fifth embodiment, as with the GaN semiconductor device 100A according to the second embodiment, includes highly concentrated first $P^+$-type regions 30 and the highly concentrated second $P^+$-type regions 20. The highly concentrated first $P^+$-type regions 30 and second $P^+$-type regions 20 enable ohmic characteristics of connections between source electrodes 25 and P-type well regions 14 to be further improved.

In addition, in the GaN semiconductor device 100D, since it is possible to increase a ratio of an activation area within each second $P^+$-type region 20 (that is, a ratio of area of a second region 202), it becomes possible to achieve more highly concentrated second $P^+$-type regions 20.

Note that each of the dot-shaped second $P^+$-type regions 20 is only required to be surrounded by an $N^+$-type source region 18 as viewed in plan and may be arranged at any position. In addition, although, in FIG. 19, a case where each of the dot-shaped second $P^+$-type regions 20 is a square as viewed in plan is illustrated, the case is only an example. Each of the dot-shaped second $P^+$-type regions 20 may be a rectangle or a circle as viewed in plan.

Sixth Embodiment

Figure 21:
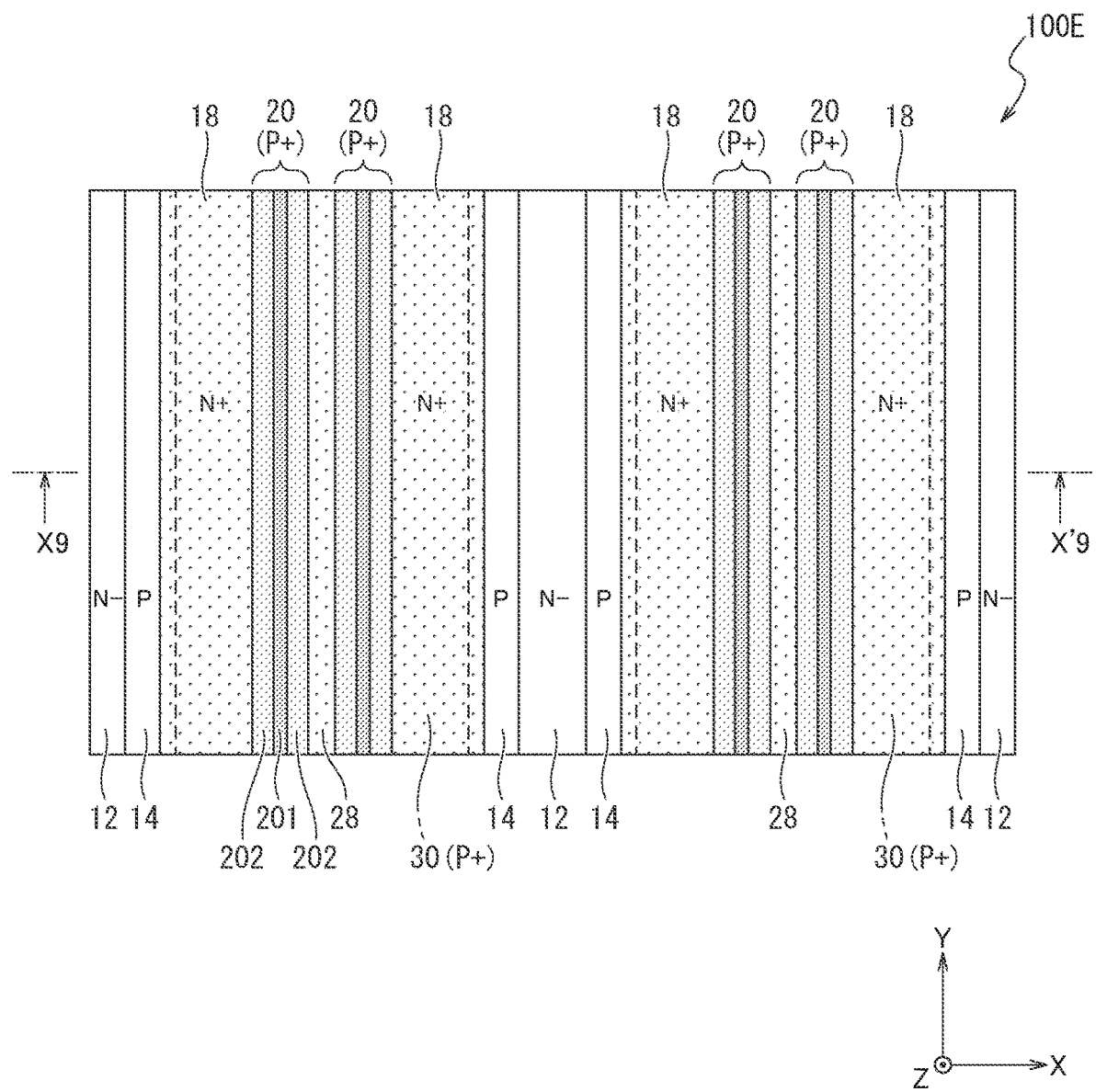
FIG. 21 is a plan view illustrative of a configuration example of a GaN semiconductor device according to a sixth embodiment of the present invention.
Figure 22:
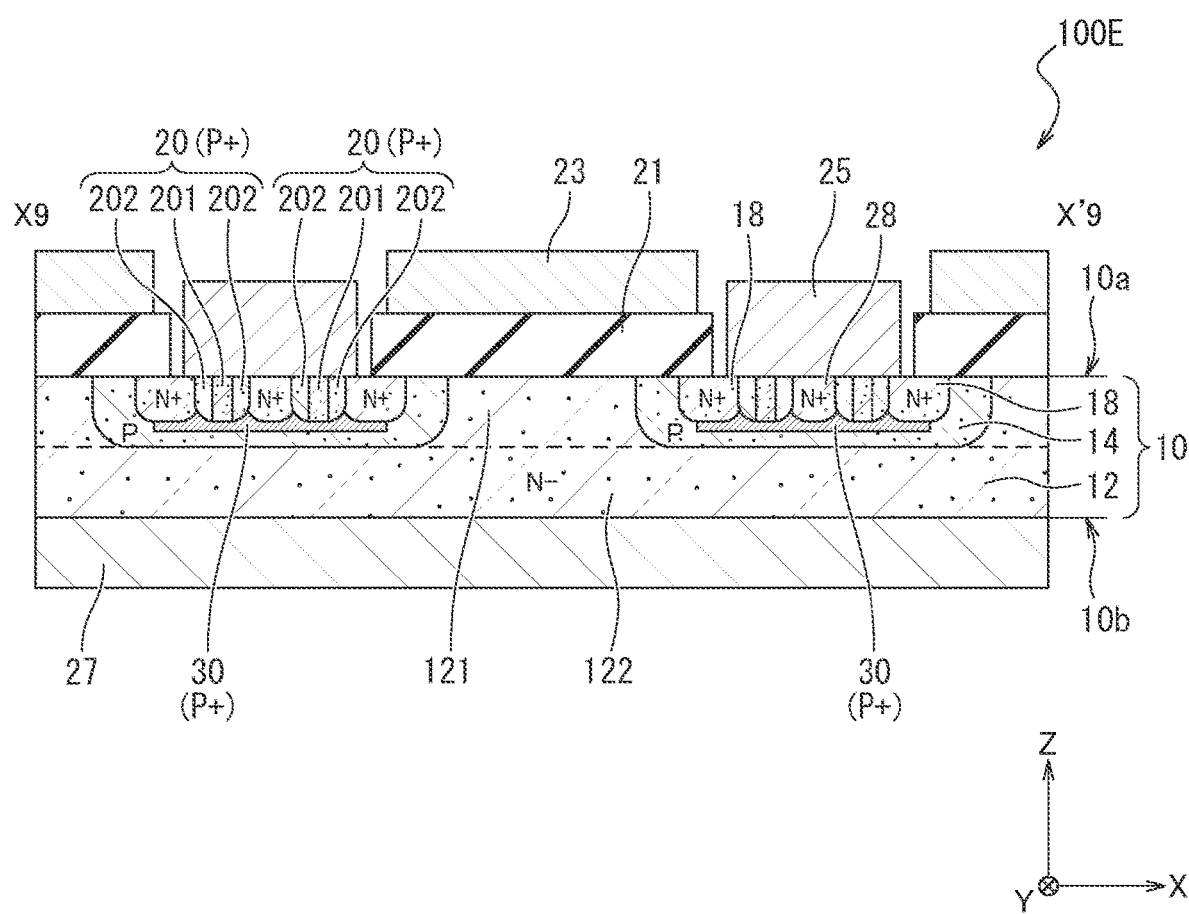
FIG. 22 is a cross-sectional view illustrative of the configuration example of the GaN semiconductor device according to the sixth embodiment of the present invention.

FIG. 21 is a plan view illustrative of a configuration example of a GaN semiconductor device 100E according to a sixth embodiment of the present invention. FIG. 22 is a cross-sectional view illustrative of the configuration example of the GaN semiconductor device 100E according to the sixth embodiment of the present invention. FIG. 22 illustrates a cross-section of the plan view in FIG. 21 taken along the line X9-X'9 thereof.

As illustrated in FIGS. 21 and 22, in the GaN semiconductor device 100E according to the sixth embodiment, two second $P^+$-type regions 20 extending in the Y-axis direction are arranged under one source electrode 25. Between the two second $P^+$-type regions 20, an $N^+$-type region 28 is arranged. In the X-axis direction, an $N^+$-type source region 18, a first second $P^+$-type region 20, the $N^+$-type region 28, a second second $P^+$-type region 20, and an $N^+$-type source region 18 are arranged in line in this order. Each of the two second $P^+$-type regions 20 is sandwiched by an $N^+$-type source region 18 and the $N^+$-type region 28 on both sides. In the sixth embodiment, the $N^+$-type source regions 18 and the $N^+$-type region 28 serve as an example of "N-type region" of the present invention.

Although concentration of a dopant element (for example, Si concentration) in the $N^+$-type regions 28 may be the same as or different from concentration of a dopant element (for example, Si concentration) in the $N^+$-type source regions 18, the concentration of the dopant element in the $N^+$-type regions 28 is a value equal to or greater than a concentration of an acceptor element (for example, Mg concentration) in the second $P^+$-type regions 20. In addition, as illustrated in FIG. 22, depth of the $N^+$-type regions 28 from a front surface 10a is the same depth as depth of the second $P^+$-type regions 20 from the front surface 10a.

The GaN semiconductor device 100E according to the sixth embodiment, as with the GaN semiconductor device 100A according to the second embodiment, includes highly concentrated first $P^+$-type regions 30 and the highly concentrated second $P^+$-type regions 20. The highly concentrated first $P^+$-type regions 30 and second $P^+$-type regions 20 enable ohmic characteristics of connections between the source electrodes 25 and P-type well regions 14 to be further improved.

In addition, in the GaN semiconductor device 100E, in second regions 202 adjacent to an N$^+$-type region 28 but not to N$^+$-type source regions 18, Mg segregation is also suppressed and decrease in Mg concentration is suppressed. This configuration enables second regions 202 to be formed in both side portions of each of a plurality of second P$^+$-type regions 20 even when the plurality of second P$^+$-type regions 20 are arranged under a source electrode 25, and it becomes possible to achieve high concentration in each of the plurality of second P$^+$-type regions 20.

Note that, although, in FIG. 21, a case where an N$^+$-type source region 18 and an N$^+$-type region 28 are not connected as viewed in plan is illustrated, the case is only an example. In the sixth embodiment of the present invention, an N$^+$-type source region 18 and an N$^+$-type region 28 may be connected as viewed in plan.

In addition, although, in the sixth embodiment, a mode in which two second P$^+$-type regions 20 extending in the Y-axis direction are arranged under one source electrode 25 was exemplified, the mode is only an example. In the sixth embodiment, three or more second P$^+$-type regions 20 extending in the Y-axis direction may be arranged under one source electrode 25. In such a case, arranging an N$^+$-type region 28 between one and the other of a pair of second P$^+$-type regions 20 that are adjacent to each other in the X-axis direction also enables high concentration to be achieved in each of the three or more second P$^+$-type region 20.

Seventh Embodiment

Figure 23:
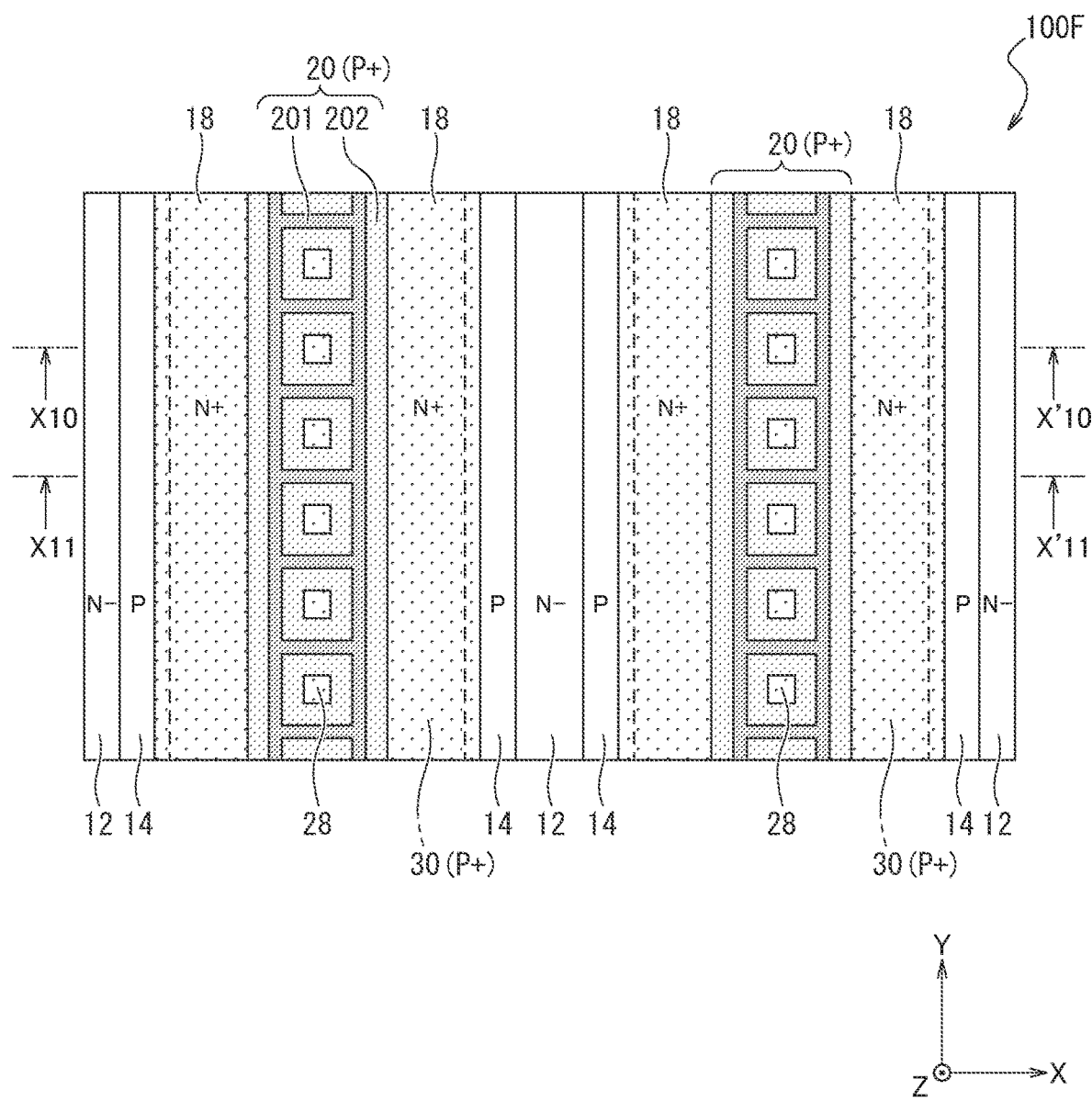
FIG. 23 is a plan view illustrative of a configuration example of a GaN semiconductor device according to a seventh embodiment of the present invention.
Figure 24A:
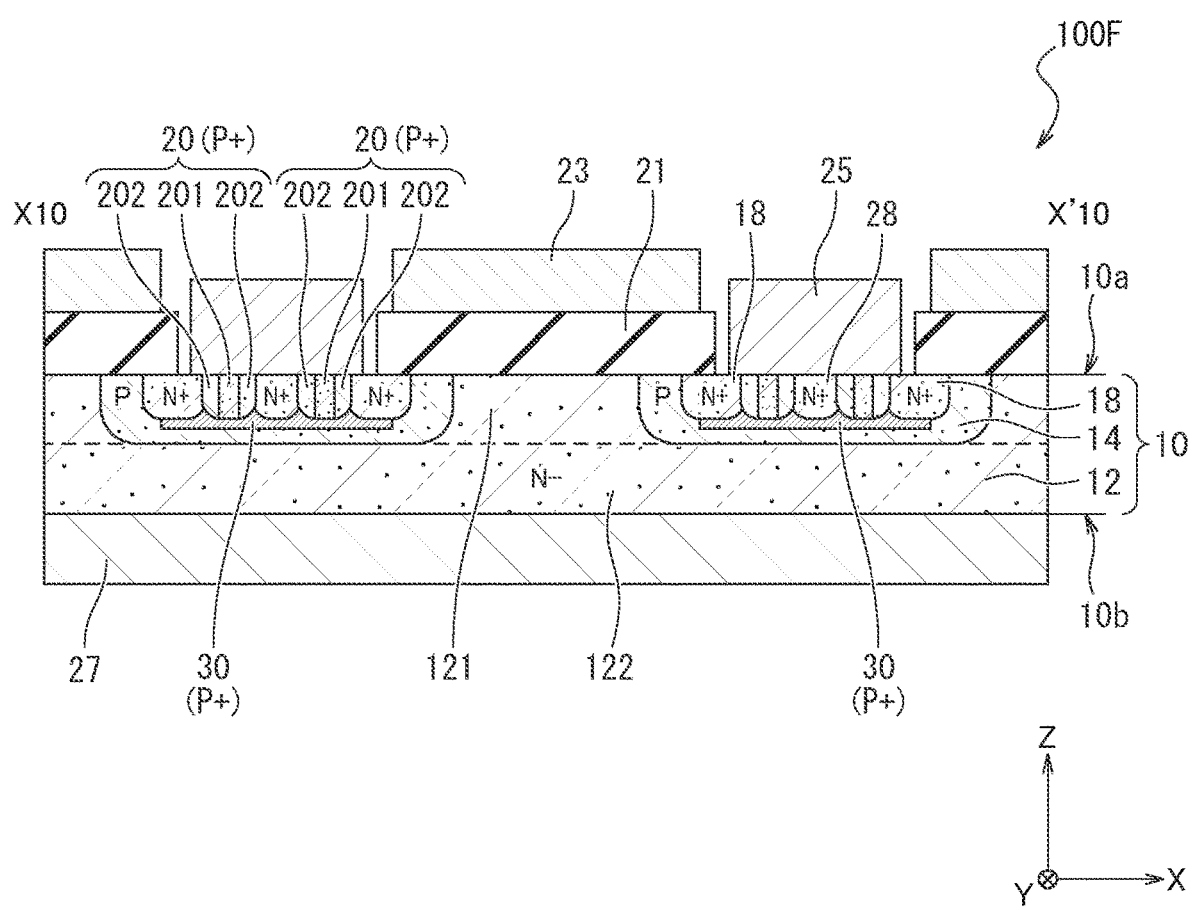
FIG. 24A is a cross-sectional view illustrative of the configuration example of the GaN semiconductor device according to the seventh embodiment of the present invention.
Figure 24B:
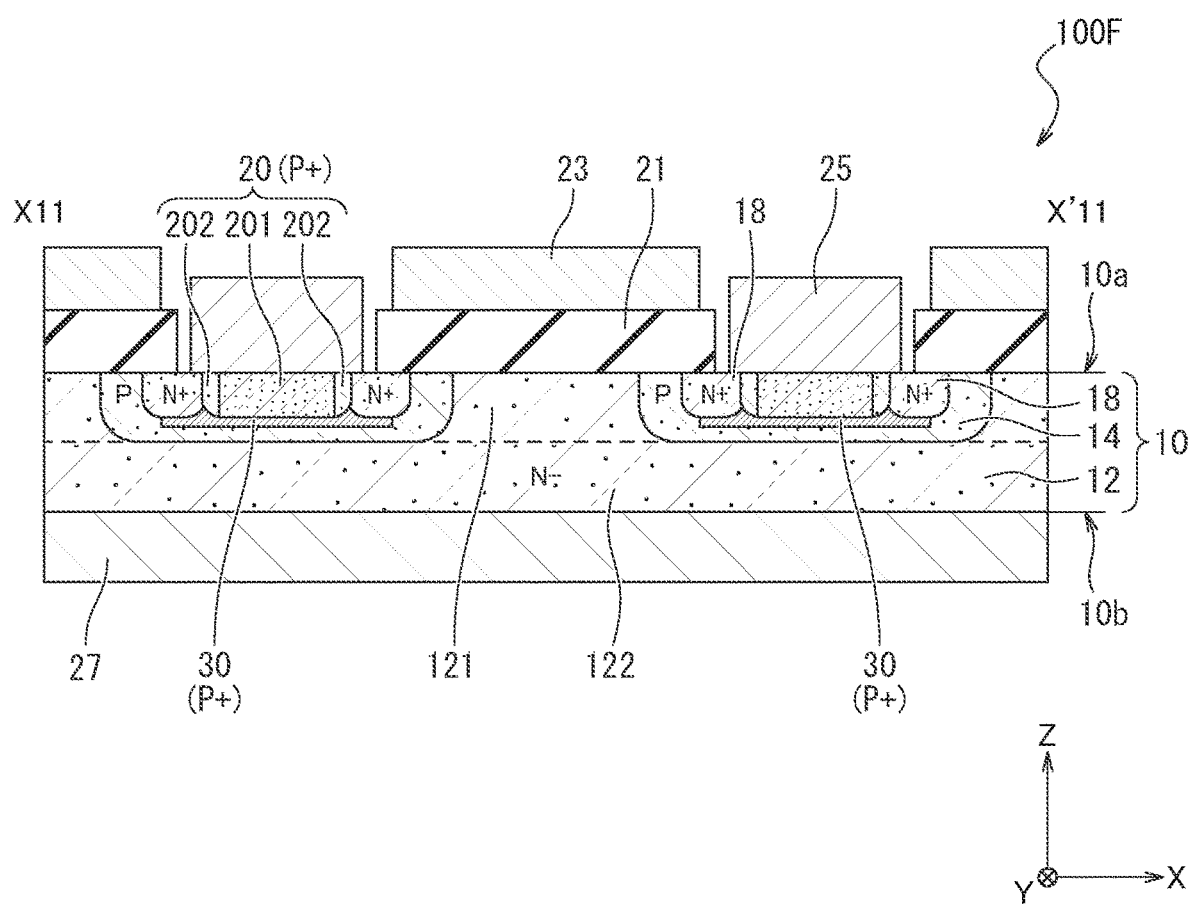
FIG. 24B is another cross-sectional view illustrative of the configuration example of the GaN semiconductor device according to the seventh embodiment of the present invention.

FIG. 23 is a plan view illustrative of a configuration example of a GaN semiconductor device 100F according to a seventh embodiment of the present invention. FIGS. 24A and 24B are cross-sectional views illustrative of the configuration example of the GaN semiconductor device 100F according to the seventh embodiment of the present invention. FIG. 24A illustrates a cross-section of the plan view in FIG. 23 taken along the line X10-X'10 thereof. FIG. 24B illustrates a cross-section of the plan view in FIG. 23 taken along the line X11-X'11 thereof.

As illustrated in FIG. 23, in the GaN semiconductor device 100F according to the seventh embodiment, N$^+$-type regions 28 are scattered in each second P$^+$-type region 20 as viewed in plan. As illustrated in FIGS. 23, 24A, and 24B, each of the second P$^+$-type regions 20 is sandwiched by N$^+$-type source regions 18 on both sides in the X-axis direction. In addition, a portion of each of the second P$^+$-type regions 20 is in contact with one of the N$^+$-type regions 28, which are scattered in the second P$^+$-type region 20, and is sandwiched by the N$^+$-type region 28 and another N$^+$-type region 28 (or by the N$^+$-type region 28 and an N$^+$-type source region 18) on both sides. In the X-axis direction, an interval between an N$^+$-type source region 18 and an N$^+$-type region 28 is the same as the interval W illustrated in FIG. 10B and, for example, 50 nm or more and 500 nm or less.

In the seventh embodiment, as with the sixth embodiment, although concentration of a dopant element (for example, Si concentration) in the N$^+$-type regions 28 may be the same as or different from concentration of a dopant element (for example, Si concentration) in the N$^+$-type source regions 18, the concentration of the dopant element in the N$^+$-type regions 28 is a value equal to or greater than a concentration of an acceptor element (for example, Mg concentration) in the second P$^+$-type regions 20. In addition, as illustrated in FIG. 23, depth of the N$^+$-type regions 28 from a front surface 10a is the same depth as depth of the second P$^+$-type regions 20 from the front surface 10a.

A depletion layer extends from an N$^+$-type region 28 to a second P$^+$-type region 20. Because of this configuration, in a second P$^+$-type region 20, a second region 202 that has a higher concentration of acceptors (for example, Mg concentration) than a first region 201 is formed in not only a region adjacent to an N$^+$-type source region 18 but also a region adjacent to an N$^+$-type region 28.

The GaN semiconductor device 100F according to the seventh embodiment, as with the GaN semiconductor device 100A according to the second embodiment, includes highly concentrated first P$^+$-type regions 30 and the highly concentrated second P$^+$-type regions 20. The highly concentrated first P$^+$-type regions 30 and second P$^+$-type regions 20 enable ohmic characteristics of connections between the source electrodes 25 and the P-type well regions 14 to be further improved.

In addition, in the GaN semiconductor device 100F, in second regions 202 adjacent to an N$^+$-type region 28 but not to N$^+$-type source regions 18, Mg segregation is also suppressed and decrease in Mg concentration is suppressed. Because of this configuration, in the GaN semiconductor device 100F, since it is possible to increase a ratio of an activation area within a second P$^+$-type region 20 (that is, a ratio of area of a second region 202), it becomes possible to achieve a more highly concentrated second P$^+$-type region 20.

Note that, although, in FIG. 23, a case where an N$^+$-type source region 18 and an N$^+$-type region 28 are not connected as viewed in plan is illustrated, the case is only an example. In the seventh embodiment of the present invention, an N$^+$-type source region 18 and an N$^+$-type region 28 may be connected as viewed in plan.

In addition, each of the dot-shaped N$^+$-type regions 28 is only required to be surrounded by a second P$^+$-type region 20 as viewed in plan and may be arranged at any position. In addition, although, in FIG. 23, a case where each of the dot-shaped N$^+$-type regions 28 is a square as viewed in plan is illustrated, the case is only an example. Each of the dot-shaped N$^+$-type regions 28 may be a rectangle or a circle as viewed in plan.

Eighth Embodiment

In the above-described first to seventh embodiments, a case where vertical MOSFETs that a GaN semiconductor device includes are planar was described. However, in an embodiment of the present invention, vertical MOSFETs that a GaN semiconductor device includes are not limited to the planar type MOSFETs and may be trench gate type MOSFETs.

Figure 25:
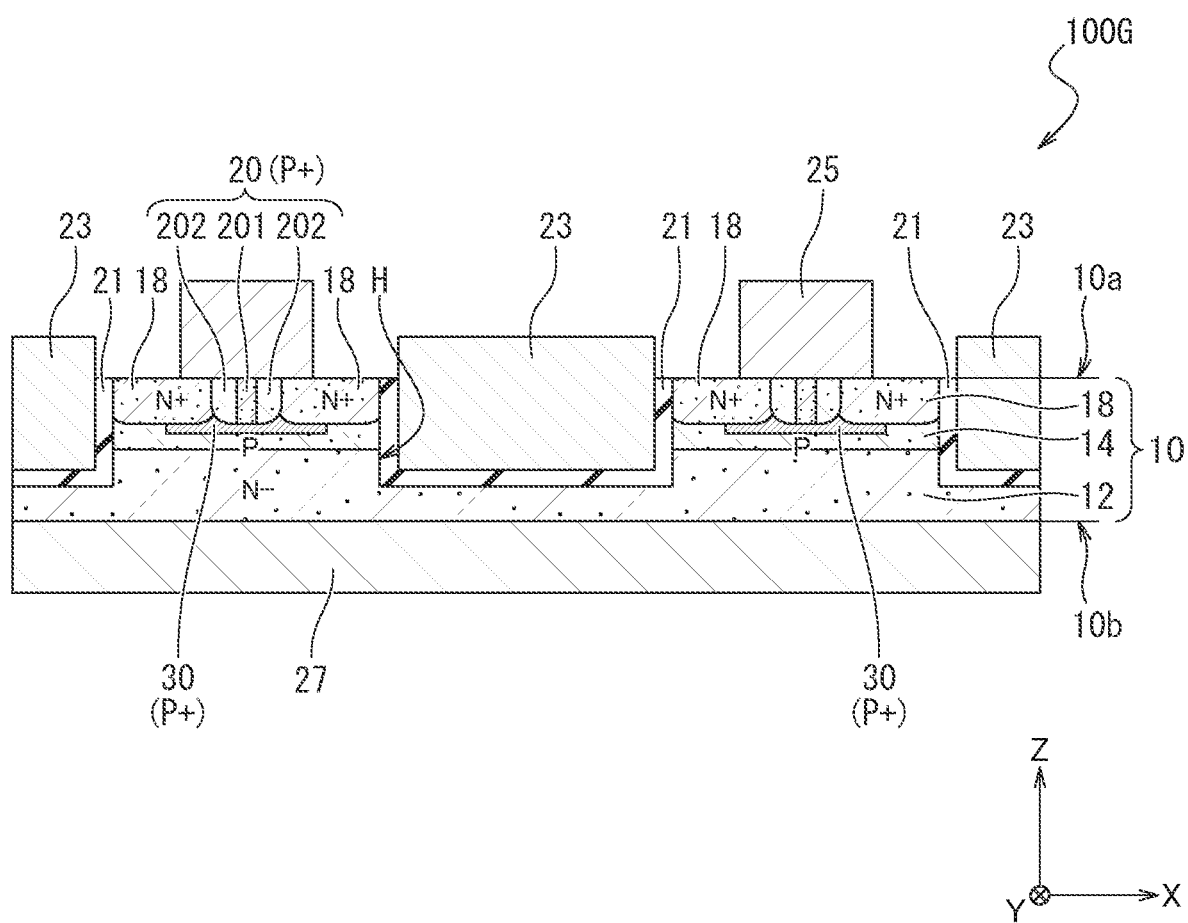
FIG. 25 is a cross-sectional view illustrative of a configuration example of a GaN semiconductor device according to an eighth embodiment of the present invention.

FIG. 25 is a cross-sectional view illustrative of a configuration example of a GaN semiconductor device 100G according to an eighth embodiment of the present invention. As illustrated in FIG. 25, the GaN semiconductor device 100G according to the eighth embodiment has trenches H formed on a GaN substrate 10. The trenches H open on the front surface 10a side of the GaN substrate 10. The trenches H are formed deeper than P-type well regions 14, and bottom portions of the trenches H reach an N$^-$-type drift region 12.

On the inside of each of the trenches H, a gate insulating film 21 and a gate electrode 23 are arranged. The side surfaces and the bottom surface on the inside of the trench H are covered by the gate insulating film 21. In addition, the gate electrode 23 is embedded in the trench H with the gate insulating film 21 interposed therebetween. In a trench gate structure, a region that is within a well region 14 and that faces a gate electrode 23 with a gate insulating film 21 interposed therebetween serves as a channel region of a vertical MOSFET.

The GaN semiconductor device 100G according to the eighth embodiment, as with the GaN semiconductor device 100A according to the second embodiment, includes highly concentrated first $P^+$-type regions 30 and highly concentrated second $P^+$-type regions 20. The highly concentrated first $P^+$-type regions 30 and second $P^+$-type regions 20 enable ohmic characteristics of connections between source electrodes 25 and the P-type well regions 14 to be further improved. In addition, employing the trench gate structure for vertical MOSFETs enables channel regions to be arranged more closely, which facilitates miniaturization of elements.

Ninth Embodiment

Figure 26:
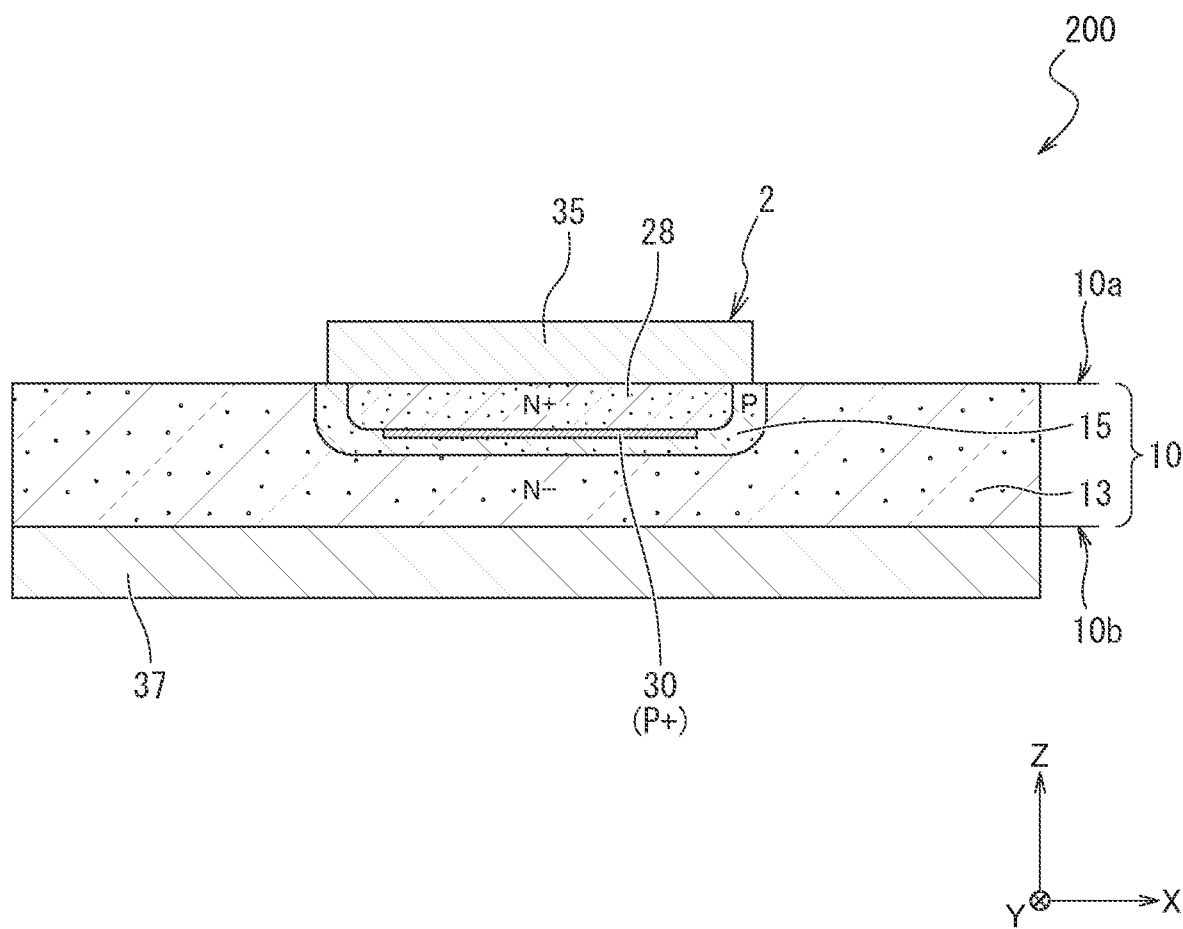
FIG. 26 is a cross-sectional view illustrative of a configuration example of a GaN semiconductor device according to a ninth embodiment of the present invention.

The present invention may be applied to a diode. FIG. 26 is a cross-sectional view illustrative of a configuration example of a GaN semiconductor device 200 according to a ninth embodiment of the present invention. As illustrated in FIG. 26, the GaN semiconductor device 200 according to the ninth embodiment includes a GaN substrate 10 and one or more PN diodes 2 that are formed in the GaN substrate 10.

Each of the PN diodes 2 includes an $N^-$-type region 13 that is formed in the GaN substrate 10, a P-type region 15 that is formed in the GaN substrate 10 and that is in contact with the $N^-$-type region 13, a first $P^+$-type region 30 that is formed in the GaN substrate 10 and that is in contact with the P-type region 15, an $N^+$-type region 28 (an example of an "N-type region" of the present invention) that is formed in the GaN substrate 10 and that is in contact with the P-type region 15 and the first $P^+$-type region 30, an anode electrode 35 (an example of an "electrode" of the present invention) that is formed on the front surface 10a side of the GaN substrate 10 and that is in contact with the $N^+$-type region 28, and a cathode electrode 37 that is formed on the back surface 10b side of the GaN substrate 10 and that is in contact with the $N^-$-type region 13. The P-type region 15 is an anode region of the PN diode 2. The $N^-$-type region 13 is a cathode region of the PN diode 2.

The P-type regions 15 are formed by ions of an acceptor element being implanted into the N-type GaN substrate 10 and the GaN substrate 10 being heat-treated. The acceptor element is, for example, Mg.

The anode electrodes 35 and the cathode electrode 37 are made of, for example, Al or an alloy of Al—Si. Barrier metal layers may be respectively interposed between the anode electrodes 35 and the GaN substrate 10 and between the cathode electrode 37 and the GaN substrate 10. Ti may be used as a material of the barrier metal layers.

As illustrated in FIG. 26, each of the first $P^+$-type regions 30 is sandwiched by a P-type region 15 and an $N^+$-type region 28 in the thickness direction of the GaN substrate 10 (for example, in the Z-axis direction). Concentration of a donor element (for example, Si) in the $N^+$-type regions 28 has a higher value than concentration of an acceptor element (for example, Mg) in the first $P^+$-type regions 30.

In a step of forming the first $P^+$-type regions 30, a depletion layer is formed in each region (first $P^+$-type formation region) that is a portion of a P-type region 15 and that is located immediately below an $N^+$-type region 28. Mg that is ion-implanted in the first $P^+$-type formation region in advance is activated in the depletion layer. This processing causes the first $P^+$-type regions 30 having high Mg concentration and a thickness of 1 nm or more and 25 nm or less to be formed.

Since the first $P^+$-type regions 30 have high Mg concentration and are thin, the first $P^+$-type regions 30 cause ohmic connections with excellent ohmic characteristics to be achieved between the $N^+$-type regions 28 and the P-type regions 15 by tunnel junctions. Since connection between an anode electrode 35 and an $N^+$-type region 28 and connection between the $N^+$-type region 28 and a P-type region 15 are respectively ohmic contacts, connection between the anode electrode 35 and the P-type region 15 becomes an ohmic connection. It is possible to establish an ohmic connection between each of the anode electrodes 35 and a P-type region 15 via an $N^+$-type region 28 and a first $P^+$-type region 30.

Tenth Embodiment

Figure 27:
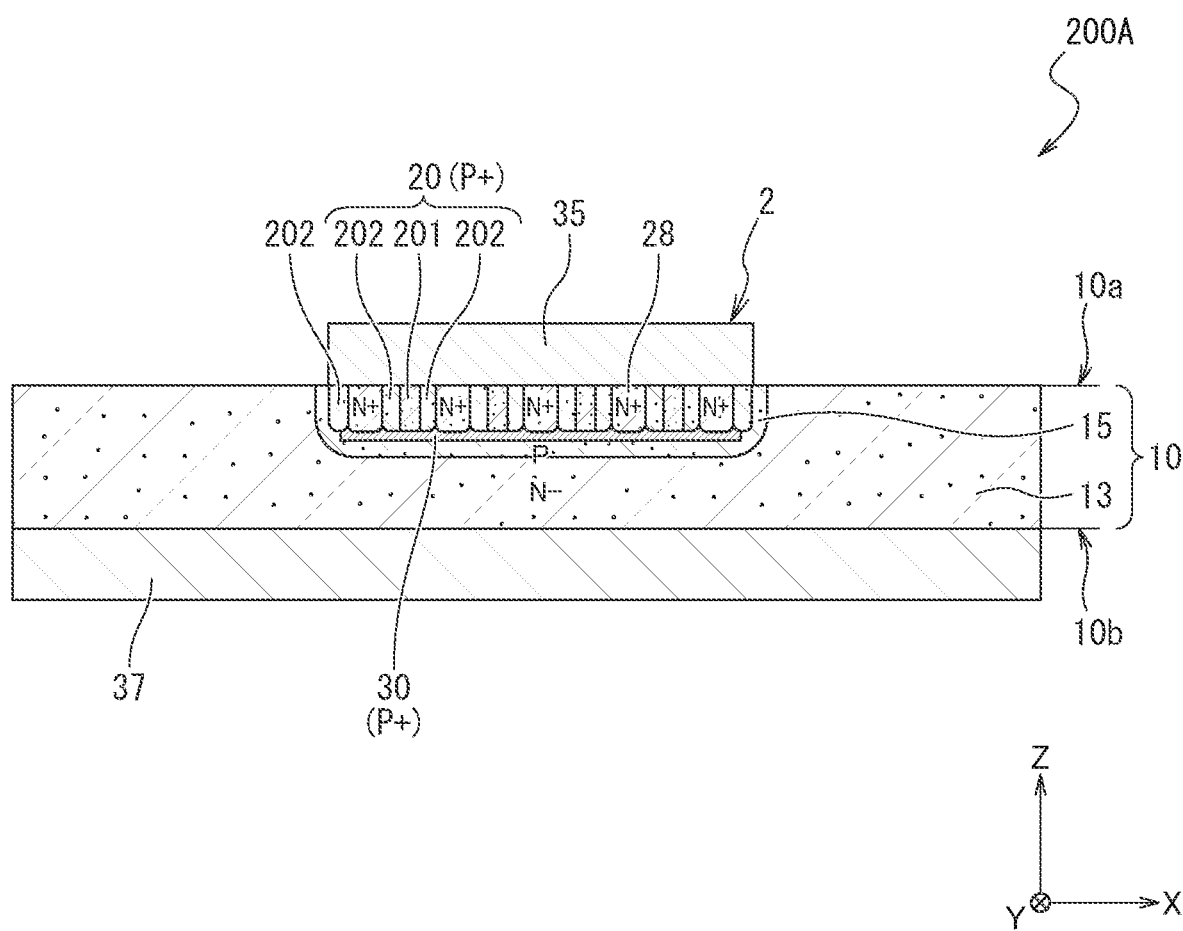
FIG. 27 is a cross-sectional view illustrative of a configuration example of a GaN semiconductor device according to a tenth embodiment of the present invention.

FIG. 27 is a cross-sectional view illustrative of a configuration example of a GaN semiconductor device 200A according to a tenth embodiment of the present invention. As illustrated in FIG. 27, the GaN semiconductor device 200A according to the tenth embodiment includes a GaN substrate 10 and one or more PN diodes 2 that are formed in the GaN substrate 10.

In the GaN semiconductor device 200A, each of the PN diodes 2 includes an $N^-$-type region 13, a P-type region 15, a first $P^+$-type region 30, second $P^+$-type regions 20 that are formed in the GaN substrate 10 and that are in contact with the first $P^+$-type region 30, $N^+$-type regions 28 each of which is in contact with second $P^+$-type regions 20, an anode electrode 35 that is in contact with the second $P^+$-type regions 20 and the $N^+$-type regions 28, and a cathode electrode 37. The P-type region 15, the first $P^+$-type region 30, and the second $P^+$-type regions 20 are an anode region of the PN diode 2. The $N^-$-type region 13 is a cathode region of the PN diode 2.

As illustrated in FIG. 27, second $P^+$-type regions 20 and $N^+$-type regions 28 are alternately arranged in line in the X-axis direction. Because of this configuration, in each second $P^+$-type region 20, depletion layers extend from $N^+$-type regions 28 and second regions 202 that have a higher concentration of an acceptor element (for example, Mg concentration) than a first region 201 are formed.

The GaN semiconductor device 200A according to the tenth embodiment includes the highly concentrated first $P^+$-type regions 30 and second $P^+$-type regions 20. It is possible to establish an ohmic connection between each of the anode electrodes 35 and a P-type region 15 via $N^+$-type regions 28 and a first $P^+$-type region 30. In addition, joining the anode electrode 35 to second $P^+$-type regions 20 enables an anode contact with excellent ohmic characteristics to be achieved between the second $P^+$-type regions 20 and the anode electrode 35. This configuration enables ohmic characteristics of connections between the anode electrodes 35 and the P-type regions 15 to be further improved.

Eleventh Embodiment

Figure 28:
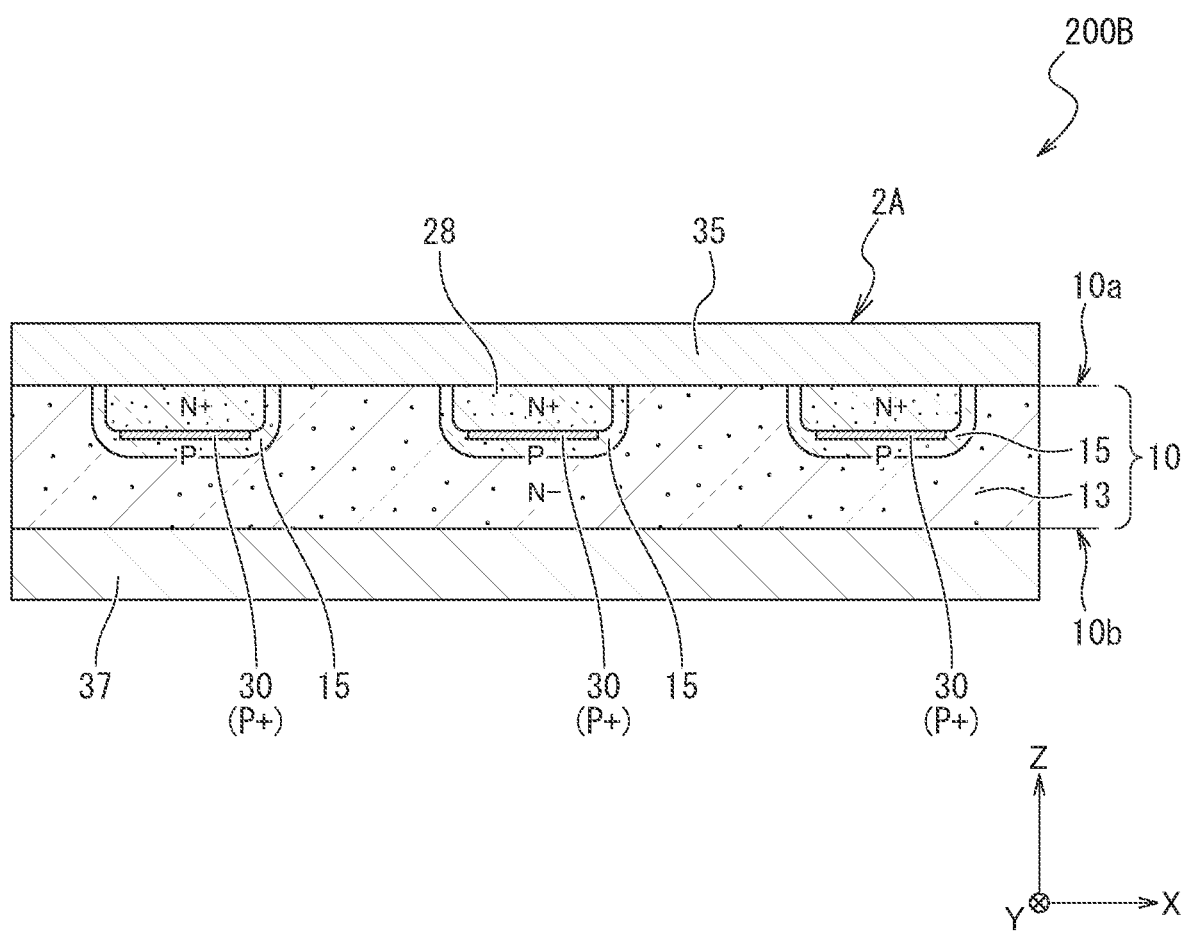
FIG. 28 is a cross-sectional view illustrative of a configuration example of a GaN semiconductor device according to an eleventh embodiment of the present invention.

FIG. 28 is a cross-sectional view illustrative of a configuration example of a GaN semiconductor device 200B according to the eleventh embodiment of the present invention. As illustrated in FIG. 28, the GaN semiconductor device 200B according to the eleventh embodiment includes a GaN substrate 10 and a merged PiN Schottky (MPS) diode 2A that is formed in the GaN substrate 10. The MPS diode 2A is an element that is formed by combining a PN diode and a Schottky diode.

The MPS diode 2A includes an N$^-$-type region 13 that is formed in the GaN substrate 10, a plurality of P-type regions 15 that are formed in the GaN substrate 10 and that are in contact with the N$^-$-type region 13, first P$^+$-type regions 30 that are formed in the GaN substrate 10 and each of which is in contact with a P-type region 15, N$^+$-type regions 28 that are formed in the GaN substrate 10 and each of which is in contact with a P-type region 15 and a first P$^+$-type region 30, an anode electrode 35 that is formed on the front surface 10$a$ side of the GaN substrate 10 and that is in contact with the N$^-$-type region 13, the P-type regions 15, and the N$^+$-type regions 28, and a cathode electrode 37 that is formed on the back surface 10$b$ side of the GaN substrate 10 and that is in contact with the N$^-$-type region 13.

As illustrated in FIG. 28, the plurality of P-type regions 15 are arranged separated from each other. Between one and the other of a pair of P-type regions 15 that are adjacent to each other, the N$^-$-type region 13 is arranged. Since the first P$^+$-type regions 30 have high Mg concentration and are thin, each of the first P$^+$-type regions 30 causes an ohmic connection to be achieved between an N$^+$-type region 28 and a P-type region 15 by a tunnel junction. In addition, contacts between the anode electrode 35 and the N$^+$-type regions 28 are ohmic contacts.

A PN diode is constituted by the anode electrode 35, the N$^+$-type regions 28, the first P$^+$-type regions 30, the P-type regions 15, the N$^-$-type region 13, and the cathode electrode 37. The P-type regions 15 are an anode region of the PN diode. The N$^-$-type region 13 is a cathode region of the PN diode.

In addition, connection between the anode electrode 35 and the N$^-$-type region 13 is a Schottky connection. A Schottky diode is constituted by the anode electrode 35, the N$^-$-type region 13, and the cathode electrode 37.

A material of which the anode electrode 35 is made and a material of which the cathode electrode 37 is made may be the same material as each other or materials different from each other. For example, the anode electrode 35 is made of any one material of nickel (Ni), platinum (Pt), and palladium (Pd). The cathode electrode 37 is made of Al, an alloy of Al—Si, or titanium (Ti).

As illustrated in FIG. 28, in the MPS diode 2A, the second P$^+$-type regions 20 and the N$^+$-type regions 28 are alternately arranged in line in the X-axis direction. Because of this configuration, in each second P$^+$-type region 20, depletion layers extend from N$^+$-type regions 28 and second regions 202 that have a higher concentration of an acceptor element (for example, Mg concentration) than a first region 201 are formed.

The GaN semiconductor device 200B according to the eleventh embodiment, as with the GaN semiconductor device 200 according to the ninth embodiment, includes the highly concentrated first P$^+$-type regions 30 in which segregation of Mg is suppressed. It is possible to establish ohmic connections between the anode electrode 35 and the P-type regions 15 via the N$^+$-type regions 28 and the first P$^+$-type regions 30.

Twelfth Embodiment

Figure 29:
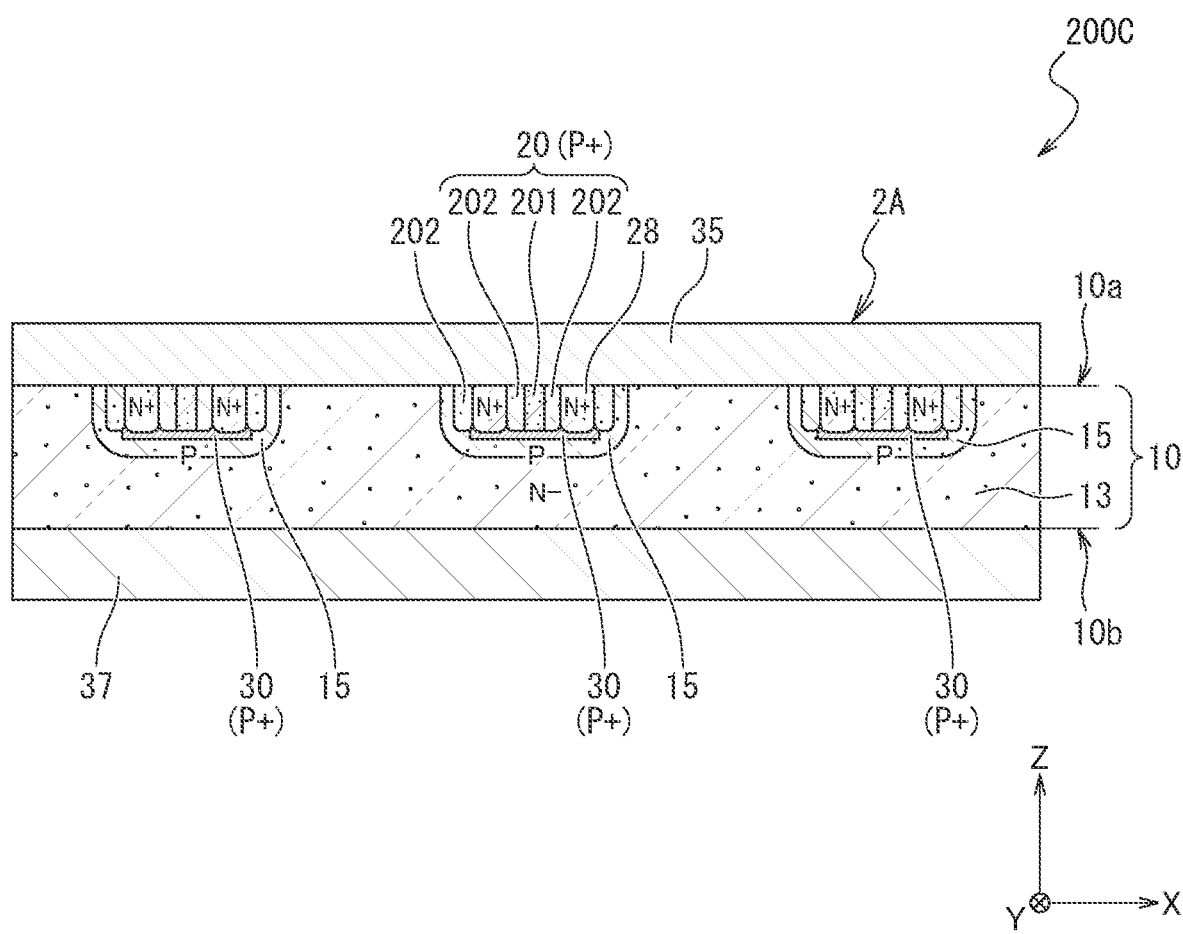
FIG. 29 is a cross-sectional view illustrative of a configuration example of a GaN semiconductor device according to a twelfth embodiment of the present invention.

FIG. 29 is a cross-sectional view illustrative of a configuration example of a GaN semiconductor device 200C according to a twelfth embodiment of the present invention. As illustrated in FIG. 29, the GaN semiconductor device 200C according to the twelfth embodiment includes a GaN substrate 10 and an MPS diode 2A that is formed in the GaN substrate 10.

In the GaN semiconductor device 200C, the MPS diode 2A includes an N$^-$-type region 13, a plurality of P-type regions 15, a plurality of first P$^+$-type regions 30, a plurality of second P$^+$-type regions 20 that are formed in the GaN substrate 10 and each of which is in contact with a first P$^+$-type region 30, a plurality of N$^+$-type regions 28 each of which is in contact with second P$^+$-type regions 20, an anode electrode 35 that is in contact with the N$^-$-type region 13, the N$^+$-type regions 28, and the second P$^+$-type regions 20, and a cathode electrode 37.

As illustrated in FIG. 29, the plurality of P-type regions 15 are arranged separated from each other. Between one and the other of a pair of P-type regions 15 that are adjacent to each other, the N$^-$-type region 13 is arranged. Connection between the anode electrode 35 and the second P$^+$-type regions 20 and connection between the N$^-$-type region 13 and the cathode electrode 37 are respectively ohmic connections. Since the first P$^+$-type regions 30 have high Mg concentration and small variation in the Mg concentration, it is possible to connect an N$^+$-type region 28 and a P-type region 15 by a tunnel junction. This configuration enables ohmic connections to be achieved between the anode electrode 35 and the P-type regions 15.

A PN diode is constituted by the anode electrode 35, the first P$^+$-type regions 30, the second P$^+$-type regions 20, the P-type regions 15, the N$^-$-type region 13, and the cathode electrode 37. The P-type regions 15, the first P$^+$-type regions 30, and the second P$^+$-type regions 20 are an anode region of the PN diode. The N$^-$-type region 13 is a cathode region of the PN diode.

In addition, connection between the anode electrode 35 and the N$^-$-type region 13 is a Schottky connection. A Schottky diode is constituted by the anode electrode 35, the N$^-$-type region 13, and the cathode electrode 37.

As illustrated in FIG. 29, in the MPS diode 2A, the second P$^+$-type regions 20 and the N$^+$-type regions 28 are also alternately arranged in line in the X-axis direction. Because of this configuration, in each second P$^+$-type region 20, depletion layers extend from N$^+$-type regions 28 and second regions 202 that have a higher concentration of an acceptor element (for example, Mg concentration) than a first region 201 are formed.

The GaN semiconductor device 200C according to the twelfth embodiment, as with the GaN semiconductor device 200A according to the tenth embodiment, includes the highly concentrated first P$^+$-type regions 30 and second P$^+$-type regions 20. It is possible to establish ohmic connections between the anode electrode 35 and the P-type regions 15 via the N$^+$-type regions 28 and the first P$^+$-type regions 30. In addition, joining the anode electrode 35 to the second P$^+$-type regions 20 enables an anode contact with excellent ohmic characteristics to be achieved between the second P$^+$-type regions 20 and the anode electrode 35. This configuration enables ohmic characteristics of connections between the anode electrode 35 and the P-type regions 15 to be further improved.

Thirteenth Embodiment

In the above-described embodiments, it was described that an electrode (for example, a source electrode 25 or an anode electrode 35) of the present invention was formed on an N-type region (for example, an N$^+$-type source region 18 or an N$^+$-type region 28). However, an arrangement of an electrode of the present invention is not limited to the above description. An electrode of the present invention may penetrate an N-type region and come into contact with a first P-type region (for example, a first P+-type region 30). Such a mode can be achieved in both a MOSFET and a diode.

Figure 30:
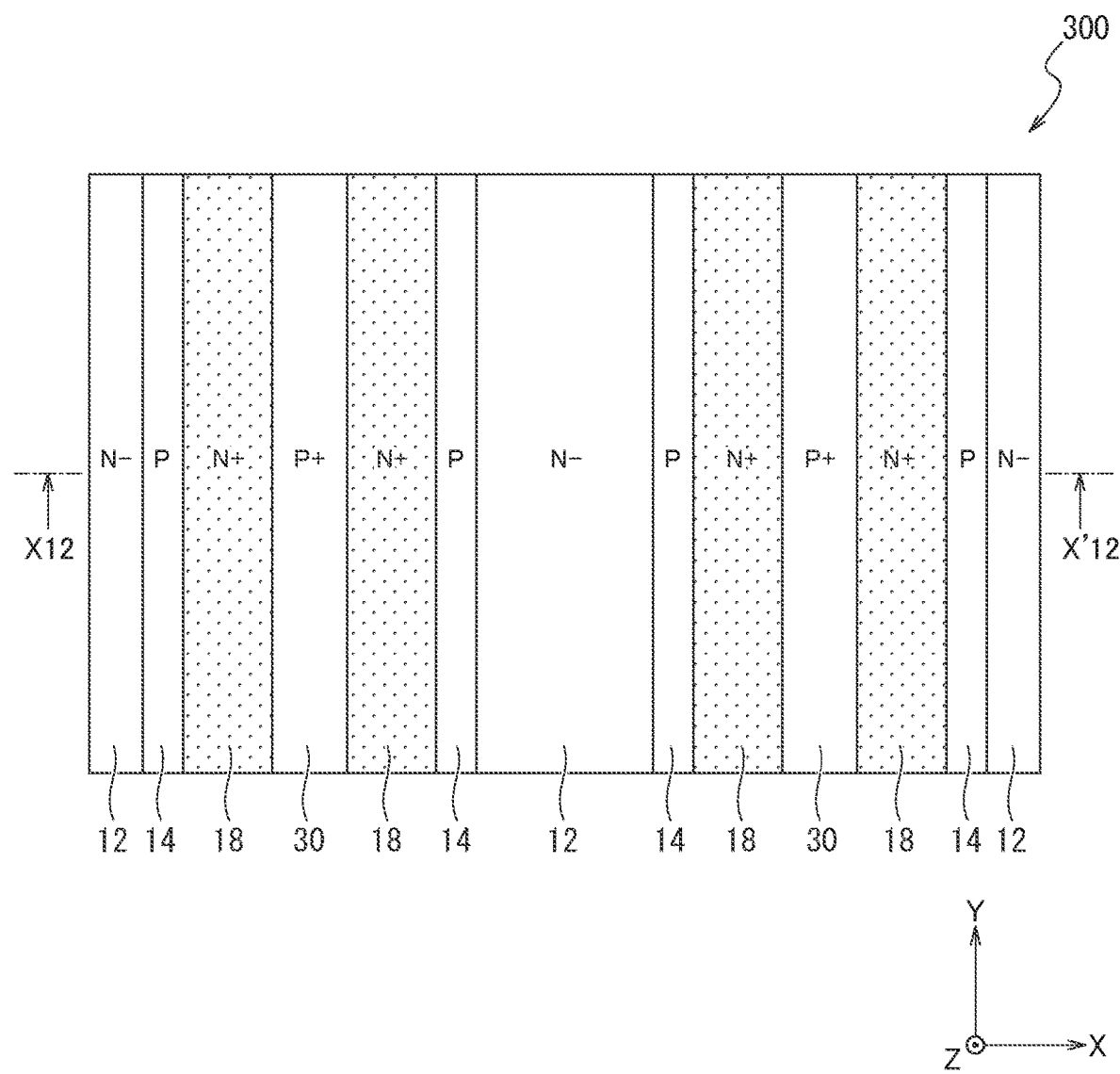
FIG. 30 is a plan view illustrative of a configuration example of a GaN semiconductor device according to a thirteenth embodiment of the present invention.
Figure 31:
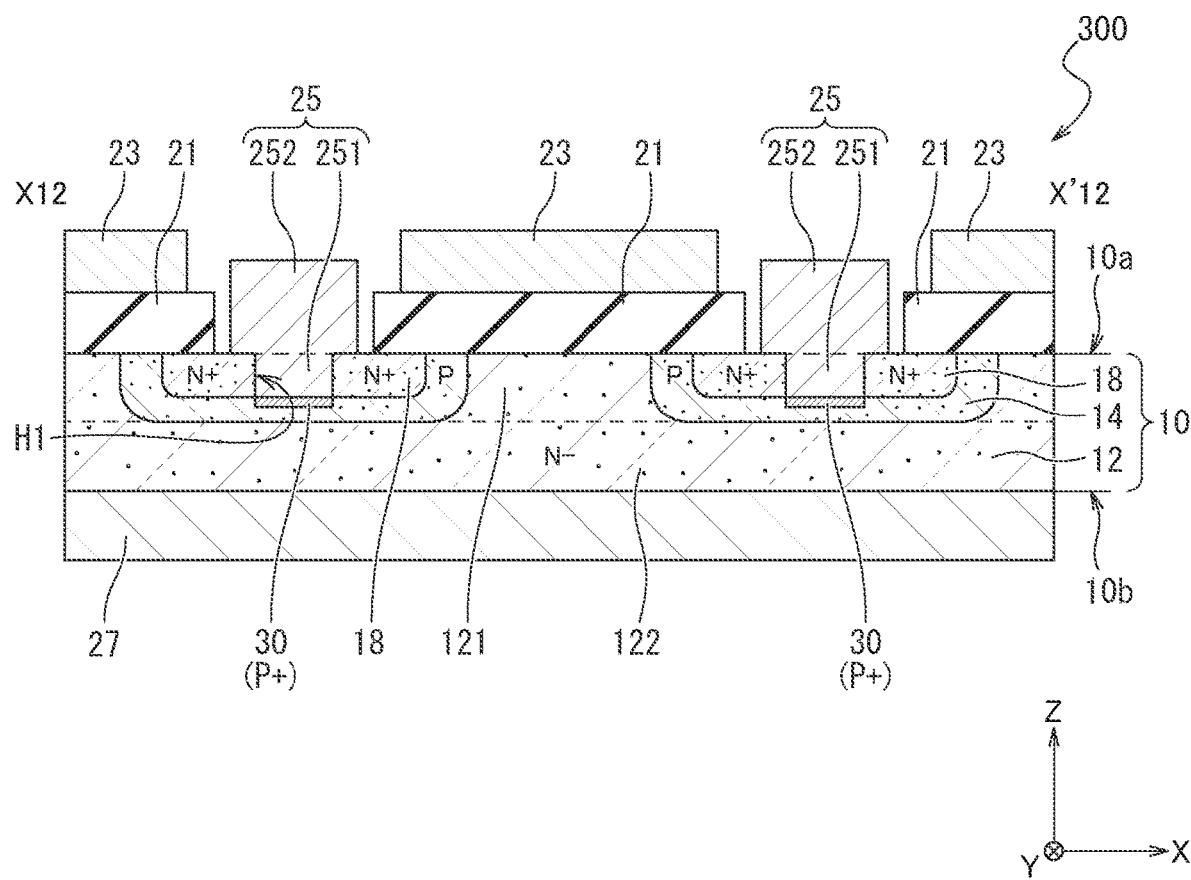
FIG. 31 is a cross-sectional view illustrative of the configuration example of the GaN semiconductor device according to the thirteenth embodiment of the present invention.

FIG. 30 is a plan view illustrative of a configuration example of a GaN semiconductor device 300 according to a thirteenth embodiment of the present invention. FIG. 31 is a cross-sectional view illustrative of the configuration example of the GaN semiconductor device 300 according to the thirteenth embodiment of the present invention. FIG. 31 illustrates a cross-section of the plan view in FIG. 30 taken along the line X12-X'12 thereof. Note that, in FIG. 30, as with FIG. 2 described in the first embodiment, in order to illustrate shapes of N+-type source regions 18 and the like as viewed in plan from the Z-axis direction, illustrations of a gate pad 112 and a source pad 114 (see FIG. 1) and gate electrodes 23 and source electrodes 25 (see FIG. 31) are omitted.

As illustrated in FIGS. 30 and 31, the GaN semiconductor device 300 includes, as constituent components of a vertical MOSFET, an N−-type drift region 12, P-type well regions 14, N+-type source regions 18, and first P+-type regions 30 that are formed in a GaN substrate 10, a gate insulating film 21 that is formed on a front surface 10a of the GaN substrate 10, a gate electrode 23 that is formed on the gate insulating film 21, source electrodes 25 that are formed on the front surface 10a side of the GaN substrate 10 and that are electrically connected to the N+-type source regions 18 and the first P+-type regions 30, and a drain electrode 27 that is formed on the back surface 10b side of the GaN substrate 10 and that is electrically connected to the drift region 12.

As illustrated in FIG. 31, in the GaN semiconductor device 300, each source electrode 25 is formed on an N+-type source region 18, and penetrates a portion of the N+-type source region 18 and comes into contact with a first P+-type region 30. For example, on each of the first P+-type regions 30, a through-hole H1 that penetrates an N+-type source region 18 in the thickness direction (for example, the Z-axis direction) is formed. A source electrode 25 has a first portion 251 that is arranged in the through-hole H1 and that comes into contact with the first P+-type region 30 at the bottom surface of the through-hole H1 and a second portion 252 that is arranged on the front surface 10a of the GaN substrate 10 and that comes into contact with the N+-type source region 18. The first portion 251 and the second portion 252 are in contact with each other.

The first portion 251 and the second portion 252 are formed of a material that is capable of forming ohmic contacts with a first P+-type region 30 and an N+-type source region 18 and formed of, for example, Al or an alloy of Al—Si. The first portion 251 and the second portion 252 may be formed of materials identical to each other or may be formed of materials different from each other. The first portion 251 and the second portion 252 may be integrally formed. That is, the first portion 251 and the second portion 252 may be formed at the same time by the same process.

Figure 32A:
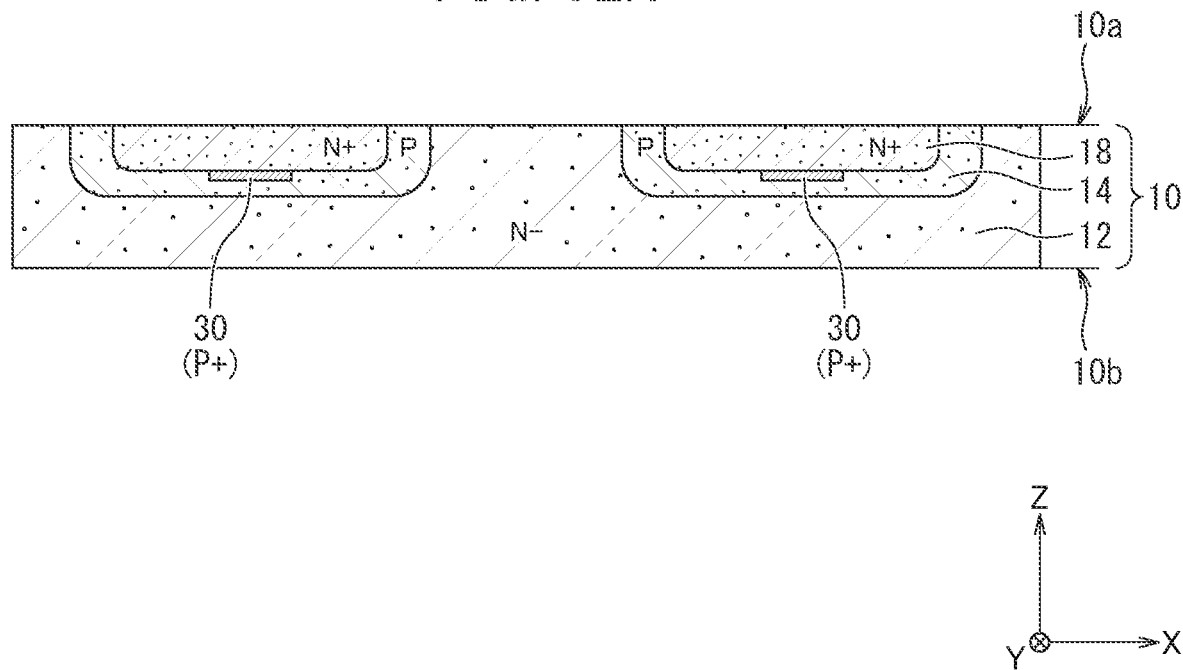
FIG. 32A is a cross-sectional view illustrative of a method for manufacturing the GaN semiconductor device according to the thirteenth embodiment of the present invention in the sequence of steps.
Figure 32B:
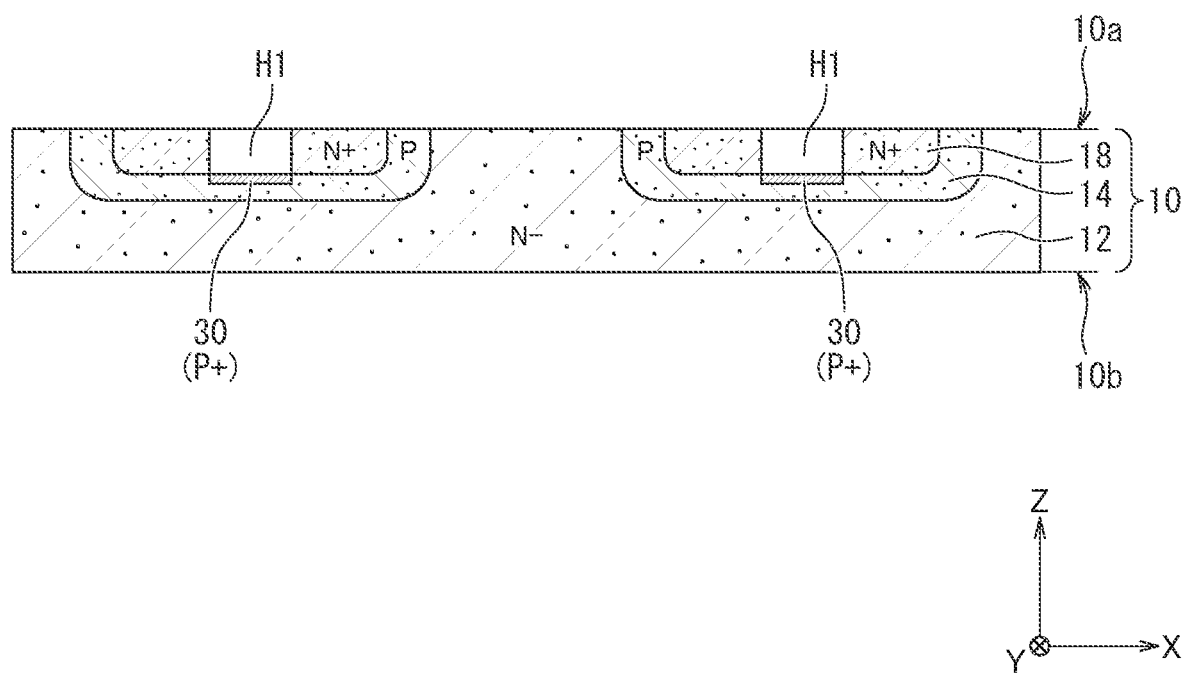
FIG. 32B is another cross-sectional view illustrative of the method for manufacturing the GaN semiconductor device according to the thirteenth embodiment of the present invention in the sequence of steps.
Figure 32C:
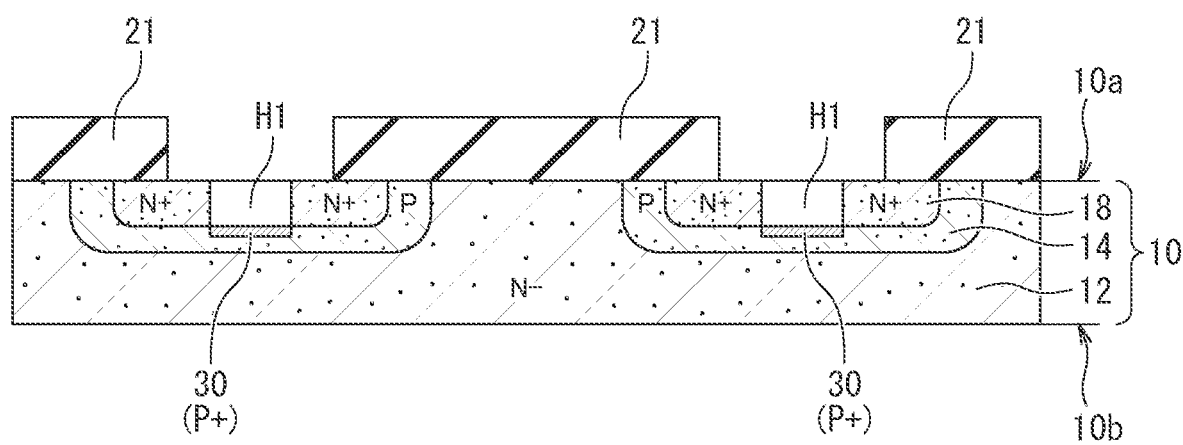
FIG. 32C is still another cross-sectional view illustrative of the method for manufacturing the GaN semiconductor device according to the thirteenth embodiment of the present invention in the sequence of steps.
Figure 32C:
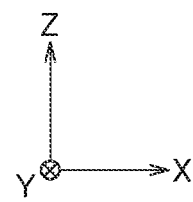
Figure 33:
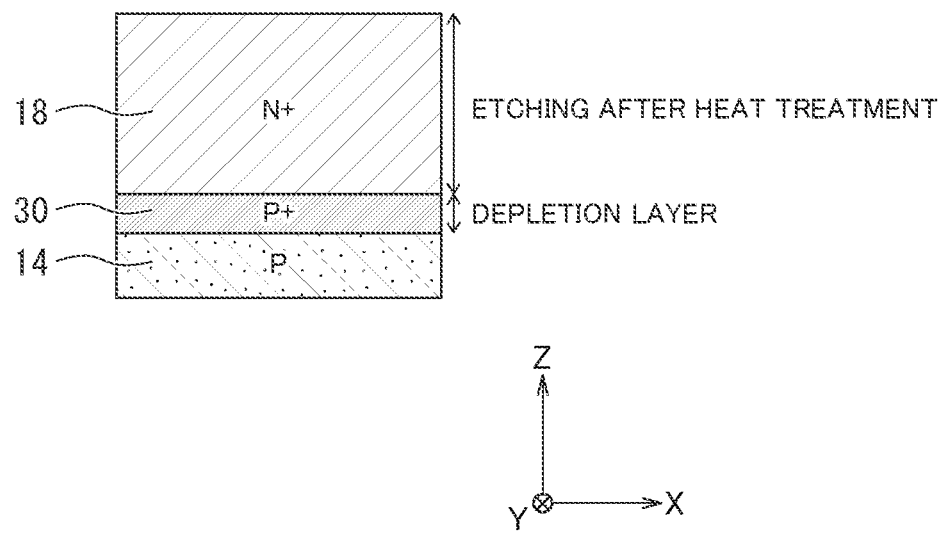
FIG. 33 is a cross-sectional view illustrative of an $N^+$-type source region, a first $P^+$-type region, and a P-type well region in FIG. 32A in an enlarged manner.
Figure 34:
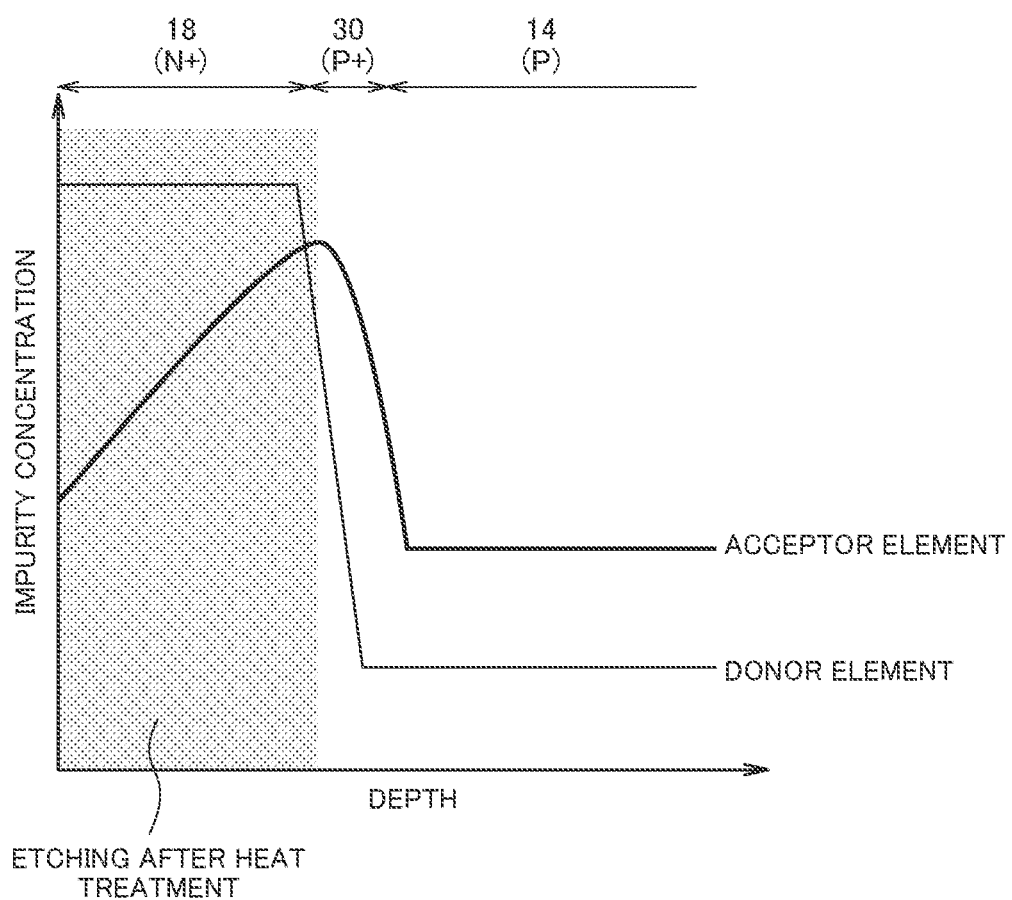
FIG. 34 is a graph schematically illustrative of impurity concentration distributions in the depth direction of the $N^+$-type source region, the first $P^+$-type region, and the P-type well region after heat treatment for activating Mg was performed.

FIGS. 32A to 32C are cross-sectional views illustrative of a method for manufacturing the GaN semiconductor device 300 according to the thirteenth embodiment of the present invention in the sequence of steps. FIG. 33 is a cross-sectional view illustrative of an N+-type source region 18, a first P+-type region 30, and a P-type well region 14 in FIG. 32A in an enlarged manner. FIG. 34 is a graph schematically illustrative of impurity concentration distributions in the depth direction of the N+-type source region 18, the first P+-type region 30, and the P-type well region 14 after heat treatment for activating Mg was performed.

As illustrated in FIG. 32A, a manufacturing apparatus forms the P-type well regions 14, the N+-type source regions 18, and the first P+-type regions 30 in the GaN substrate 10, using a similar method to that in the first embodiment.

That is, in a step of forming the first P+-type regions 30, a depletion layer is formed in each region that is a portion of a P-type well region 14 and that is located under an N+-type source region 18. The manufacturing apparatus implants ions of Mg into a portion of the region in which a depletion layer is formed, as an acceptor element. In the ion implantation step, Mg implantation energy (acceleration voltage) is set in such a way that the first P+-type regions 30 are formed under the N+-type source regions 18. In addition, in the ion implantation step, a dose amount of Mg is set in such a way that Mg concentration in the first P+-type regions 30 has a value equal to or less than Si concentration in the N+-type source regions 18. For example, the dose amount of Mg is set in such a way that Mg concentration in the first P+-type regions 30 is $1\times10^{19}$ cm$^{-3}$ or more and $1\times10^{21}$ cm$^{-3}$ or less.

Next, the manufacturing apparatus forms a protective film 53 (see FIG. 4D) and subjects the GaN substrate 10 covered by the protective film 53 to heat treatment the maximum temperature of which is 1300° C. or more and 2000° C. or less. Since the Fermi-level Ef of the region located under an N+-type source region 18 is controlled not to come close to the valence band by a depletion layer being formed, Mg becomes easy to be activated and to function as acceptors in the region. Since this configuration enables segregation of Mg due to heat treatment to be suppressed and decrease in Mg concentration and variation in Mg concentration due to Mg segregation to be suppressed, it is possible to form the highly concentrated first P+-type regions 30. After the first P+-type regions 30 were formed, the manufacturing apparatus removes the protective film 53 from the front surface 10a of the GaN substrate 10.

Note that, as illustrated in FIG. 33, a depletion layer generated in each of the first P+-type regions 30 by the first P+-type region coming into contact with an N+-type source region 18 preferably extends to the whole in the thickness direction of the first P+-type region 30. This configuration causes decrease in Mg concentration due to Mg segregation to be suppressed in the whole in the thickness direction of the first P+-type region 30.

Next, as illustrated in FIG. 32B, the manufacturing apparatus forms a mask (not illustrated) on the front surface 10a of the GaN substrate 10 and removes regions in the N+-type source regions 18 that are exposed from the mask by etching. The mask is, for example, a resist pattern or a hard mask made of an insulating film, such as a SiO₂ film. Through this processing, the manufacturing apparatus forms the through-holes H1 in the N+-type source regions 18, as illustrated in FIG. 32B. After having formed the through-holes H1, the manufacturing apparatus removes the mask.

As illustrated in FIG. 34, concentration of a donor element is higher than concentration of an acceptor element in an N+-type source region 18, and concentration of an acceptor element (for example, Mg) is higher than concentration of a donor element in a first P+-type region 30. Removing a portion of the N+-type source region 18 by etching (for example, forming a through-hole H1) after heat treatment for activating Mg enables a surface of the first P+-type region 30 of high concentration of dopants (for example, Mg concentration is $1\times10^{19}$ cm$^{-3}$ or more and $1\times10^{21}$ cm$^{-3}$ or less), in which segregation of Mg is suppressed and decrease in Mg concentration and variation in Mg concentration due to Mg segregation are suppressed, to be exposed.

Next, the manufacturing apparatus forms a gate insulating film on the front surface 10a of the GaN substrate 10. For example, the manufacturing apparatus forms a material film (for example, $SiO_2$ film) that serves as gate insulating films on the front surface 10a of the GaN substrate 10, forms a mask (not illustrated) on the material film, and removes portions in the material film that are exposed from the mask by etching. The mask has a shape that covers formation regions of gate insulating films and that exposes the other regions (for example, the through-holes H1 and portions of the $N^+$-type source regions 18 located in the peripheries of the through-holes H1). The mask is, for example, a resist pattern or a hard mask made of a material different from the gate insulating films. Through this processing, the manufacturing apparatus forms the gate insulating films 21 on the front surface 10a of the GaN substrate 10, as illustrated in FIG. 32C.

Next, in FIG. 32C, the manufacturing apparatus forms a conductive film (not illustrated) on the front surface 10a of the GaN substrate 10 and fills the through-holes H1 with the conductive film. The conductive film is a material film that is capable of forming ohmic contacts with the first $P^+$-type regions 30 and the $N^+$-type source regions 18 and is, for example, an Al film or an alloy film of Al—Si. Next, the manufacturing apparatus forms a mask (not illustrated) on the conductive film and removes portions in the conductive film that are exposed from the mask by etching. Through this processing, the manufacturing apparatus forms the gate electrodes 23 and the source electrodes 25 (see FIG. 31) on the front surface 10a of the GaN substrate 10. Through the above-described steps, the GaN semiconductor device 300 including vertical MOSFETs (see FIG. 31) is completed.

As described in the foregoing, according the the method for manufacturing the GaN semiconductor device 300 according to the thirteenth embodiment, by controlling the Fermi-levels Ef of regions in which the first $P^+$-type regions 30 are to be formed (that is, the first $P^+$-type formation regions) to come close to the conduction bands Ec, using the $N^+$-type source regions 18 and performing heat treatment while the first $P^+$-type formation regions are in this state, the highly concentrated first $P^+$-type regions 30 are formed. Next, portions of the $N^+$-type source regions 18 are removed and front surfaces of the first $P^+$-type regions 30 are thereby exposed, and the first portions 251 of the source electrodes 25 are formed in such a way as to come into contact with the exposed surfaces.

Each of the first $P^+$-type regions 30 has a high concentration of dopants (for example, Mg concentration is $1\times10^{19}$ $cm^{-3}$ or more and $1\times10^{21}$ $cm^{-3}$ or less) and is in contact with the first portion 251 of a source electrode 25. Because of this configuration, it is possible to achieve an ohmic connection between the first portion 251 of each of the source electrodes 25 and a first $P^+$-type region 30 and achieve an ohmic connection between the first portion 251 of the source electrode 25 and a P-type well region 14 via the first $P^+$-type region 30.

Fourteenth Embodiment

Figure 35:
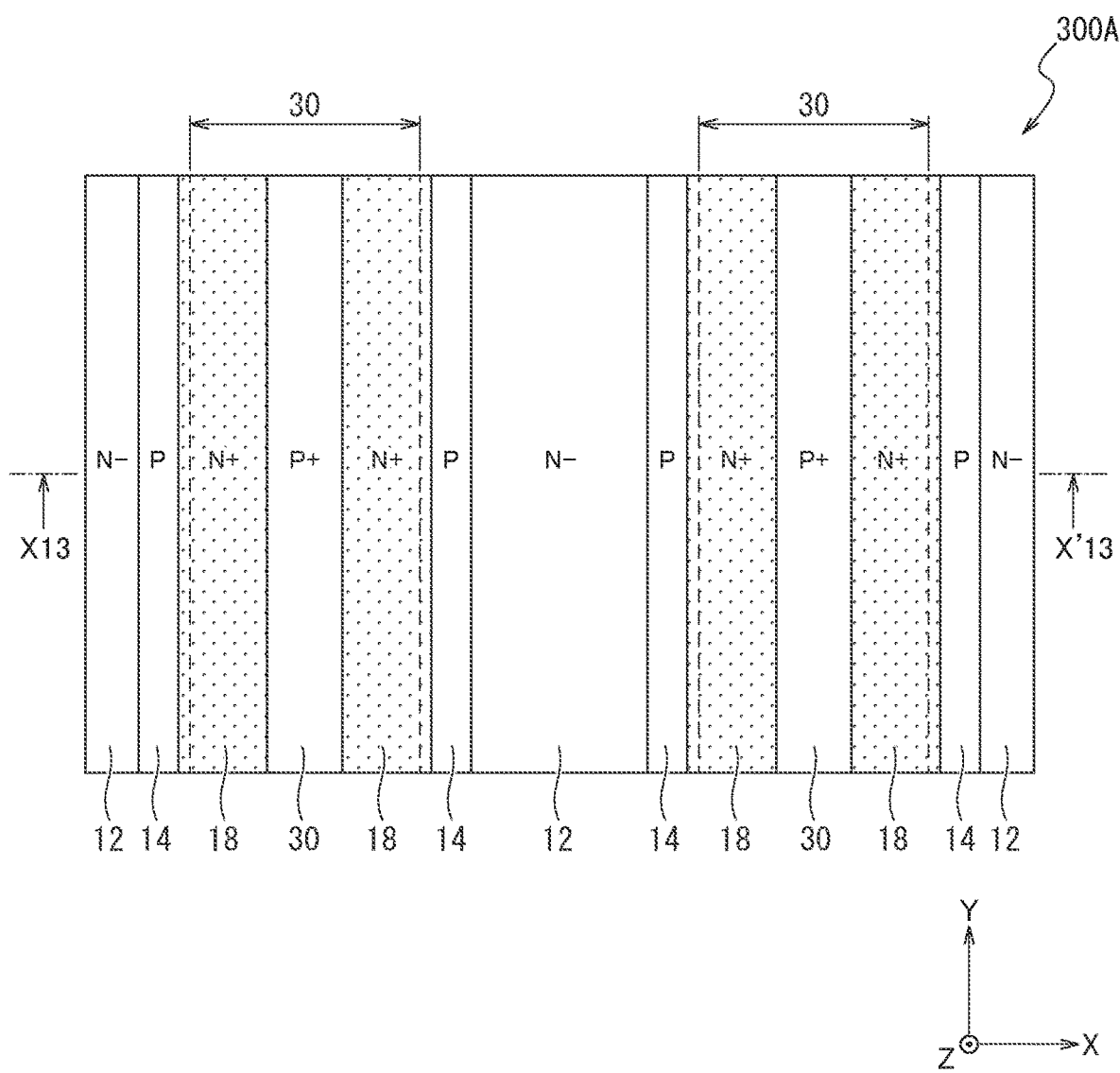
FIG. 35 is a plan view illustrative of a configuration example of a GaN semiconductor device according to a fourteenth embodiment of the present invention.
Figure 36:
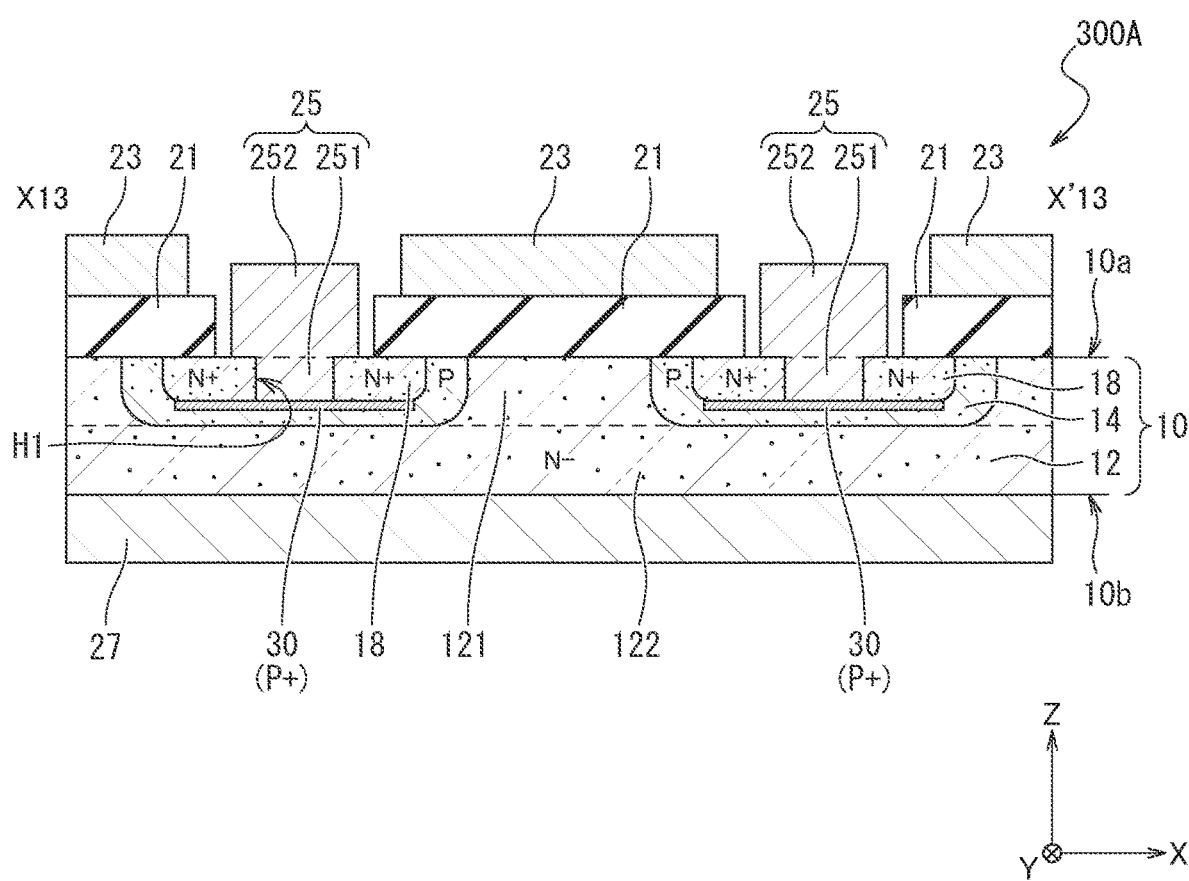
FIG. 36 is a cross-sectional view illustrative of the configuration example of the GaN semiconductor device according to the fourteenth embodiment of the present invention.

FIG. 35 is a plan view illustrative of a configuration example of a GaN semiconductor device 300A according to a fourteenth embodiment of the present invention. FIG. 36 is a cross-sectional view illustrative of the configuration example of the GaN semiconductor device 300A according to the fourteenth embodiment of the present invention. FIG. 36 illustrates a cross-section of the plan view in FIG. 35 taken along the line X13-X'13 thereof. Note that, in FIG. 35, as with FIG. 30 described in the thirteenth embodiment, illustrations of a gate pad 112 and a source pad 114 (see FIG. 1) and gate electrodes 23 and source electrodes 25 (see FIG. 36) are omitted.

As illustrated in FIGS. 35 and 36, the GaN semiconductor device 300A according to the fourteenth embodiment differs from the GaN semiconductor device 300 according to the thirteenth embodiment (see FIGS. 30 and 31) in an arrangement of first $P^+$-type regions 30. As illustrated in FIGS. 35 and 36, in the GaN semiconductor device 300A, each of the first $P^+$-type regions 30 of high concentration of dopants (for example, Mg concentration is $1\times10^{19}$ $cm^{-3}$ or more and $1\times10^{21}$ $cm^{-3}$ or less) is extended from a region under a first portion 251 of a source electrode 25 to regions under $N^+$-type source regions 18. The first $P^+$-type region 30 is formed respectively between the first portion 251 of the source electrode 25 and a P-type well region 14 and between the $N^+$-type source regions 18 and the P-type well region 14.

According to the GaN semiconductor device 300A according to the fourteenth embodiment, as with the thirteenth embodiment, since the first portion 251 of each of the source electrodes 25 and a highly concentrated first $P^+$-type region 30 are in contact with each other, it is possible to achieve an ohmic connection between the first portion 251 of the source electrode 25 and the first $P^+$-type region 30. It is possible to achieve an ohmic connection between the first portion 251 of the source electrode 25 and a P-type well region 14 via the first $P^+$-type region 30.

In addition, according to the GaN semiconductor device 300A, as with the first embodiment, it is possible to connect each of the $N^+$-type source regions 18 and a P-type well region 14 by a tunnel junction via a highly concentrated first $P^+$-type region 30. The tunnel junctions enable ohmic connections to be achieved between the source electrodes 25 and the well regions 14.

According to the GaN semiconductor device 300A, since formation of an ohmic connection by a tunnel junction is added to the configuration of the thirteenth embodiment, it is possible to further improve ohmic characteristics of connections between source electrodes 25 and the P-type well regions 14.

Fifteenth Embodiment

Figure 37:
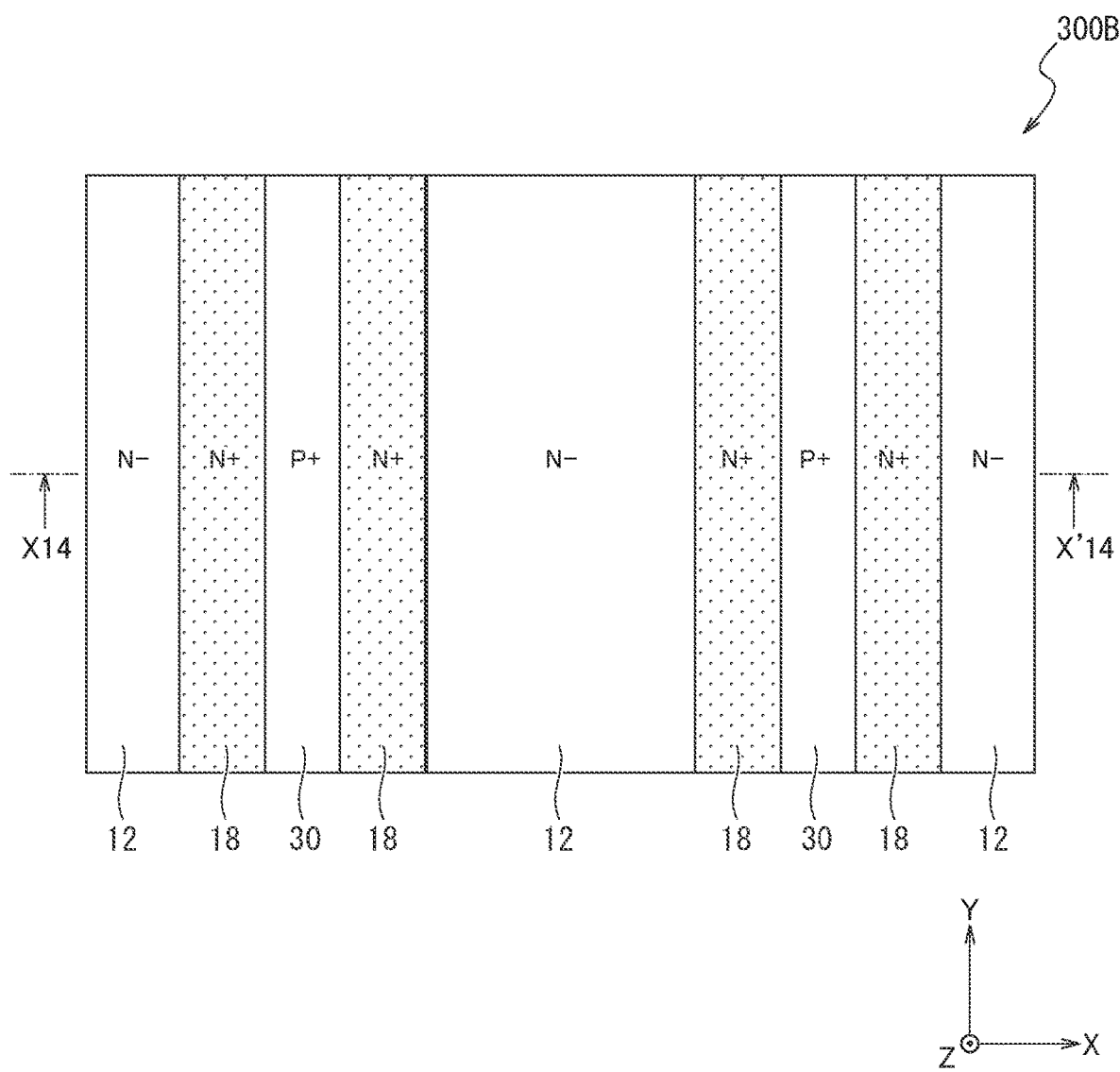
FIG. 37 is a plan view illustrative of a configuration example of a GaN semiconductor device according to a fifteenth embodiment of the present invention.
Figure 38:
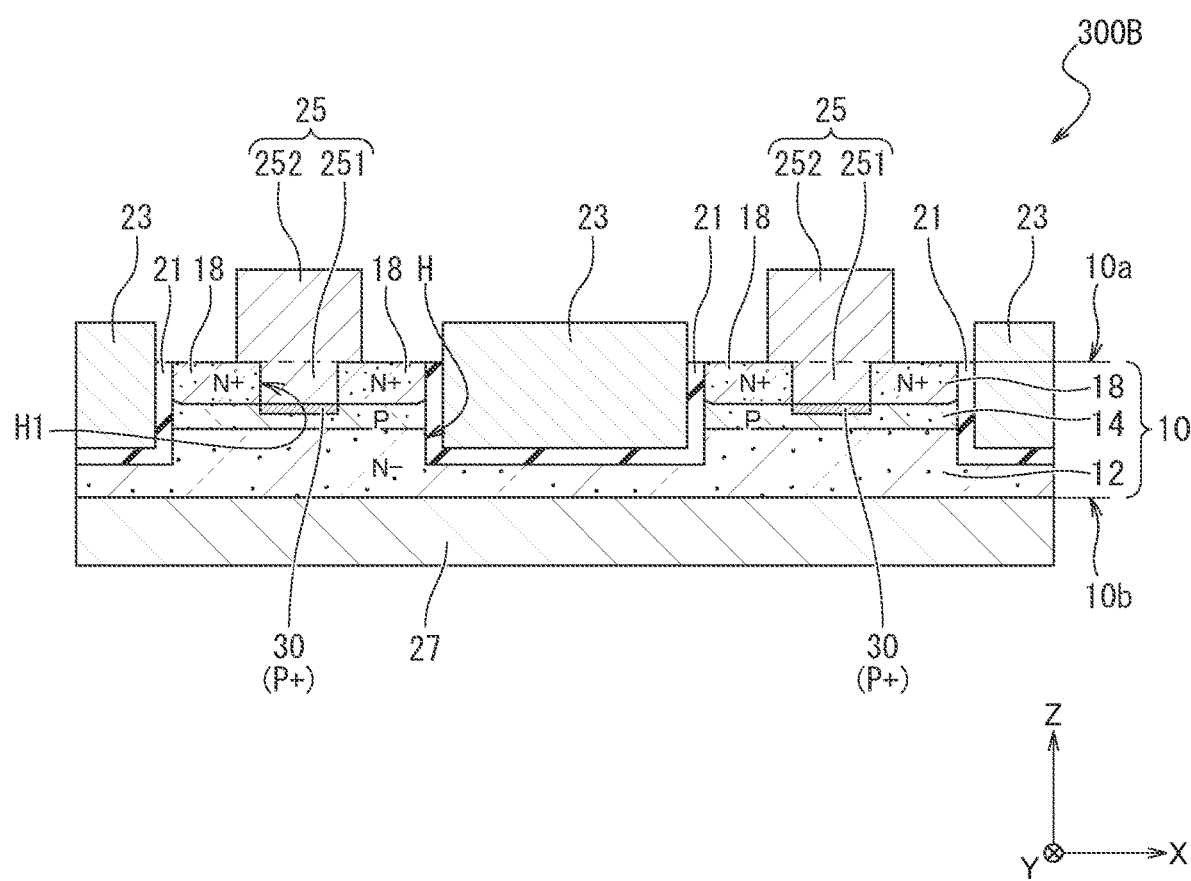
FIG. 38 is a cross-sectional view illustrative of the configuration example of the GaN semiconductor device according to the fifteenth embodiment of the present invention.

FIG. 37 is a plan view illustrative of a configuration example of a GaN semiconductor device 300B according to a fifteenth embodiment of the present invention. FIG. 38 is a cross-sectional view illustrative of the configuration example of the GaN semiconductor device 300B according to the fifteenth embodiment of the present invention. FIG. 38 illustrates a cross-section of the plan view in FIG. 37 taken along the line X14-X'14 thereof. Note that, in FIG. 37, as with FIG. 30 described in the thirteenth embodiment, illustrations of a gate pad 112 and a source pad 114 (see FIG. 1) and gate electrodes 23 and source electrodes 25 (see FIG. 38) are omitted.

As illustrated in FIGS. 37 and 38, the GaN semiconductor device 300B according to the fifteenth embodiment differs from the GaN semiconductor device 300 according to the thirteenth embodiment (see FIGS. 30 and 31) in a gate structure of vertical MOSFETs. In the thirteenth embodiment, a case where vertical MOSFETs are planar was described. In the fifteenth embodiment, a case where vertical MOSFETs are of trench gate type is described.

As illustrated in FIG. 38, the GaN semiconductor device 300B according to the fifteenth embodiment has trenches H formed on a GaN substrate 10. The trenches H open on the front surface 10a side of the GaN substrate 10. The trenches H are formed deeper than P-type well regions 14, and bottom portions of the trenches H reach an N⁻-type drift region 12.

On the inside of each of the trenches H, a gate insulating film 21 and a gate electrode 23 are arranged. The side surfaces and the bottom surface on the inside of the trench H are covered by the gate insulating film 21. In addition, the gate electrode 23 is embedded in the trench H with the gate insulating film 21 interposed therebetween. In a trench gate structure, a region that is within a well region 14 and that faces a gate electrode 23 with a gate insulating film 21 interposed therebetween serves as a channel region of a vertical MOSFET.

Since, in the GaN semiconductor device 300B according to the fifteenth embodiment, as with the thirteenth embodiment, a first portion 251 of each source electrode 25 and a highly concentrated first P⁺-type region 30 are in contact with each other, it is possible to achieve an ohmic connection between the first portion 251 of the source electrode 25 and the first P⁺-type region 30. It is possible to achieve an ohmic connection between the first portion 251 of each of the source electrodes 25 and a P-type well region 14 via a first P⁺-type region 30. In addition, employing the trench gate structure for vertical MOSFETs enables channel regions to be arranged more closely, which facilitates miniaturization of elements.

Note that the configuration of the fourteenth embodiment may be added to the GaN semiconductor device 300B as a variation thereof. That is, in the GaN semiconductor device 300B illustrated in FIGS. 37 and 38, each of the first P⁺-type regions 30 of high concentration of dopants may be extended from a region under a first portion 251 of a source electrode 25 to regions under N⁺-type source regions 18. The first P⁺-type region 30 may be formed respectively between the first portion 251 of the source electrode 25 and a P-type well region 14 and between the N⁺-type source regions 18 and the P-type well region 14.

This variation causes an ohmic connection to be achieved between each of the N⁺-type source regions 18 and a P-type well region 14 by a tunnel junction. This configuration, as with the fourteenth embodiment, enables ohmic characteristics of connections between the source electrodes 25 and the P-type well regions 14 to be further improved.

Sixteenth Embodiment

Figure 39:
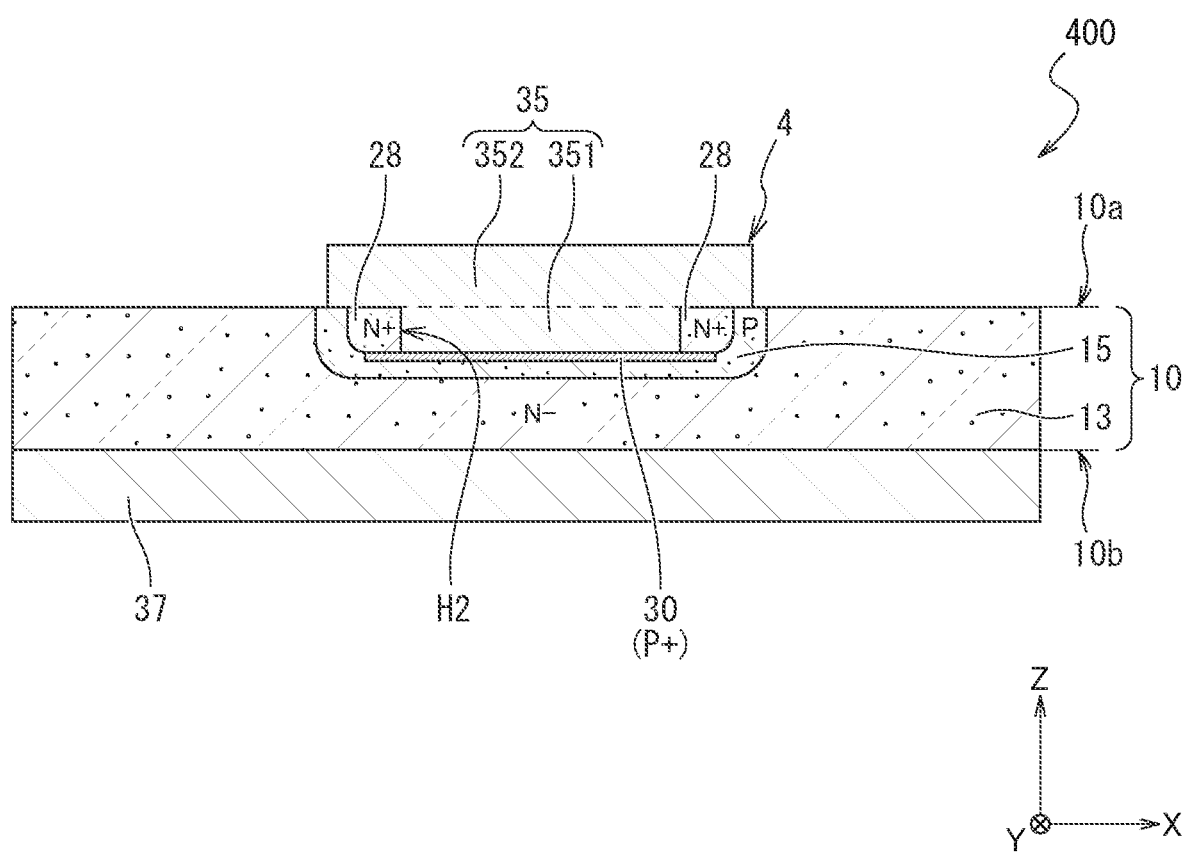
FIG. 39 is a cross-sectional view illustrative of a configuration example of a GaN semiconductor device according to a sixteenth embodiment of the present invention.

FIG. 39 is a cross-sectional view illustrative of a configuration example of a GaN semiconductor device 400 according to a sixteenth embodiment of the present invention. As illustrated in FIG. 39, the GaN semiconductor device 400 according to the sixteenth embodiment includes a GaN substrate 10 and one or more PN diodes 4 that are formed in the GaN substrate 10.

Each of the PN diodes 4 includes an N⁻-type region 13 that is formed in the GaN substrate 10, a P-type region 15 that is formed in the GaN substrate 10 and that is in contact with the N⁻-type region 13, a first P⁺-type region 30 that is formed in the GaN substrate 10 and that is in contact with the P-type region 15, N⁺-type regions 28 that are formed in the GaN substrate 10 and that are in contact with the P-type region 15 and the first P⁺-type region 30, an anode electrode 35 that is formed on the front surface 10a side of the GaN substrate 10 and that is in contact with the N⁺-type regions 28, and a cathode electrode 37 that is in contact with the N⁻-type region 13.

In each of the PN diodes 4, the anode electrode 35 penetrates an N⁺-type region 28 and is in contact with the first P⁺-type region 30. For example, on the front surface 10a side of the GaN substrate 10, a through-hole H2 that penetrates an N⁺-type region 28 is formed. The bottom surface of the through-hole H2 is the first P⁺-type region 30. The anode electrode 35 has a first portion 351 that is arranged in the through-hole H2 and that comes into contact with the first P⁺-type region 30 at the bottom surface of the through-hole H2 and a second portion 352 that is arranged on the front surface 10a of the GaN substrate 10 and that comes into contact with the N⁺-type regions 28. The first portion 351 and the second portion 352 are integrally formed.

In each of the PN diodes 4, as with the PN diode 2 according to the ninth embodiment (see FIG. 26), the first P⁺-type region 30 is formed with high Mg concentration by Fermi level control using a depletion layer generated immediately below an N⁺-type region 28. For example, in a step of forming the first P⁺-type regions 30, a depletion layer is formed in each region (first P⁺-type formation region) that is a portion of a P-type region 15 and that is located immediately below an N⁺-type region 28. Mg that is ion-implanted into the first P⁺-type formation regions in advance is activated in the depletion layers at the time of heat treatment. This processing causes the first P⁺-type regions 30 having a high Mg concentration of $1 \times 10^{19}$ cm⁻³ or more and $1 \times 10^{21}$ cm⁻³ or less and a thin thickness of 1 nm or more and 25 nm or less to be formed.

Each of the first P⁺-type regions 30 has high Mg concentration and thin thickness. This configuration, as with the ninth embodiment, enables each of the PN diodes 4 to achieve ohmic connections between the N⁺-type regions 28 and the P-type region 15 by a tunnel junction via the first P⁺-type region 30.

In addition, since the first portion 351 of the anode electrode 35 and the highly concentrated first P⁺-type region 30 are in contact with each other, it is possible to achieve an ohmic connection between the first portion 351 of the anode electrode 35 and the first P⁺-type region 30. It is possible to achieve an ohmic connection between the first portion 351 of the anode electrode 35 and the P-type region 15 via the first P⁺-type region 30.

According to the PN diode 4, since formation of an ohmic connection between the first portion 351 of the anode electrode 35 and the P-type region 15 is added to the configuration of the ninth embodiment, it is possible to further improve ohmic characteristics of connection between the anode electrode 35 and the P-type region 15.

Note that the GaN semiconductor device 400 according to the sixteenth embodiment may have the second portion 352 of each of the anode electrodes 35 extended from a region over the first portion 351 to regions over the N⁻-type region 13, as a variation of the GaN semiconductor device 400. In the variation, a Schottky diode may be formed by the anode electrode 35, the N⁻-type region 13, and the cathode electrode 37. The GaN semiconductor device 400 may, as with the GaN semiconductor device 200B according to the eleventh embodiment (see FIG. 28), include an MPS diode that is configured by a combination of a PN diode 4 and a Schottky diode.

Seventeenth Embodiment

Figure 40:
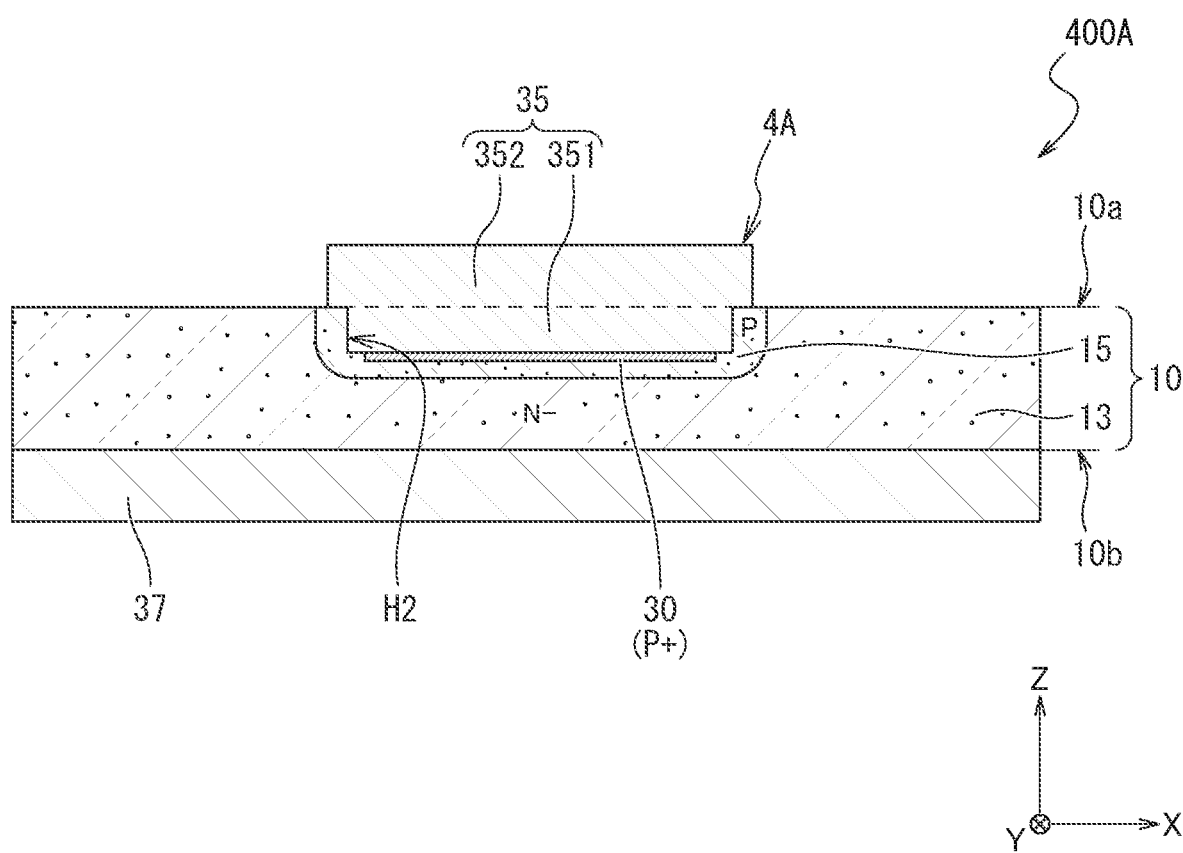
FIG. 40 is a cross-sectional view illustrative of a configuration example of a GaN semiconductor device according to a seventeenth embodiment of the present invention.

FIG. 40 is a cross-sectional view illustrative of a configuration example of a GaN semiconductor device 400A according to a seventeenth embodiment of the present invention. As illustrated in FIG. 40, the GaN semiconductor device 400A according to the seventeenth embodiment includes a GaN substrate 10 and one or more PN diodes 4A that are formed in the GaN substrate 10.

Each of the PN diodes 4A illustrated in FIG. 40 differs from the PN diode 4 illustrated in FIG. 39 in that a formation range of a through-hole H2 extends to the whole area of an N$^+$-type region 28. In steps of forming a PN diode 4A, an entire N$^+$-type region 28 is removed and the through-hole H2 is formed after formation of a first P$^+$-type region 30, and a first portion 351 of an anode electrode 35 is formed in the formed through-hole H2 and the first portion 351 is caused to come into contact with the first P$^+$-type region 30.

Since the first portion 351 of the anode electrode 35 and the highly concentrated first P$^+$-type region 30 are in contact with each other, even such a configuration enables an ohmic connection to be achieved between the first portion 351 of the anode electrode 35 and the first P$^+$-type region 30. It is possible to achieve an ohmic connection between the first portion 351 of the anode electrode 35 and a P-type region 15 via the first P$^+$-type region 30.

Note that the GaN semiconductor device 400A according to the seventeenth embodiment may have a second portion 352 of each of the anode electrodes 35 extended from a region over the first portion 351 to regions over an N$^-$-type region 13, as a variation of the GaN semiconductor device 400A. In the variation, a Schottky diode may be formed by the anode electrode 35, the N$^-$-type region 13, and a cathode electrode 37. The GaN semiconductor device 400A may, as with the GaN semiconductor device 200B according to the eleventh embodiment (see FIG. 28), include an MPS diode that is configured by a combination of a PN diode 4A and a Schottky diode.

Other Embodiments

As described above, the present invention was described through the embodiments and variations, but the statements and drawings constituting a portion of this disclosure should not be construed as a limitation of the present invention. Various alternative embodiments and variations will be made obvious to those skilled in the art by the disclosure.

For example, in the present invention, the vertical MOSFETs in the GaN semiconductor devices 100, 100A, 100C, and 100D described in the first, second, and fourth to seventh embodiments may have a trench gate type structure as described in the eighth embodiment instead of a planar type structure.

In addition, a first P$^+$-type region 30 may be included in, instead of a vertical MOSFET in which current flows in the vertical direction of the GaN substrate 10, a lateral MOSFET in which current flows in the horizontal direction of the GaN substrate 10. Likewise, a second P$^+$-type region 20 may be included in a lateral MOSFET.

In addition, the gate insulating film 21 is not limited to a SiO$_2$ film and may be another type of insulating film. As the gate insulating film 21, a silicon oxynitride (SiON) film, a strontium oxide (SrO) film, a silicon nitride (Si$_3$N$_4$) film, or an aluminum oxide (Al$_2$O$_3$) film can be used. In addition, as the gate insulating film 21, a composite film formed by stacking some single layer insulating films, or the like can be used. A vertical MOSFET in which an insulating film other than a SiO$_2$ film is used as the gate insulating film 21 may be referred to as a vertical MISFET. The MISFET means more inclusive insulated gate type transistors including MOSFETs.

In addition, in the above-described second to eighth and thirteenth to fifteenth embodiments, it was described that an electrode having an ohmic connection with a P-type well region 14 with a first P$^+$-type region 30 interposed therebetween was a source electrode 25. In the above-described ninth to twelfth, sixteenth, and seventeenth embodiments, it was described that an electrode having an ohmic connection with a P-type region 15 with a first P$^+$-type region 30 interposed therebetween was an anode electrode 35. However, the embodiments in the present invention is not limited to the above description. An electrode having an ohmic connection with the P-type well region 14 with the first P$^+$-type region 30 interposed therebetween may be an electrode other than the source electrode. An electrode having an ohmic connection with the P-type region 15 with the first P$^+$-type region 30 interposed therebetween may be an electrode other than the anode electrode. In addition, a first P-type region exemplified by the first P$^+$-type region 30 may be included in an element other than a MISFET and a PN diode, and may be included in, for example, a bipolar transistor, a capacitance element, or a resistance element.

As described above, it is needless to say that the present technology includes various embodiments and the like that are not described herein. At least one of various kinds of omission, replacement, and modification of the constituent elements can be performed without departing from the gist of the above-described embodiments and variation. Advantageous effects described herein are only exemplifications and are not specifically limited, and other advantageous effects may be achieved.

REFERENCE SIGNS LIST

1 Vertical MOSFET
2, 4, 4A PN diode
2A MPS diode
10 GaN substrate
10a Front surface
10b Back surface
12 Drift region
13 N$^-$-type region
14 Well region
14' Well formation region
15 P-type region
18 N$^+$-type source region
18' Source formation region
20 Second P$^+$-type region
20' Second P$^+$-type formation region
20X Second portion
20Y First portion
21 Gate insulating film
23 Gate electrode
25 Source electrode
27 Drain electrode
28 N$^+$-type region
30 First P$^+$-type region (hereinafter, P$^+$-type formation region)
30' First P$^+$-type formation region
35 Anode electrode
37 Cathode electrode
51, 52 Mask
53 Protective film
100, 100A, 100B, 100C, 100D, 100E, 100F, 100G, 200, 200A,
200B, 200C, 300, 300A, 300B, 400, 400A GaN semiconductor device 110 Active region
112 Gate pad
114 Source pad
121 Upper region
122 Lower region
130 Edge termination region
201 First region
202 Second region
251, 351 First portion
252, 352 Second portion
D Drain terminal
G Gate terminal
H Trench
H1, H2 Through-hole
S Source terminal

The invention claimed is:

1. A method for manufacturing a nitride semiconductor device comprising:
forming a P-type well region in a nitride semiconductor layer;
forming an N-type region within the P-type well region including implanting ions of a donor element into the P-type well region at a first concentration;
implanting ions of an acceptor element at a second concentration into a first P-type region within the P-type well region and located under the N-type region so that the first P-type region is sandwiched by the N-type region and the P-type well region on both sides in a vertical direction so as to be respectively in contact with the N-type region and the P-type well region, and an uppermost surface of the first P-type region is deeper than an uppermost surface of the N-type region, wherein the first concentration is greater than or equal to the second concentration, and the second concentration is $1 \times 10^{19}$ cm$^{-3}$ or more and $1 \times 10^{21}$ cm$^{-3}$ or less; and
forming the first P-type region by subjecting the nitride semiconductor layer in which the P-type well region and the N-type region are formed and into which ions of the acceptor element are implanted to heat treatment and activating the acceptor element.

2. The method for manufacturing the nitride semiconductor device according to claim 1, wherein a maximum temperature of the heat treatment is 1300° C. or more and 2000° C. or less.

3. The method for manufacturing the nitride semiconductor device according to claim 1 further comprising:
implanting ions of the acceptor element at the second concentration into a region sandwiched by the two N-type regions on both sides,
wherein, forming the first P-type region includes,
forming the first P-type region located under the two N-type regions and a second P-type region sandwiched by the two N-type regions on both sides by subjecting the nitride semiconductor layer in which the two N-type regions are formed and ions of the acceptor element are implanted into regions located under the two N-type regions and a region sandwiched by the two N-type regions on both sides to heat treatment and activating the acceptor element, and
forming the N-type region includes,
implanting ions of the donor element into the nitride semiconductor layer at the first concentration.

4. The method for manufacturing the nitride semiconductor device according to claim 3, wherein
the method simultaneously performs, using a mask arranged on one surface side of the nitride semiconductor layer, implanting ions of the acceptor element into regions located under the two N-type regions, and implanting ions of the acceptor element into a region sandwiched by the two N-type regions on both sides.

5. The method for manufacturing the nitride semiconductor device according to claim 1 further comprising:
forming a through-hole exposing the first P-type region at a bottom surface of the through-hole by removing at least a portion of the N-type region from one surface side of the nitride semiconductor layer; and
forming an electrode in the through-hole and causing the electrode to come into contact with the first P-type region.

6. The method for manufacturing the nitride semiconductor device according to claim 5, wherein
forming the through-hole includes,
removing a portion of the N-type region to form the through-hole and simultaneously leave another portion of the N-type region unremoved in the nitride semiconductor layer, and
forming the electrode includes:
forming a first portion of the electrode in the through-hole and causing the first portion to come into contact with the first P-type region; and
forming a second portion of the electrode on the one surface side of the nitride semiconductor layer and causing the second portion to come into contact with the another portion of the N-type region.

7. The method for manufacturing the nitride semiconductor device according to claim 6, wherein
forming the electrode includes,
integrally forming the first portion and the second portion.

8. A nitride semiconductor device comprising:
a nitride semiconductor layer;
an N-type region formed on one surface side of the nitride semiconductor layer;
a P-type well region formed in the nitride semiconductor layer; and
a first P-type region formed within the P-type well region and located under the N-type region so that the first P-type region is sandwiched by the N-type region and the P-type well region on both sides in a vertical direction so as to be respectively in contact with the N-type region and the P-type well region, and an uppermost surface of the first P-type region is deeper than an uppermost surface of the N-type region,
wherein concentration of a donor element in the N-type region has a value equal to or greater than concentration of an acceptor element in the first P-type region, and
concentration of the acceptor element in the first P-type region is $1 \times 10^{19}$ cm$^{-3}$ or more and $1 \times 10^{21}$ cm$^{-3}$ or less.

9. The nitride semiconductor device according to claim 8, wherein thickness of the first P-type region is 1 nm or more and 25 nm or less.

10. The nitride semiconductor device according to claim 8 further comprising:
a second P-type region formed on the one surface side of the nitride semiconductor layer and sandwiched by two N-type regions on both sides,
wherein concentration of the acceptor element in at least a portion of the second P-type region is $1 \times 10^{19}$ cm$^{-3}$ or more and $1 \times 10^{21}$ cm$^{-3}$ or less.

11. The nitride semiconductor device according to claim 10, wherein an interval between portions within the two N-type regions, the portions sandwiching the second P-type region on both sides, is 50 nm or more and 500 nm or less.

12. The nitride semiconductor device according to claim 10, wherein depths of the two N-type regions from the one surface side of the nitride semiconductor layer and a depth of the second P-type region from the one surface side of the nitride semiconductor layer are equal.

13. The nitride semiconductor device according to claim 10, wherein the second P-type region includes:

a first region; and second regions each of which is located between the first region and one of the two N-type regions and is respectively in contact with the first region and the N-type region, concentration of the acceptor element in the second regions is higher than in the first region, and concentration of the acceptor element in the second regions is $1 \times 10^{19}$ cm$^{-3}$ or more and $1 \times 10^{21}$ cm$^{-3}$ or less.

14. The nitride semiconductor device according to claim 13, wherein density of acceptor segregation in the second regions is lower than density of the acceptor segregation in the first region.

15. The nitride semiconductor device according to claim 14, wherein when the acceptor segregation is classified into:

rod-like acceptor segregation having a length in one direction of 30 nm or more and a concentration of the acceptor element of $5 \times 10^{20}$ cm$^{-3}$ or more; and non-rod-like acceptor segregation having a length in one direction of less than 30 nm and a concentration of the acceptor element of $5 \times 10^{20}$ cm$^{-3}$ or more, in the second regions, density of the rod-like acceptor segregation is equal to or less than $1 \times 10^{14}$ cm$^{-3}$, and density of the non-rod-like acceptor segregation is less than $1 \times 10^{15}$ cm$^{-3}$.

16. The nitride semiconductor device according to claim 13, wherein length of each of the second regions in a direction in which the two N-type regions sandwich the second P-type region on both sides is 1 nm or more and 25 nm or less.

17. The nitride semiconductor device according to claim 8 further comprising an electrode formed on the N-type region.

18. The nitride semiconductor device according to claim 8 further comprising an electrode penetrating the N-type region and coming into contact with the first P-type region.

19. The nitride semiconductor device according to claim 18, wherein the electrode has:

a first portion arranged in a through-hole penetrating the N-type region and coming into contact with the first P-type region at a bottom surface of the through-hole; and a second portion arranged on the one surface side of the nitride semiconductor layer and coming into contact with the N-type region.

20. The nitride semiconductor device according to claim 19, wherein the first portion and the second portion are integrally formed.

21. The nitride semiconductor device according to claim 8, wherein the nitride semiconductor layer is gallium nitride.

22. The nitride semiconductor device according to claim 8, wherein the acceptor element include at least either magnesium or beryllium.

23. The nitride semiconductor device according to claim 8 comprising:

a field effect transistor formed in the nitride semiconductor layer and having a channel formed in the P-type well region, wherein the first P-type region has a higher concentration of the acceptor element than the P-type well region and is in contact with the P-type well region.

24. The nitride semiconductor device according to claim 8 comprising:

a diode formed in the nitride semiconductor layer, wherein the first P-type region is included in the diode.

25. The nitride semiconductor device according to claim 8, wherein the first P-type region is a P+-type region and causes a connection between an N+-type source region and the P-type well region to be an ohmic connection.

* * * * *

UNITED STATES PATENT AND TRADEMARK OFFICE
CERTIFICATE OF CORRECTION

PATENT NO. : 12,237,379 B2
APPLICATION NO. : 17/584043
DATED : February 25, 2025
INVENTOR(S) : Ryo Tanaka et al.

Page 1 of 1

It is certified that error appears in the above-identified patent and that said Letters Patent is hereby corrected as shown below:

In the Claims

Column 43, Line 49:
In Claim 3, delete "by the" and insert -- by --.

Column 44, Line 27-28:
In Claim 6, delete "with the" and insert -- with --.

Signed and Sealed this
Third Day of June, 2025

Coke Morgan Stewart
*Acting Director of the United States Patent and Trademark Office*